(12) United States Patent
Ohsawa et al.

(10) Patent No.: US 8,455,111 B2
(45) Date of Patent: *Jun. 4, 2013

(54) LIGHT-EMITTING ELEMENT, LIGHT-EMITTING DEVICE, AND ELECTRONIC DEVICE

(75) Inventors: Nobuharu Ohsawa, Zama (JP); Hideko Inoue, Atsugi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1163 days.

This patent is subject to a terminal disclaimer.

(21) Appl. No.: 12/323,492

(22) Filed: Nov. 26, 2008

(65) Prior Publication Data
US 2009/0140643 A1 Jun. 4, 2009

(30) Foreign Application Priority Data

Nov. 30, 2007 (JP) .................................. 2007-310376

(51) Int. Cl.
*H01L 51/54* (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| 6,803,720 | B2 | 10/2004 | Kwong et al. |
| 7,238,806 | B2 | 7/2007 | Inoue et al. |
| 7,601,439 | B2 | 10/2009 | Chun et al. |
| 8,048,540 | B2 * | 11/2011 | Inoue et al. ................ 428/690 |
| 2002/0074935 | A1 | 6/2002 | Kwong et al. |
| 2003/0059646 | A1 | 3/2003 | Kamatani et al. |
| 2003/0068526 | A1 | 4/2003 | Kamatani et al. |
| 2006/0063030 | A1 * | 3/2006 | Deaton et al. ................ 428/690 |
| 2006/0063031 | A1 * | 3/2006 | Brown et al. ................ 428/690 |
| 2006/0115679 | A1 | 6/2006 | Chun et al. |
| 2006/0134461 | A1 * | 6/2006 | Huo et al. ................ 428/690 |

(Continued)

FOREIGN PATENT DOCUMENTS

| CN | 1825658 | 8/2006 |
| CN | 100383151 | 4/2008 |

(Continued)

OTHER PUBLICATIONS

Machine translation for JP 2005-298483, which was published Oct. 2005.*

(Continued)

*Primary Examiner* — Dawn L. Garrett
(74) *Attorney, Agent, or Firm* — Eric J. Robinson; Robinson Intellectual Property Law Office, P.C.

(57) ABSTRACT

A light-emitting element having high emission efficiency and long lifetime is provided. By manufacturing a light-emitting device using the light-emitting element, the light-emitting device having low power consumption and long lifetime is provided. The light-emitting element is manufactured in which a light-emitting layer is included between a first electrode serving as an anode and a second electrode serving as a cathode. The light-emitting layer includes a first organic compound having a hole-transporting property, a second organic compound having an electron-transporting property, and an organometallic complex including a dibenzo[f,h]quinoxaline skeleton as a ligand. Further, a light-emitting device is manufactured using the light-emitting element.

34 Claims, 14 Drawing Sheets

U.S. PATENT DOCUMENTS

| | | | |
|---|---|---|---|
| 2006/0159955 | A1 | 7/2006 | Inoue et al. |
| 2007/0034854 | A1 | 2/2007 | Inoue et al. |
| 2007/0191587 | A1 | 8/2007 | Kanitz et al. |
| 2007/0216288 | A1 | 9/2007 | Lin et al. |
| 2007/0241667 | A1 | 10/2007 | Ohsawa et al. |
| 2007/0244320 | A1 | 10/2007 | Inoue et al. |
| 2008/0030125 | A1 | 2/2008 | Boerner et al. |
| 2008/0160345 | A1 | 7/2008 | Inoue et al. |
| 2009/0230844 | A1 | 9/2009 | Pfeiffer et al. |
| 2009/0322217 | A1* | 12/2009 | Inoue et al. .................. 313/504 |

FOREIGN PATENT DOCUMENTS

| | | | |
|---|---|---|---|
| DE | 102006006427 | | 8/2007 |
| DE | 102006010915 | | 9/2007 |
| EP | 1 661 899 | | 5/2006 |
| EP | 1705727 | A | 9/2006 |
| EP | 1873163 | A | 1/2008 |
| EP | 1 939 208 | | 7/2008 |
| JP | 2005-255986 | | 9/2005 |
| JP | 2005-298483 | | 10/2005 |
| JP | 2006-151887 | | 6/2006 |
| JP | 2007-091718 | A | 4/2007 |
| JP | 2007-522271 | | 8/2007 |
| JP | 2007-284432 | A | 11/2007 |
| JP | 2008-010651 | * | 1/2008 |
| WO | WO 02/47457 | | 6/2002 |
| WO | WO-2005/049762 | | 6/2005 |
| WO | WO-2006/059802 | | 6/2006 |
| WO | WO-2006/062144 | | 6/2006 |
| WO | WO 2006/097064 | | 9/2006 |
| WO | WO 2009100991 | * | 8/2009 |
| WO | WO-2009/157498 | | 12/2009 |

OTHER PUBLICATIONS

Duan.J et al., "New Iridium Complexes as Highly Efficient Orange-Red Emitters in Organic Light-Emitting Diodes,", Adv. Mater. (Advanced Materials), Feb. 5, 2003, vol. 15, No. 3, pp. 224-228.

Schwartz.G et al., "High efficiency white organic light emitting diodes combining fluorescent and phosphorescent emitters systems,", Proceedings of SPIE, 2006, vol. 6192, pp. 1-6.

Liu.Z et al., "Red phosphorescent Iridium Complex Containing Carbazole-Functionalized β-Diketonate for Highly Effecient Nondoped Organic Light-Emitting Diodes,", Adv. Mater. (Advanced Materials), 2006, vol. 16, pp. 1441-1448.

Schwartz.G et al., "Highly efficient white organic light emitting diodes comprising an interlayer to separate fluorescent and phosphorescent regions,", Appl. Phys. Lett. (Applied Physics Letters), 2006, vol. 89, No. 8, pp. 083509-1-083509-3.

Guan.M et al., "The host materials containing carbazole and oxadiazole fragment for red triplet emitter in organic light-emitting diodes,", Organic Electronics, 2006, vol. 7, No. 5, pp. 330-336.

Fehse.K et al., "Combination of a polyaniline anode and doped charge transport layers for high-efficiency organic light-emitting diodes,", J. Appl. Phys. (Journal of Applied Physics), 2007, vol. 101, No. 12, pp. 124509-1-124509-4.

European Search Report (Application No.08855349.0) Dated Jun. 29, 2011.

Chinese Office Action (Application No. 200880118858.0) Dated Apr. 21, 2011.

International Search Report (Application No. PCT/JP2008/071183) Dated Feb. 3, 2009.

Written Opinion (Application No. PCT/JP2008/071183) Dated Feb. 3, 2009.

Tsutsui.T et al., "High Quantum Efficiency in Organic Light-Emitting Devices With Iridium-Complex as a Triplet Emissive Center,", Jpn. J. Appl. Phys. (Japanese Journal of Applied Physics), Dec. 15, 1999, vol. 38, Part 2, No. 12B, pp. L1502-L1504.

Steel.P et al., "Cyclometallated compounds V. Double cyclopalladation of diphenyl pyrazines and related ligands,", Journal of Organometallic Chemistry, 1990, vol. 395, No. 3, pp. 359-373.

Adachi.C et al., "High-Efficiency Red Electrophosphorescence Devices,", Appl. Phys. Lett. (Applied Physics Letters), Mar. 12, 2001, vol. 78, No. 11, pp. 1622-1624.

Goldsmith.C et al., "C-H Bond Activation by a Ferric Methoxide Complex: Modeling the Rate-Determining Step in the Mechanism of Lipoxygenase,", J. Am. Chem. Soc. (Journal of the American Chemical Society), 2002, vol. 124, No. 1, pp. 83-96.

Onishi.T et al., "A Method of Measuring an Energy Level,", High Molecular El Materials—Development of Light-Emitting High Molecular Compounds, Dec. 25, 2004, pp. 64-67, Kyoritsu Shuppan.

Tao.X et al., "Metal Complex Polymer for Second Harmonic Generation and Electroluminescence Applications,", Appl. Phys. Lett. (Applied Physics Letters), Mar. 24, 1997, vol. 70, No. 12, pp. 1503-1505.

Office Action (U.S. Appl. No. 12/003,438) Dated Feb. 3, 2011.

Notice of Allowance (U.S. Appl. No. 12/003,438) Dated Jul. 8, 2011.

* cited by examiner

LIGHT-EMITTING ELEMENT, LIGHT-EMITTING DEVICE, AND ELECTRONIC DEVICE

TECHNICAL FIELD

The present invention relates to a light-emitting element using a phosphorescent compound. Further, the present invention relates to a light-emitting device using the light-emitting element. Furthermore, the present invention relates to an electronic device using the light-emitting device.

BACKGROUND ART

In recent years, a light-emitting element using a luminous organic compound or a luminous inorganic compound as a light-emitting substance has been actively developed. In particular, a light-emitting element called an EL element has a simple structure in which a light-emitting layer containing a light-emitting substance is provided between electrodes, and has attracted attention as a next-generation flat panel display element because of its characteristics such as a thin shape, lightweight, high response speed, and direct current driving at low voltage. Further, a display using such a light-emitting element has a feature that it is excellent in contrast and image quality, and has a wide viewing angle. Furthermore, such a light-emitting element is a plane light source, and therefore expected to be applied to a light source such as a backlight of a liquid crystal display device or a lighting apparatus.

In the case of using a luminous organic compound as a light-emitting substance, the emission mechanism of a light-emitting element is a carrier injection type. In other words, a light-emitting layer is interposed between electrodes, and a voltage is applied, whereby carriers (holes and electrons) injected from the electrodes are recombined to place the light-emitting substance in an excited state. Upon return from the excited state to the ground state, light is emitted. Further, as the types of excited states, there can be a singlet excited state (S*) and a triplet excited state (T*). Furthermore, it is considered that the ratio of S* to T* in a light-emitting element is statistically 1:3.

In general, the ground state of a luminous organic compound is a singlet excited state. Thus, luminescence from a singlet excited state (S*) is referred to as fluorescence because of electron transition in the same multiplet. On the other hand, luminescence from a triplet excited state (T*) is referred to as phosphorescence because of electron transition between different multiplets. Here, in general, not phosphorescence but only fluorescence is observed from a compound emitting fluorescence (hereinafter referred to as a fluorescent compound) at room temperature. Accordingly, the internal quantum efficiency (the ratio of generated photons to injected carriers) in a light-emitting element using a fluorescent compound is assumed to have a theoretical limit of 25% on the basis that S*:T*=1:3.

On the other hand, when a compound emitting phosphorescence (hereinafter referred to as a phosphorescent compound) is used, an internal quantum efficiency of 75% to 100% can be theoretically achieved. That is, emission efficiency can be three to four times as high as that of a fluorescent compound. From these reasons, in order to achieve a light-emitting element with high efficiency, a light-emitting element using a phosphorescent compound has been proposed (see Non-Patent Document 1 and Non-Patent Document 2, for example). Note that Non-Patent Document 1 employs an iridium complex, in which a ligand is 2-phenylpyridine ($Ir(ppy)_3$), as a phosphorescent compound and that Non-Patent Document 2 employs an iridium complex, in which a ligand is 2-(2'-benzo[4,5-a]thienyl)pyridine ([$btp_2Ir(acac)$]), as a phosphorescent compound.

Further, a light-emitting element is disclosed using a light-emitting layer in which, in order to improve the lifetime and efficiency of the light-emitting element using a phosphorescent compound, an organic low molecular hole-transporting substance and an organic low molecular electron-transporting substance are contained as a host material for a phosphorescent dopant (see Patent Document 1).

Non-Patent Document 1: Testuo TSUTSUI et al., JAPANESE JOURNAL OF APPLIED PHYSICS, vol. 38, 1999, pp. L1502-L1504

Non-Patent Document 2: Chihaya ADACHI et al., APPLIED PHYSICS LETTERS, vol. 78, 2001, No. 11, pp. 1622-1624

Patent Document 1: Japanese Translation of PCT International Application No. 2004-515895

DISCLOSURE OF INVENTION

According to the above Non-Patent Document 1, a hole-blocking layer is formed of BCP, the stability of which is not sufficient, and accordingly the lifetime of the element is problematic.

However, if BCP is removed from the element structure in Non-Patent Document 1, light emission with high efficiency cannot be obtained. This is because CBP used for a host material of a light-emitting layer in Non-Patent Document 1 has a strong hole-transporting property, whereby holes may reach an electron-transporting layer if BCP is not used for the hole-blocking layer. In addition, BCP has a function of blocking excitation energy (in this case, triplet excitation energy) generated in the light-emitting layer. Thus, with the element structure of Non-Patent Document 1, although high efficiency can be achieved due to BCP, a light-emitting element having long lifetime cannot be obtained because of BCP.

On the other hand, Patent Document 1 discloses an improvement of element lifetime and efficiency; however, the capability of a phosphorescence compound cannot be extracted in terms of efficiency. Actually, although a light-emitting element is manufactured using an iridium complex, [$btp_2Ir(acac)$], which is also used in Non-Patent Document 2, in Patent Document 1, the efficiency of the light-emitting element is about 0.9 cd/A to 2.0 cd/A, which is greatly lower than the efficiency reported in Non-Patent Document 2.

For the above reasons, it has been extremely difficult to obtain higher efficiency and long lifetime of a phosphorescent compound at the same time. Therefore, practically, the lifetime of a light-emitting element using a phosphorescent compound has been secured at some expense of efficiency.

In view of the above, the present invention provides a light-emitting element having high efficiency and long lifetime. Further, by manufacturing a light-emitting device using the light-emitting element, the present invention provides a light-emitting device having low power consumption and longer lifetime. Furthermore, by applying such a light-emitting device to an electronic device, the present invention provides an electronic device having low power consumption and longer lifetime.

As a result of intense study, the present inventors have found that the above problem can be solved by devising a structure of a light-emitting layer including a light-emitting substance in a light-emitting element using, as a light-emitting substance, a certain kind of organometallic complex having a strong electron-trapping property. Specifically, the present inventors have found that the above problem can be solved with both a compound having a hole-transporting property and a compound having an electron-transporting property included in a light-emitting layer of a light-emitting element using, as a light-emitting substance, an organometallic complex in which a ligand is a dibenzo[f,h]quinoxaline derivative.

In other words, an aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; a ligand of the organometallic complex is a ligand having a dibenzo[f,h]quinoxaline skeleton; and a central metal of the organometallic complex is a Group 9 or Group 10 element.

Further, as the dibenzo[f,h]quinoxaline derivative, in particular, a 2-aryldibenzo[f,h]quinoxaline derivative is preferable.

Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; a ligand of the organometallic complex is a 2-aryldibenzo[f,h]quinoxaline derivative; and a central metal of the organometallic complex is a Group 9 or Group 10 element. Note that as the 2-aryldibenzo[f,h]quinoxaline derivative, a 2-phenyldibenzo[f,h]quinoxaline derivative is preferable.

Note that in the above structure, the central metal is preferably iridium or platinum in terms of emission efficiency. In particular, iridium is preferable since iridium can provide extremely high efficiency.

Here, the organometallic complex using a ligand having a dibenzo[f,h]quinoxaline skeleton is specifically an organometallic complex having a structure represented by a general formula (G1) below. In other words, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G1) below.

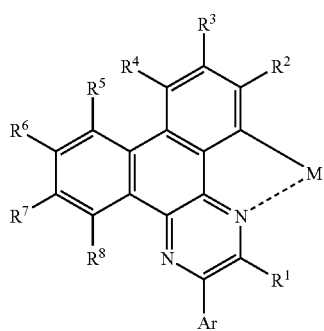

(G1)

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, a halogen group, or an acyloxy group having 1 to 4 carbon atoms, any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring; and M is a central metal and represents a Group 9 or Group 10 element.

As the organometallic complex having the structure represented by the general formula (G1), an organometallic complex having a structure represented by a general formula (G2) below is preferable. Accordingly, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G2) below.

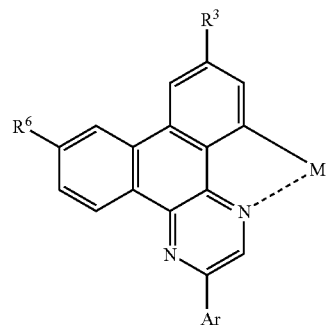

(G2)

In the formula, Ar represents an aryl group having 6 to 25 carbon atoms, $R^3$ and $R^6$ individually represent any of hydrogen, an alkyl group having 1 to 4 carbon atoms, an alkoxy group having 1 to 4 carbon atoms, a halogen group, or an acyloxy group having 1 to 4 carbon atoms, and M is a central metal and represents a Group 9 or Group 10 element.

Further, as the organometallic complex having the structure represented by the general formula (G1), an organometallic complex having a structure represented by a general formula (G3) below is preferable in particular. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G3) below.

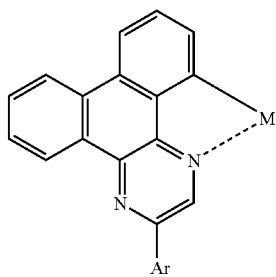

(G3)

In the formula, Ar represents an aryl group having 6 to 25 carbon atoms, and M is a central metal and represents a Group 9 or Group 10 element.

Here, as the organometallic complex having the structure represented by the above general formula (G1), an organometallic complex having a structure represented by a general formula (G4) below is preferable in particular. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G4) below.

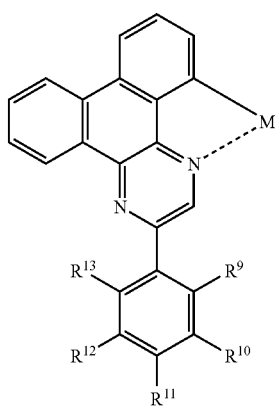

(G4)

In the formula, $R^9$ to $R^{13}$ individually represent any of hydrogen, an alkyl group having 1 to 4 carbon atoms, an alkoxy group having 1 to 4 carbon atoms, an aryl group having 6 to 12 carbon atoms, or a halogen group, and M is a central metal and represents a Group 9 or Group 10 element.

Further, more specifically, the organometallic complex having the structure represented by the above general formula (G1) is an organometallic complex represented by a general formula (G5) below. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex is represented by the general formula (G5) below.

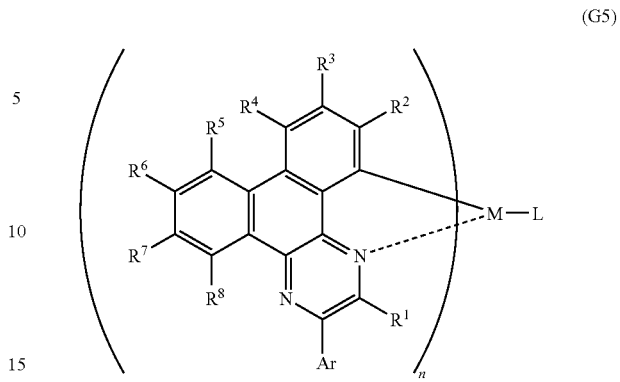

(G5)

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring; M is a central metal and represents a Group 9 or Group 10 element, L represents a monoanionic ligand, n is 2 when the central metal is a Group 9 element, and n is 1 when the central metal is a Group 10 element.

Further, more specifically, the organometallic complex having the structure represented by the above general formula (G2) is an organometallic complex represented by a general formula (G6) below. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex is represented by the general formula (G6) below.

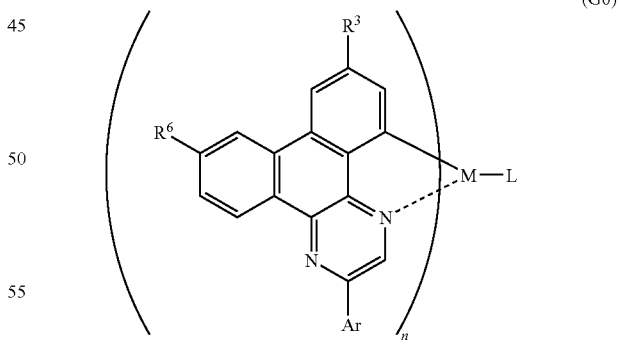

(G6)

In the formula, Ar represents an aryl group having 6 to 25 carbon atoms, $R^3$ and $R^6$ individually represent any of hydrogen, an alkyl group having 1 to 4 carbon atoms, an alkoxy group having 1 to 4 carbon atoms, an acyloxy group having 1 to 4 carbon atoms, or a halogen group, M is a central metal and represents a Group 9 or Group 10 element, L represents a monoanionic ligand, n is 2 when the central metal is a Group 9 element, and n is 1 when the central metal is a Group 10 element.

Further, more specifically, the organometallic complex having the structure represented by the above general formula (G3) is an organometallic complex represented by a general formula (G7) below. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G7) below.

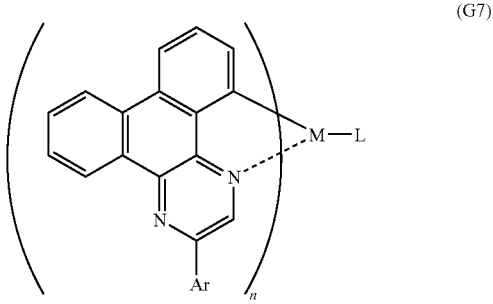

(G7)

In the formula, Ar represents an aryl group having 6 to 25 carbon atoms, M is a central metal and represents a Group 9 or Group 10 element, L represents a monoanionic ligand, n is 2 when the central metal is a Group 9 element, and n is 1 when the central metal is a Group 10 element.

Further, more specifically, the organometallic complex having the structure represented by the above general formula (G4) is an organometallic complex represented by a general formula (G8) below. Thus, one aspect of the present invention is the following light-emitting element including a light-emitting layer between a first electrode and a second electrode: the light-emitting layer includes a first organic compound having a hole-transporting property, a second organic compound having an electron-transporting property, and an organometallic complex; and the organometallic complex has a structure represented by the general formula (G8) below.

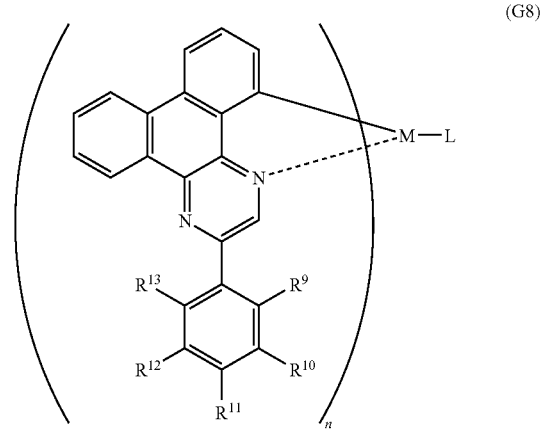

(G8)

In the formula, $R^9$ to $R^{13}$ individually represent any of hydrogen, an alkyl group having 1 to 4 carbon atoms, an alkoxy group having 1 to 4 carbon atoms, an aryl group having 6 to 12 carbon atoms, or a halogen group, M is a central metal and represents a Group 9 or Group 10 element, L represents a monoanionic ligand, n is 2 when the central metal is a Group 9 element, and n is 1 when the central metal is a Group 10 element.

Further, in the above general formulae (G1) to (G8), M is preferably iridium or platinum in terms of emission efficiency. In particular, iridium is preferable since iridium can provide light emission with extremely high efficiency.

Note that in any of the above light-emitting elements, the first organic compound is preferably an aromatic amine compound or a carbazole derivative. Moreover, the second organic compound is preferably a heteroaromatic compound or a metal complex. Further preferably, the first organic compound is an aromatic amine compound or a carbazole derivative and the second organic compound is a heteroaromatic compound or a metal complex.

Here, in any of the above light-emitting elements, the amount of the first organic compound and/or the amount of the second organic compound is/are preferably larger than that of the organometallic complex. That is, the first organic compound and/or the second organic compound preferably function as a host of the organometallic complex. More preferably, the amount of the organometallic complex in the light-emitting layer is greater than or equal to 1 weight % and less than or equal to 10 weight %.

Furthermore, in the light-emitting element of the present invention, the ratio between the first organic compound and the second organic compound is also important. Therefore, in any of the above light-emitting elements, the weight ratio of the second organic compound to the first organic compound is preferably greater than or equal to 1/20 and less than or equal to 20. In particular, the weight ratio of the second organic compound to the first organic compound is preferably greater than or equal to 1 and less than or equal to 20.

Note that the above structures of the present invention are made in view of the strong electron-trapping property of the organometallic complexes. Thus, in the light-emitting element of the present invention, the LUMO level of the organometallic complex is deeper than the LUMO level of the first organic compound and the LUMO level of the second organic compound by 0.2 eV or more.

Further, since the thus obtained light-emitting element of the present invention has high emission efficiency and the lifetime thereof can be improved, a light-emitting device (e.g., an image display device or a light-emitting device) using this light-emitting element can achieve low power consumption and long lifetime. Thus, the present invention includes a light-emitting device using the light-emitting element of the present invention, and an electronic device having the light-emitting device.

The light-emitting device of the present invention includes a light-emitting element which includes a layer containing a light-emitting substance between a pair of electrodes and the above-described organometallic complex in the layer containing the light-emitting substance, and a control unit for controlling light emission from the light-emitting element. Note that the category of the light-emitting device in this specification includes an image display device or a light-emitting device using a light-emitting element and also includes a lighting device. Further, the category of the light-emitting device of the present invention includes a module including a substrate provided with a light-emitting element, to which a connector such as a tape automated bonding (TAB) tape such as an anisotropic conductive film or a tape carrier package (TCP) is attached; a module in which an end of a connector is provided with a printed wiring board; and a module in which an integrated circuit (IC) is directly mounted on a substrate provided with a light-emitting element by a chip on glass (COG) method.

By implementation of the present invention, a light-emitting element with high emission efficiency can be provided. In particular, a light-emitting element with high emission efficiency and longer lifetime can be provided.

Further, by manufacture of a light-emitting device using the light-emitting element described above, a light-emitting device with low power consumption and long lifetime can be provided. Furthermore, by application of such a light-emitting device to an electronic device, an electronic device with low power consumption and long lifetime can be provided.

BEST MODE FOR CARRYING OUT THE INVENTION

Figure 1:
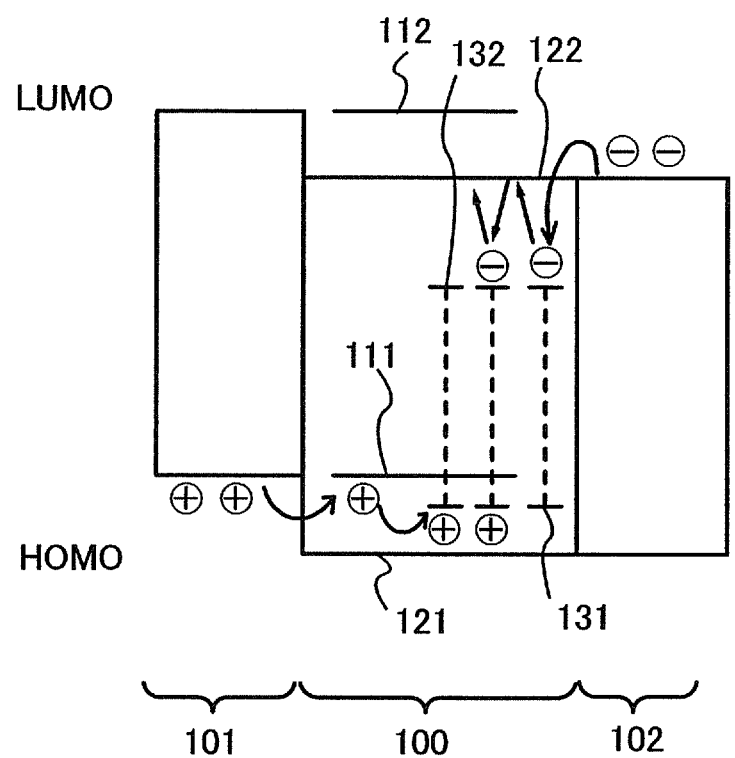
FIG. 1 is a band diagram of a light-emitting element according to an aspect of the present invention.

Hereinafter, embodiment modes of the present invention are described in detail using the accompanying drawings. Note that it is easily understood by those skilled in the art that the present invention is not limited to the description below and that a variety of changes can be made in forms and details without departing from the spirit and the scope of the present invention. Therefore, the present invention is not construed as being limited to the description of the embodiment modes given below.

(Embodiment Mode 1)

First, in Embodiment Mode 1, a concept of a light-emitting element of the present invention is described. Note that in this specification, "having a deep HOMO level or LUMO level" means having low energy level and "having a shallow HOMO level or LUMO level" means having high energy level. For example, it can be said that the LUMO level of a substance A, which is −2.54 eV, is deeper than the LUMO level of a substance B, which is −2.28 eV, by 0.26 eV and shallower than the LUMO level of a substance C, which is −2.85 eV, by 0.31 eV.

Recently, the present inventors have focused on phosphorescent compounds for the sake of high performance of light-emitting elements and examined a wide variety of phosphorescent organometallic complexes. As one result thereof, the present inventors have found that an organometallic complex in which a ligand has a dibenzo[f,h]quinoxaline skeleton and a central metal is a Group 9 or Group 10 element (hereinafter, referred to as a "dibenzo[f,h]quinoxaline-based organometallic complex") emits phosphorescence with much higher efficiency as compared to known phosphorescent organometallic complexes.

Here, from the property evaluation performed by the present inventors, it has found that the dibenzo[f,h]quinoxaline-based organometallic complex has a relatively deep LUMO level (i.e., it has some degree of electron-trapping property), compared with a general host material (a material used for a light-emitting layer, in which a light-emitting substance is dispersed). It has also found that, on the other hand, a conventional organometallic complex in which a ligand is a pyridine derivative (hereinafter, referred to as a "pyridine-based organometallic complex"), such as Ir(ppy)$_3$ or [btp$_2$Ir (acac)], has a shallow HOMO level and accordingly has a high hole-trapping property and that electrons have difficulty in entering the conventional organometallic complex. In other words, it is discovered that the dibenzo[f,h]quinoxaline-based organometallic complex and the pyridine-based organometallic complex have opposite properties in terms of affinity for holes and electrons. Note that this is described later in Example 1.

Then, the present inventors have found out that the electron-trapping property characterizing this dibenzo[f,h]quinoxaline-based organometallic complex causes disadvantages as well as advantages in manufacturing light-emitting elements, from a large number of experiment results.

One of the advantages is that, as compared with conventional pyridine-based organometallic complexes, dibenzo[f, h]quinoxaline-based organometallic complexes easily accept electrons and also relatively easily accept holes. In other words, when a dibenzo[f,h]quinoxaline-based organometallic complex is dispersed in a host material of a light-emitting layer, carriers are easily recombined directly in the dibenzo [f,h]quinoxaline-based organometallic complex. Therefore, it is not so necessary to pay attention to the efficiency of energy transfer from the host material, and thus light emission with high efficiency can be achieved.

However, in terms of the carrier balance in the light-emitting layer, it is extremely difficult to select a host material suitable for the dibenzo[f,h]quinoxaline-based organometallic complex, which is a disadvantage. This problem is described using FIGS. 2A and 2B.

Figure 2A:
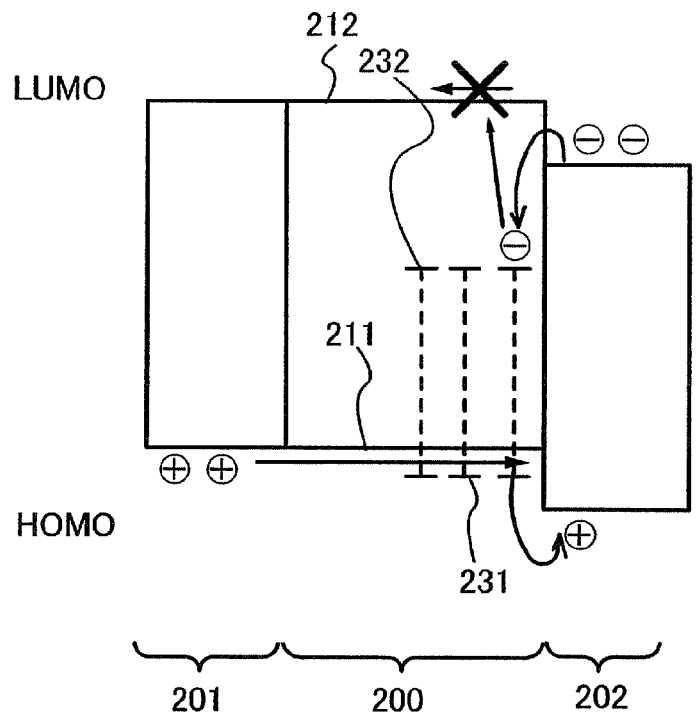
FIGS. 2A and 2B are band diagrams of conventional light-emitting elements.
Figure 2B:
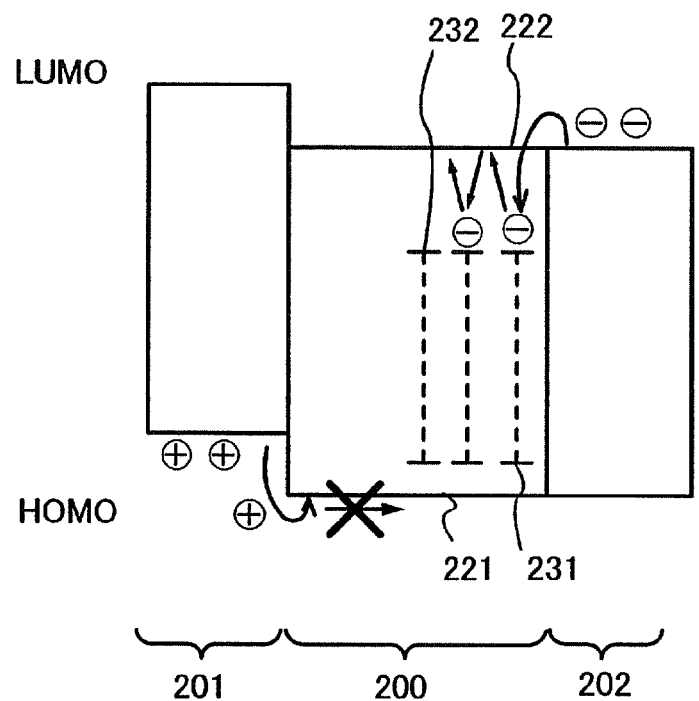

FIGS. 2A and 2B are each a band diagram in the case where a light-emitting layer 200 in which a dibenzo[f,h]quinoxaline-based organometallic complex is dispersed in a host material is sandwiched by a hole-transporting layer 201 and an electron-transporting layer 202. FIG. 2A is a band diagram in the case where a first organic compound having a hole-transporting property is used as the host material. FIG. 2B is a band diagram in the case where a second organic compound having an electron-transporting property is used as the host material.

First, in FIG. 2A, since a LUMO level 232 of the dibenzo[f,h]quinoxaline-based organometallic complex is relatively deep, electrons are trapped by the LUMO level 232. In addition, even if electrons are injected into a LUMO level 212 of the first organic compound, the electrons move very slowly because the first organic compound has a hole-transporting property. On the other hand, since the first organic compound has a hole-transporting property and a HOMO level 231 of the dibenzo[f,h]quinoxaline-based organometallic complex does not hinder holes (i.e., it does not form a deep trap), holes are easily transported through a HOMO level 211 of the first organic compound to the vicinity of an interface of the electron-transporting layer 202. In other words, a light-emitting region is limited to an extremely narrow area which is the interface between the light-emitting layer 200 and the electron-transporting layer 202.

Here, if the electron-transporting layer 202 has a low hole blocking property, holes may reach the electron-transporting layer 202 depending on combination of materials, as illustrated in FIG. 2A. Then, the electron-transporting layer 202 may emit light, thereby drastically reducing the emission efficiency of the light-emitting element. Needless to say, the present inventors have confirmed that the problem is solved when a substance having a high hole-blocking property is used for the electron-transporting layer 202, high emission efficiency can be achieved; however, the lifetime of the element is adversely affected, as described above. Further, there is a concern about a reduction in efficiency on the high luminance side due to the triplet-triplet extinction.

Next, in FIG. 2B, since the dibenzo[f,h]quinoxaline-based organometallic complex has the relatively deep LUMO level 232, electrons are trapped by the LUMO level 232. Since the second organic compound has an electron-transporting property, some electrons can move toward the hole-transporting layer 201 side little by little through a LUMO level 222 of the second organic compound whereas some electrons are trapped. Note that the mobility is lower than the original electron mobility of the second organic compound. On the other hand, since the second organic compound has an electron-transporting property, a HOMO level 221 of the second organic compound is relatively deep and injection of holes is difficult. Even if holes are injected, the mobility of the holes is extremely low, since the second organic compound has an electron-transporting property. There may be the case where holes are injected into the HOMO level 231 of the dibenzo[f,h]quinoxaline-based organometallic complex, but the hole-transporting property is low. In other words, in the structure of FIG. 2B, the light-emitting layer 200 has normally an electron-transporting property; however, electrons are difficult to move due to the trapping. On the other hand, holes are accumulated at the interface between the hole-transporting layer 201 and the light-emitting layer 200.

In this case, the hole density is extremely high at the interface between the light-emitting layer 200 and the hole-transporting layer 201 but is extremely low in the other regions. On the other hand, electrons are trapped by the dibenzo[f,h]quinoxaline-based organometallic complex to spread across the whole region of the light-emitting layer 200, but the electron density itself is low as a whole. In other words, the hole distribution and the electron distribution are apparently different from each other in terms of the density and the distribution profile. Therefore, it becomes difficult to recombine holes and electrons in a balanced manner and achieve the high emission efficiency. In addition, this imbalance causes an adverse effect on the lifetime of the element.

In view of the above problems, the present inventors have thought that the points below are important. The first point is that, in the structure of FIG. 2B, a certain large amount of holes are allowed to be injected into the light-emitting layer 200. The second point is that, in the structure of FIG. 2B, holes injected into the light-emitting layer 200 move toward the electron-transporting layer 202 little by little, so that the balance with electrons moving little by little can be obtained. The structure satisfying these two points is a structure of the present invention, which is typified by a band diagram as illustrated in FIG. 1.

A light-emitting layer 100 in FIG. 1 includes a first organic compound having a hole-transporting property, a second organic compound having an electron-transporting property, and a dibenzo[f,h]quinoxaline-based organometallic complex. Since a LUMO level 132 of the dibenzo[f,h]quinoxaline-based organometallic complex is lower than a LUMO level 112 of the first organic compound and a LUMO level 122 of the second organic compound, electrons are trapped by the LUMO level 132 of the dibenzo[f,h]quinoxaline-based organometallic complex. Note that since the second organic compound has an electron-transporting property, some electrons can move toward a hole-transporting layer 101 side little by little whereas some electrons are trapped by the LUMO level 132 of the dibenzo[f,h]quinoxaline-based organometallic complex. On the other hand, since the first organic compound has a hole-transporting property and also a hole accepting property, holes are injected into a HOMO level 111 of the first organic compound first. Holes are difficult to inject into the HOMO level 121 of the second organic compound. In this case, the mobility of the injected holes can be controlled by adjusting the amount of the first organic compound, and thus can be balanced with the mobility of electrons coming from the electron-transporting layer 102. That is, in the light-emitting layer 100, the balance between holes and electrons can be good. Then, holes are injected into a HOMO level 131 of the dibenzo[f,h]quinoxaline-based organometallic complex and are recombined with trapped electrons to emit light.

By exercising such an ingenuity, the present inventors have found out that the potential of dibenzo[f,h]quinoxaline-based organometallic complexes, which is high emission efficiency, can be utilized to the maximum. Further, to our surprise, the present inventors have also found out that the structure illustrated in FIG. 1 of the present invention can achieve lifetime which is several times to dozen of times as long as the those of the structures in FIGS. 2A and 2B. Whereas the first organic compound and the second organic compound are used as hosts in FIG. 2A and 2B respectively, two types of organic compounds, the first organic compound and the second organic compound are used as a host in FIG. 1; only this point is different from FIG. 2A and 2B. The phenomenon that the lifetime is extremely longer just because of that point cannot be seen in general, and is our surprise.

Note that although Patent Document 1 reports an increase in lifetime due to a mixed layer as a light-emitting layer, the increase is at best an improvement of about two times and that the effect of improving the lifetime as much as that of the present invention cannot be obtained. According to Patent Document 1, by applying the mixed layer, accumulation of charges that could lead decomposition of an organic substance can be reduced. However, unlike the present invention, there is no mention of problems of carrier balance due to the electron-trapping property of a dibenzo[f,h]quinoxaline-based organometallic complex.

In other words, Patent Document 1 and the present invention have a difference in a used organometallic complex, and therefore have a difference in a principle or an effect upon using two types of materials as a host material, resulting in a difference in an effect of improving lifetime. Note that phosphorescent compounds used in Patent Document 1 are PtOEP, which is a porphyrin complex, and [btp$_2$Ir(acac)], which is a pyridine-based organometallic complex, and both have a low electron trapping property and a high hole trapping property. That is, the phosphorescent compounds used in Patent Document 1 have properties opposite to those of the dibenzo[f,h]quinoxaline-based organometallic complex of the present invention.

As described above, the conception and effect of the present invention have been described with reference to band diagrams. Hereinafter, a more specific structure is described.

(Embodiment Mode 2)

Figure 3:
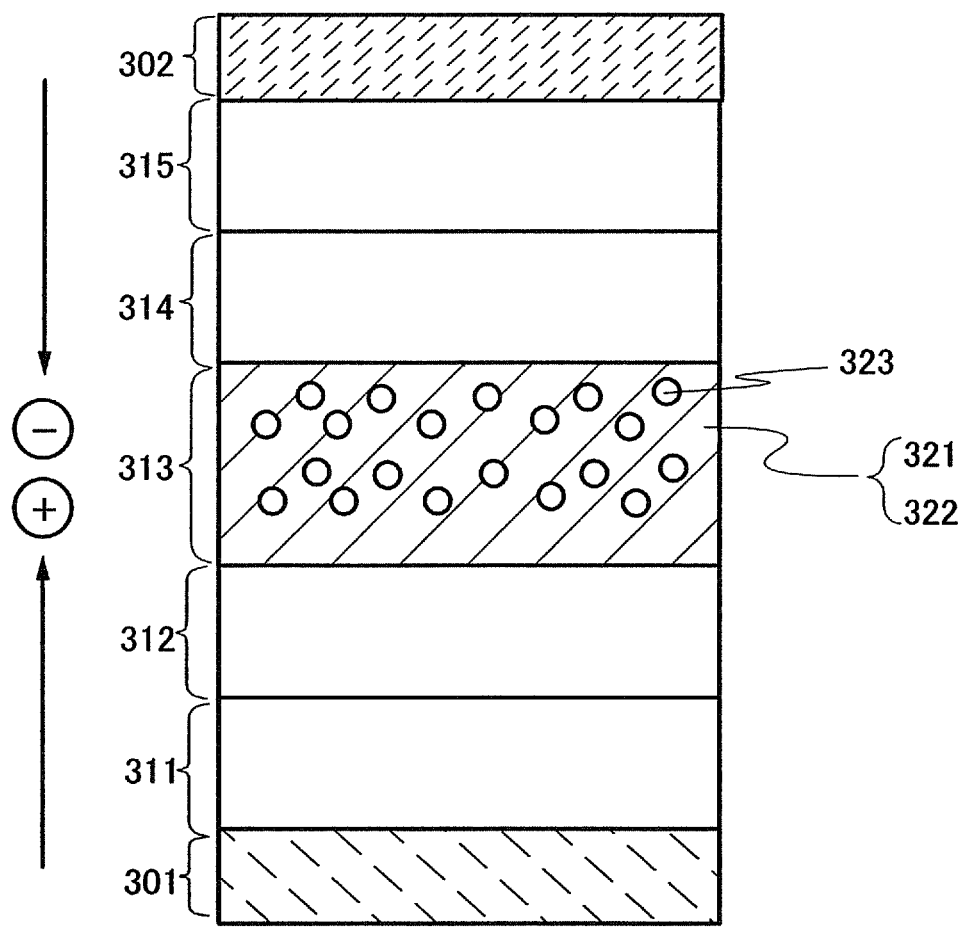
FIG. 3 illustrates an element structure of a light-emitting element according to an aspect of the present invention.

In Embodiment Mode 2, a structure of a light-emitting element according to the present invention is described with specific materials listed. FIG. 3 illustrates a structure of the element.

FIG. 3 illustrates a light-emitting element of the present invention, which includes a light-emitting layer 313 between a first electrode 301 serving as an anode and a second electrode 302 serving as a cathode. The light-emitting layer 313 includes a first organic compound 321 having a hole-transporting property, a second organic compound 322 having an electron-transporting property, and a dibenzo[f,h]quinoxaline-based organometallic complex 323. First, a structure of the light-emitting layer 313 is described below.

In the light-emitting layer 313, the first organic compound 321 is a compound having a hole-transporting property. Specifically, it is possible to use an aromatic amine compound such as 4,4'-bis[N-(1-naphthyl)-N-phenylamino]biphenyl (abbreviation: NPB), 4,4'-bis(N-(9-phenanthryl)-N-phenylamino]biphenyl (abbreviation: PPB), 4,4'-bis[N-(3-methylphenyl)-N-phenylamino]biphenyl(abbreviation: TPD), 4,4'-bis [N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4',4"-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl) triphenylamine (abbreviation: YGAO11), or N-[4-(9-carbazolyl)phenyl]-N-phenyl-9,9-dimethylfluoren-2-amine (abbreviation: YGAF); or a carbazol derivative such as 4,4'-di(N-carbazolyl)biphenyl (abbreviation: CBP), 1,3-bis(N-carbazolyl)benzene (abbreviation: mCP), or 1,3,5-tris(N-carbazolyl)benzene (abbreviation: TCzB). As an aromatic amine compound, a high molecular compound such as poly(4-vinyltriphenylamine) (abbreviation: PVTPA) can also be used. Further, as a carbazol derivative, a high molecular compound such as poly(N-vinylcarbazole) (abbreviation: PVK) can also be used. Note that the triplet excitation energy of the above first organic compound 321 is preferably larger than that of the dibenzo[f,h]quinoxaline-based organometallic complex 323.

On the other hand, the second organic compound 322 is a compound having an electron-transporting property. Specifically, it is possible to use a heteroaromatic compound such as 9-[4-(5-phenyl-1,3,4-oxadiazol-2-yl)phenyl]carbazole (abbreviation: CO11), 1,3-bis[5-(p-tert-butylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), 2,2',2"-(1,3,5-benzenetriyl)-tris(1-phenyl-1H-benzimidazole) (abbreviation: TPBI), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9"-[1,3,5-triazine-2,4,6-triyl]tricarbazole (abbreviation: TCzTRZ), 2,2',2"-(1,3,5-benzenetriyl)tris(6,7-dimethyl-3-phenylquinoxaline) (abbreviation: TriMeQn), 9,9'-(quinoxaline-2,3-diyldi-4,1-phenylene)di(9H-carbazole) (abbreviation: CzQn), 3,3',6,6'-tetraphenyl-9,9'(quinoxaline-2,3-diyldi-4,1-phenylene)di(9H-carbazole) (abbreviation: DCzPQ), bathophenanthroline (abbreviation: BPhen), bathocuproine (abbreviation: BCP); a metal complex such as bis(2-methyl-8-quinolinolato)(4-phenylphenolato)aluminum(III) (abbreviation: BAlq), tris[2-(2-hydroxyphenyl)-5-phenyl-1,3,4-oxadiazolato]aluminum (III) (abbreviation: Al(OXD)$_3$), tris(2-hydroxyphenyl)-1-phenyl-1H-benzoimidazolato]aluminum(III) (abbreviation: Al(BIZ)$_3$), bis[2-(2-hydroxyphenyl)benzothiazolato]zinc(II) (abbreviation: Zn(BTZ)$_2$), or bis[2-(2-hydroxyphenyl)benzoxazolato]zinc(II) (abbreviation: Zn(PBO)$_2$). As a heteroaromatic compound, a high molecular compound such as poly(2,5-pyridinediyl) (abbreviation: PPy) can also be used. Further, as a metal complex, a metal complex high molecular compound as disclosed in Reference (:X. T. TAO et al., Applied Physics Letters, vol. 70, No. 12, 1997, pp. 1503-1505) can also be used. Note that the triplet excitation energy of the above second organic compound 322 is preferably larger than that of the dibenzo[f,h]quinoxaline-based organometallic complex 323.

The dibenzo[f,h]quinoxaline-based organometallic complex 323 is an organometallic complex in which a ligand has a dibenzo[f,h]quinoxaline skeleton and a central metal is a Group 9 element (Co, Rh, or Ir) or a Group 10 element (Ni, Pd, or Pt). Furthermore, the organometallic complex has the property of emitting phosphorescence. A specific structure of this dibenzo[f,h]quinoxaline-based organometallic complex is described in Embodiment Mode 3.

The first organic compound, the second organic compound, and the dibenzo[f,h]quinoxaline-based organometallic complex as described above are combined as appropriate, thereby forming the light-emitting layer of the light-emitting element of the present invention. Note that the light-emitting layer may include another substance.

Here, in the light-emitting layer, it is preferable that at least one of the first organic compound and the second organic compound serve as a host material and that the dibenzo[f,h]quinoxaline-based organometallic complex serve as a guest material. This is in order to prevent concentration quenching of the dibenzo[f,h]quinoxaline-based organometallic complex. Also, this is in order that the carrier balance in the light-emitting layer can be adjusted by the first organic compound and the second organic compound.

Therefore, in the light-emitting element of the present invention, preferably, the amount of the first organic compound and/or the second organic compound is larger than that of the dibenzo[f,h]quinoxaline-based organometallic complex. Specifically, its volume fraction or its mass fraction is preferably high. In addition, in terms of prevention of concentration quenching, the ratio of the dibenzo[f,h]quinoxaline-based organometallic complex to the light-emitting layer is preferably greater than or equal to 1 weight % and less than or equal to 10 weight %.

Further, in the light-emitting layer, the weight ratio of the first organic compound to the second organic compound is preferably in the range of 1:20 to 20:1. That is, the weight ratio of the second organic compound to the first organic compound is preferably greater than or equal to 1/20 and less than or equal to 20. If the weight ratio is out of this range, the state of the light-emitting element can be substantially the same as that in FIG. 2A or 2B described above.

Furthermore, the present inventors have found that the structure of the light-emitting layer in which the amount of the second organic compound having an electron-transporting property is equal to or higher than that of the first organic compound having a hole-transporting property is particularly effective. This appears to be caused from that the hole mobility is higher than the electron mobility in general organic compounds. Accordingly, in the present invention, the weight ratio of the second organic compound to the first organic compound is more preferably greater than or equal to 1 and less than or equal to 20. The range which is extremely effective for obtaining long lifetime is greater than or equal to 5 and less than or equal to 20, in particular.

Note that the dibenzo[f,h]quinoxaline-based organometallic complex used in the present invention has an electron-trapping property. Specifically, the LUMO level of the dibenzo[f,h]quinoxaline-based organometallic complex is often deeper than the LUMO level of the first organic compound and the LUMO level of the second organic compound by 0.2 eV or more. Further, in such a case, the lifetime improvement and the efficiency improvement are significant. Thus, one feature of the present invention is that the LUMO level of the dibenzo[f,h]quinoxaline-based organometallic complex is deeper than the LUMO level of the first organic compound and the LUMO level of the second organic compound by 0.2 eV or more.

Next, layers other than the light-emitting layer 313 are described. A hole-transporting layer 312 and a hole-injecting layer 311 are not necessarily provided, and they may be provided as necessary. As specific materials for forming these layers, hole-transporting compounds are preferable, and NPB, PPB, TPD, DFLDPBi, TDATA, m-MTDATA, TCTA, TPAC, TPAF, YGAO11, YGAF, CBP, mCP, TCzB, PVTPA, PVK or the like described above can be used.

Further, since the light-emitting layer 313 of the present invention has a good carrier balance as described in Embodiment Mode 1, a light-emitting region can be prevented from being concentrated in the interface between the light-emitting layer 313 and the hole-transporting layer 312 or the hole-injecting layer 311. Therefore, even if a substance having a triplet excitation energy lower than that of the dibenzo[f,h]quinoxaline-based organometallic complex 323 is applied to the hole-transporting layer 312 or hole-injecting layer 311 which could be in contact with the light-emitting layer 313, the substance hardly serves as a quencher to the dibenzo[f,h]quinoxaline-based organometallic complex 323, and accordingly a light-emitting element with high emission efficiency can be manufactured. Therefore, as a material for forming the hole-transporting layer 312 or the hole-injecting layer 311, an anthracene derivative having a low triplet excitation energy, such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used.

Note that the electron-transporting layer 314 and the electron-injecting layer 315 may be formed by mixing the electron-transporting compound described above and an electron donor. As the electron acceptor, an organic compound such as chloranil or 7,7,8,8-tetracyano-2,3,5,6-tetrafluoroquinodimethane (abbreviation: $F_4$-TCNQ), a transition metal oxide such as molybdenum oxide, vanadium oxide, or rhenium oxide can be used. In particular, for the hole-injecting layer 311, an organic compound such as copper phthalocyanine, vanadyl phthalocyanine, or fluorocarbon, or an inorganic compound such as molybdenum oxide, ruthenium oxide, or aluminum oxide can also be used. Note that the hole-injecting layer 311 may have a multilayer structure formed by stacking two or more layers. Further, the hole-injecting layer 311 and the hole-transporting layer 312 may be formed by mixing two or more kinds of substances.

The electron-transporting layer 314 and the electron-injecting layer 315 are not necessarily required, and may be provided as necessary.

As specific materials for forming these layers, electron-transporting compounds are preferable, and CO11, OXD-7, PBD, TPBI, TAZ, p-EtTAZ, TCzTRZ, TriMeQn, CzQn, DCzPQ, BPhen, BCP, BAlq, $Al(OXD)_3$, $Al(BIZ)_3$, $Zn(BTZ)_2$, Zn $(PBO)_2$, PPy, or the like described above can be used.

Further, since the light-emitting layer 313 of the present invention has a good carrier balance, as described in Embodiment Mode 1, a light-emitting region can be prevented from being concentrated in the interface between the light-emitting layer 313 and the electron-transporting layer 314 or the electron-injecting layer 315. Therefore, if a substance having a triplet excitation energy lower than that of the dibenzo[f,h]quinoxaline-based organometallic complex 323 is applied to the electron-transporting layer 314 or electron-injecting layer 315 which could be in contact with the light-emitting layer 313, the substance hardly serves as a quencher to the dibenzo[f,h]quinoxaline-based organometallic complex 323, and accordingly a light-emitting element with high emission efficiency can be manufactured. Therefore, a substance having a low triplet excitation energy, such as tris(8-quinolinolato)aluminum(III) (abbreviation: $Alq_3$), tris(4-methyl-8-quinolinolato)aluminum(III) (abbreviation: $Almq_3$), or bis(10-hydroxybenzo[h]quinolinato)berylium(II) (abbreviation: $BeBq_2$), can be used as a material for the electron-transporting layer 314 or the electron-injecting layer 315 (for example, it is reported that the phosphorescence spectrum of $Alq_3$ is approximately 650 nm to 700 nm of deep red).

Note that the electron-transporting layer 314 and the electron-injecting layer 315 may be formed by mixing the electron-transporting compound described above and an electron donor. As the electron donor, an organic compound such as tetrathiafulvalene or tetrathianaphthacene, an alkali metal such as lithium or cesium, an alkaline earth metal such as magnesium or calcium, a rare-earth metal such as erbium or ytterbium, or an oxide of such a metal can be used. In particular, for the electron-injecting layer 315, an alkali metal compound, an alkaline earth metal compound, or a rare-earth metal compound, such as lithium oxide, lithium fluoride, calcium fluoride, erbium fluoride, can be used alone.

Note that the electron-injecting layer 315 may have a multilayer structure formed by stacking two or more layers. Further, the electron-transporting layer 314 and the electron-injecting layer 315 may be formed by mixing two or more kinds of substances.

Although there is no particular limitation on the first electrode 301, as described in Embodiment Mode 2, the first electrode 301 is preferably formed of a substance having a high work function when the first electrode 301 serves as an anode. Specifically, it is possible to use a substance having a high light-transmitting property, such as indium tin oxide (ITO), indium tin oxide containing silicon oxide (ITSO), or indium oxide containing 2 wt % to 20 wt % zinc oxide (IZO); gold (Au); platinum (Pt); nickel (Ni); tungsten (W); chromium (Cr); molybdenum (Mo); iron (Fe); cobalt (Co); copper (Cu); palladium (Pd); or the like. Note that the first electrode 301 can be formed by, for example, a sputtering method, an evaporation method, or the like.

Further, although there is no particular limitation on the second electrode 302, as described in Embodiment Mode 2, the second electrode 302 is preferably formed of a substance having a low work function when the second electrode 302 serves as a cathode. Specifically, aluminum (Al); indium (In); an alkali metal such as lithium (Li) or cesium (Cs); an alkali-earth metal such as magnesium (Mg) or calcium (Ca); or a rare-earth metal such as erbium (Er) or ytterbium (Yb) can be used. Alternatively, an alloy such as aluminum-lithium alloy (AlLi) or magnesium-silver alloy (MgAg) can also be used. In addition, when the electron-injecting layer 315 is formed by mixing an electron-transporting compound and an electron donor, a substance having a high work function and a high light-transmitting property, such as ITO, ITSO, or IZO can also be used. Note that the second electrode 302 can be formed by, for example, a sputtering method, an evaporation method, or the like.

Note that in order to extract generated light to the outside, it is preferable that one or both of the first electrode 301 and the second electrode 302 be an electrode formed of a substance having a high light-transmitting property, such as ITO, ITSO, or IZO. Alternatively, it is preferable that one or both of the first electrode 301 and the second electrode 302 be an electrode formed to a thickness of several to several tens of nanometers so that visible light can be transmitted.

In the above-described light-emitting element of the present invention, each of the hole-injecting layer 311, the hole-transporting layer 312, the light-emitting layer 313, the electron-transporting layer 314, and the electron-injecting layer 315 may be formed by any method such as an evaporation method, an inkjet method, or a coating method. The first electrode 301 or the second electrode 302 may also be formed by any method such as a sputtering method, an evaporation method, an inkjet method, or a coating method.

Further, the above-described light-emitting element of the present invention may be applied to a tandem type light-emitting element (also referred to as a multiphoton element).

(Embodiment Mode 3)

In this embodiment mode, a dibenzo[f,h]quinoxaline-based organometallic complex which can be used for the light-emitting element of the present invention is described specifically.

A dibenzo[f,h]quinoxaline-based organometallic complex is an organometallic complex in which a ligand has a dibenzo[f,h]quinoxaline skeleton and a central metal is a Group 9 element (Co, Rh, or Ir) or a Group 10 element (Ni, Pd, or Pt). Further, this organometallic complex has the property of emitting phosphorescence.

Many of organometallic complexes using a Group 9 or Group 10 metal exhibit metal to ligand charge transfer (MLCT) transition. In particular, the triplet MLCT transition is often observed in phosphorescent compounds. Here, the LUMO level of the organometallic complex exhibiting MLCT transition is determined by the rank of the LUMO level of a ligand. Therefore, if a ligand having a high LUMO level is used, the LUMO level of the organometallic complex is also high, and if a ligand having a low LUMO level, the LUMO level of the organometallic complex is also low. In addition, since dibenzo[f,h]quinoxaline has a LUMO level lower than that of pyridine, the dibenzo[f,h]quinoxaline-based organometallic complex of the present invention exhibits a LUMO level lower (i.e., an electron-trapping property higher) than that of a conventional pyridine-based organometallic complex.

A ligand of the dibenzo[f,h]quinoxaline-based organometallic complex, which is used in the present invention, has a dibenzo[f,h]quinoxaline skeleton. As an organometallic complex obtained by ortho-metalation of a dibenzo[f,h]quinoxaline derivative, for example, organometallic complexes represented by structural formulae (I) and (II) below are given.

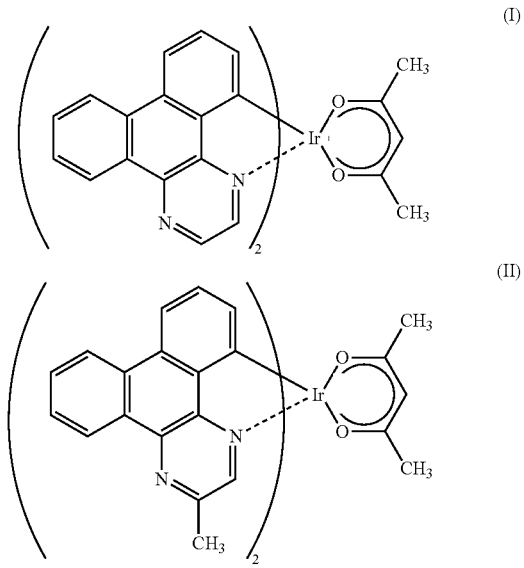

Furthermore, more preferably, the organometallic complex having the structure represented by the general formula (G1) below is given. The organometallic complex having the structure represented by the general formula (G1) emits red light with high color purity and high efficiency.

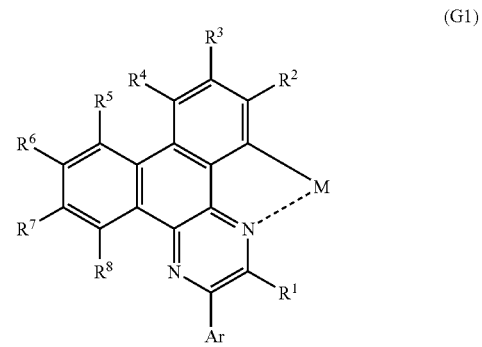

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring; and M is a central metal and represents a Group 9 or Group 10 element.

In the general formula (G1), $R^1$ is preferably hydrogen in terms of synthesis yield. This is because steric hindrance is reduced and accordingly a dibenzo[f,h]quinoxaline derivative which is the ligand can be easily ortho-metalated to a metal ion. Also, for ease of synthesis, it is preferable that $R^2$, $R^4$, $R^5$, $R^7$, and $R^8$ be individually hydrogen. As such an organometallic complex, the organometallic complex having the structure represented by the general formula (G2) below is given.

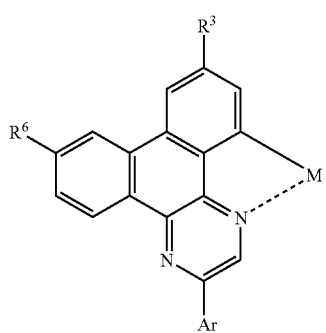

(G2)

In the formula, Ar represents an aryl group having 6 to 25 carbon atoms, $R^3$ and $R^6$ individually represent any of hydrogen, an alkyl group having 1 to 4 carbon atoms, an alkoxy group having 1 to 4 carbon atoms, an acyloxy group having 1 to 4 carbon atoms, or a halogen group, and M is a central metal and represents a Group 9 or Group 10 element.

Moreover, in the general formula (G2), it is preferable that $R^3$ and $R^6$ be individually hydrogen because the synthesis can be further facilitated. As such an organometallic complex, the organometallic complex having the structure represented by the general formula (G3) below is given.

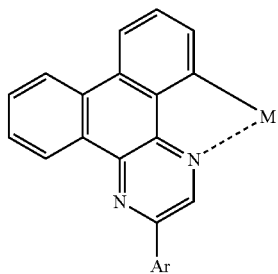

(G3)

In the formula, Ar represents an aryl group having 6 to 25 carbon atoms, and M is a central metal and represents a Group 9 or Group 10 element.

Furthermore, in the general formula (G3), by using a substituted or unsubstituted phenyl group for Ar, red light emission with high color purity and high luminous efficiency can be obtained. By using such an organometallic complex, a light-emitting element with higher emission efficiency can be obtained. As such an organometallic complex, the organometallic complex having the structure represented by the general formula (G4) below is given.

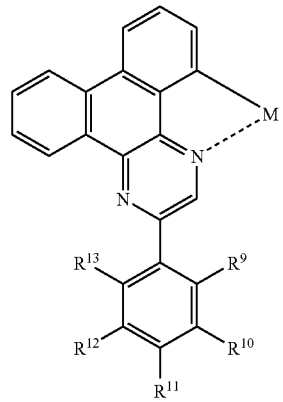

(G4)

In the formula, $R^9$ to $R^{13}$ individually represent any of hydrogen, an alkyl group having 1 to 4 carbon atoms, an alkoxy group having 1 to 4 carbon atoms, an aryl group having 6 to 12 carbon atoms, or a halogen group, and M is a central metal and represents a Group 9 or Group 10 element.

Further, in the general formula (G4), it is preferable that $R^9$ to $R^{13}$ be individually hydrogen. With such a structure, red light emission having the chromaticity near the red-color chromaticity (i.e., (x, y)=(0.67, 0.33)) defined by the National Television Standards Committee (NTSC) can be obtained.

Note that, as the organometallic complex having any of the structures represented by the general formulae (G1) to (G3), specifically, a mixed ligand organometallic complex which is represented by any of the general formulae (G5) to (G8) below and has a ligand L in addition to the dibenzo[f,h]quinoxaline derivative is preferable. This is because such a complex is easy to synthesize.

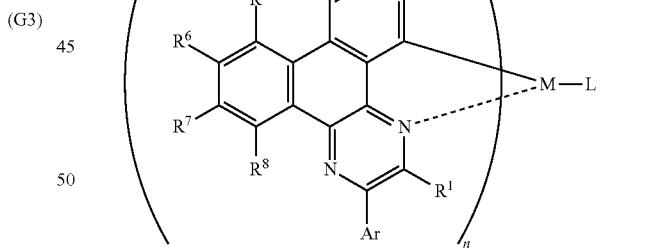

(G5)

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring; M is a central metal and represents a Group 9 or Group 10 element, L represents a monoanionic ligand, n is 2 when the central metal is a Group 9 element, and n is 1 when the central metal is a Group 10 element.

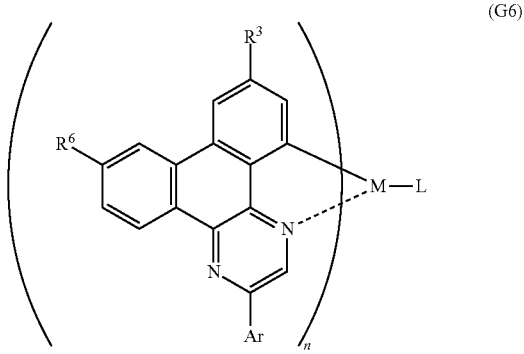

(G6)

In the formula, Ar represents an aryl group having 6 to 25 carbon atoms, $R^3$ and $R^6$ individually represent any of hydrogen, an alkyl group having 1 to 4 carbon atoms, an alkoxy group having 1 to 4 carbon atoms, an acyloxy group having 1 to 4 carbon atoms, or a halogen group, M is a central metal and represents a Group 9 or Group 10 element, L represents a monoanionic ligand, n is 2 when the central metal is a Group 9 element, and n is 1 when the central metal is a Group 10 element.

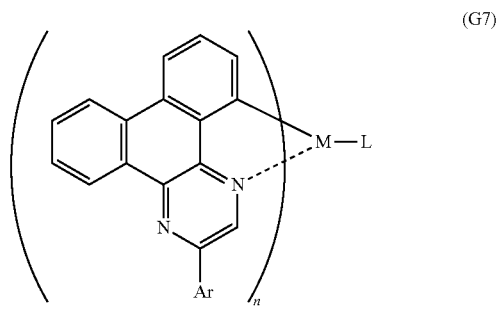

(G7)

In the formula, Ar represents an aryl group having 6 to 25 carbon atoms, M is a central metal and represents a Group 9 or Group 10 element, L represents a monoanionic ligand, n is 2 when the central metal is a Group 9 element, and n is 1 when the central metal is a Group 10 element.

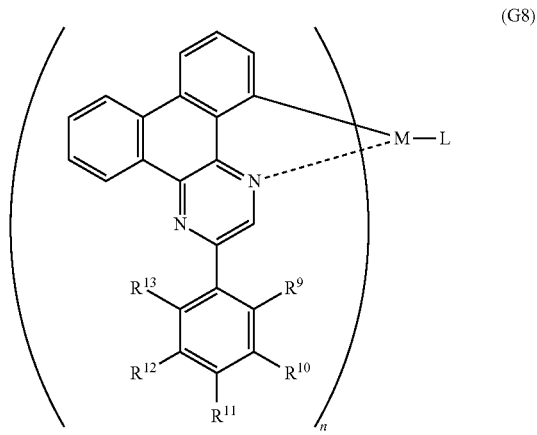

(G8)

In the formula, $R^9$ to $R^{13}$ individually represent any of hydrogen, an alkyl group having 1 to 4 carbon atoms, an alkoxy group having 1 to 4 carbon atoms, an aryl group having 6 to 12 carbon atoms, or a halogen group, M is a central metal and represents a Group 9 or Group 10 element, L represents a monoanionic ligand, n is 2 when the central metal is a Group 9 element, and n is 1 when the central metal is a Group 10 element.

Note that in the general formula (G8), it is preferable that $R^9$ to $R^{13}$ be individually hydrogen. With such a structure, red light emission having the chromaticity near the red-color chromaticity (i.e., (x, y)=(0.67, 0.33)) defined by the National Television Standards Committee (NTSC) can be obtained.

Further, the central metal of the above dibenzo[f,h]quinoxaline-based organometallic complex is preferably iridium or platinum in terms of heavy atom effect. In particular, iridium is preferable since remarkable heavy atom effect can be obtained to provide extremely high efficiency and also chemical stability is obtained.

Next, the aryl group Ar, the subsistents $R^1$ to $R^{13}$, and the monoanionic ligand L in the above general formulae (G1) to (G8) are described in detail.

First, as the aryl group Ar, an aryl group having 6 to 25 carbon atoms is preferably used. As specific examples of the aryl group Ar, there are a substituted or unsubstituted phenyl group, a 1-naphthyl group, a 2-naphthyl group, a spirofluorene-2-yl group, a 9,9-dialkylfluorene-2-yl group such as a 9,9-dimethylfluorene-2-yl group, and the like. In particular, by using a substituted or unsubstituted phenyl group for the aryl group, red light emission with high color purity and high luminous efficiency can be obtained. When the phenyl group has a substituent, the substituent may be, more specifically, an alkyl group such as a methyl group, an ethyl group, an isopropyl group, or a tert-butyl group, an alkoxy group such as a methoxy group, an ethoxy group, an isopropoxy group, or a tert-butoxy group, an aryl group such as a phenyl group or a 4-biphenylyl group, a halogen group such as a fluoro group, or a trifluoromethyl group.

Next, as specific examples of the substituent $R^1$, there are an alkyl group such as a methyl group, an ethyl group, an isopropyl group, or a tert-butyl group, and an alkoxy group such as a methoxy group, an ethoxy group, an isopropoxy group, or a tert-butoxy group. Note that $R^1$ is preferably hydrogen in terms of synthesis yield. This is because steric hindrance is reduced and accordingly a ligand portion can be easily ortho-metalated to a metal ion.

As specific examples of substituents $R^2$ to $R^8$, there are hydrogen; an alkyl group such as a methyl group, an ethyl group, an isopropyl group, or a tert-butyl group, an alkoxy group such as a methoxy group, an ethoxy group, an isopropoxy group, or a tert-butoxy group, an acyloxy group such as an acetoxy group, and a halogen group such as a fluoro group. Further, when $R^4$ and $R^5$ are bonded to each other to form a ring, there is a methylene group as the specific example. Further, when $R^3$ and $R^4$ are bonded to each other to form a ring and $R^5$ and $R^6$ are bonded to each other to form a ring, there are a methylenedioxy group and the like as the specific examples.

As specific examples of substituents $R^9$ to $R^{13}$, there are hydrogen; an alkyl group such as a methyl group, an ethyl group, an isopropyl group, or a tert-butyl group, an alkoxy group such as a methoxy group, an ethoxy group, an isopropoxy group, or a tert-butoxy group, an aryl group such as a pheny group or a naphthyl group, and a halogen group such as a fluoro group.

Next, the monoanionic ligand L is described. The monoanionic ligand L is preferably any one of a monoanionic bidentate chelate ligand having a β-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen. This is because these ligands have high coordinating ability. Although, more specifically, the monoanionic ligands represented by structural formulae (L1) to (L9) below are given, the present invention is not limited to these ligands.

(L1)
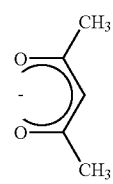

(L2)
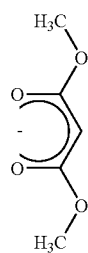

(L3)
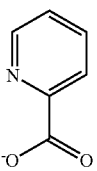

(L4)
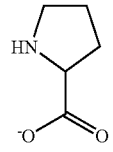

(L5)
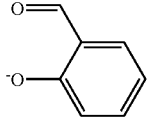

(L6)
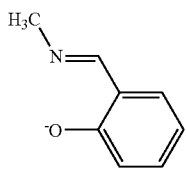

(L7)
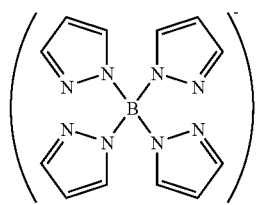

(L8)
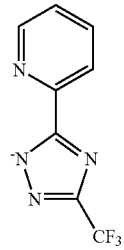

(L9)
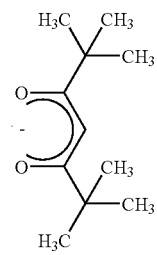

According to the modes described above, the dibenzo[f,h]quinoxaline-based organometallic complex which can be used in the present invention are formed. Hereinafter, specific structural formulae are given (structural formulae (1) to (56) below). Note that the dibenzo[f,h]quinoxaline-based organometallic complex of the present invention is not limited to these complexes.

(1)
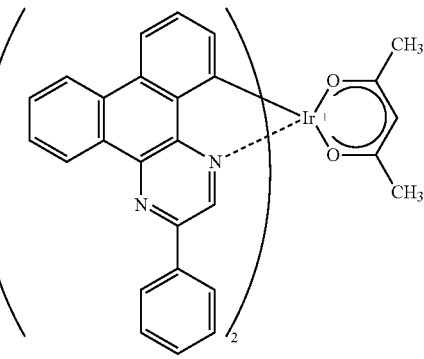

(2)
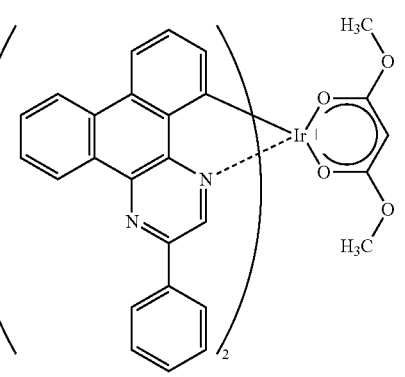

(3)
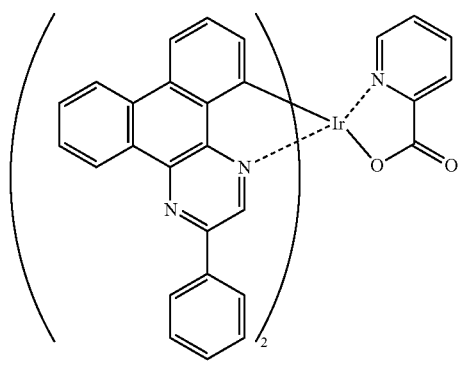
(4)
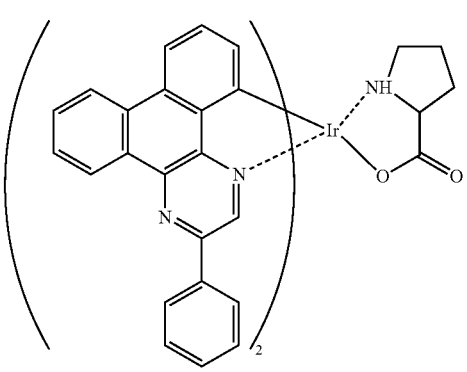
(5)
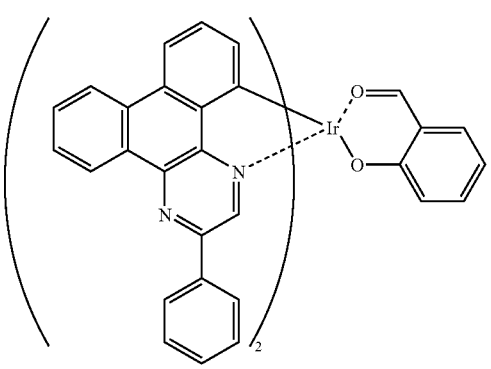
(6)
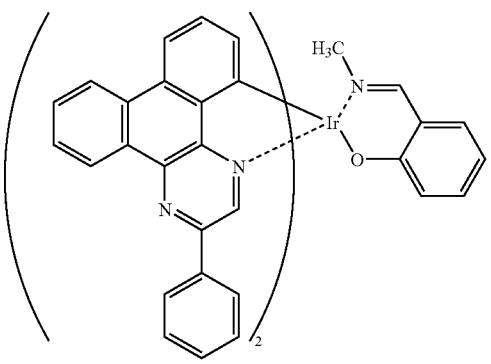
(7)
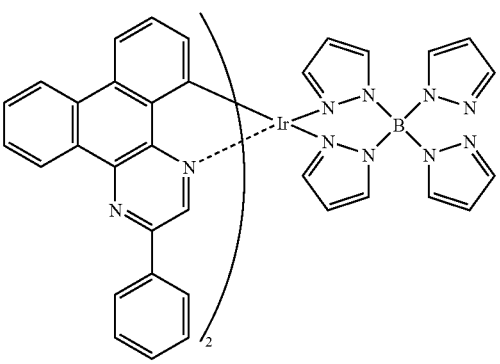
(8)
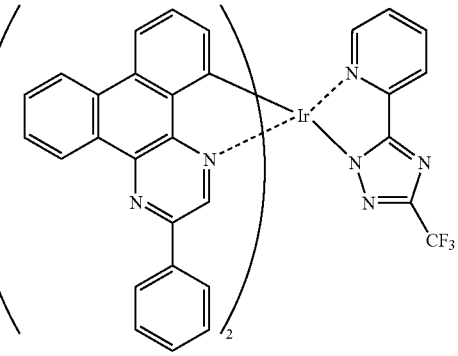
(9)
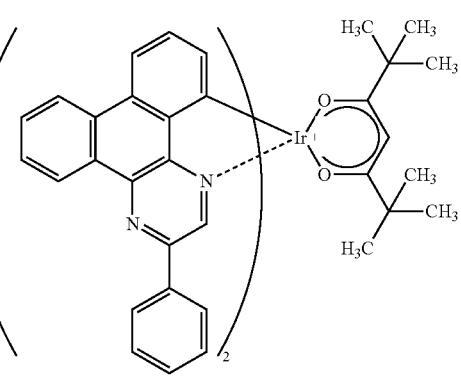
(10)
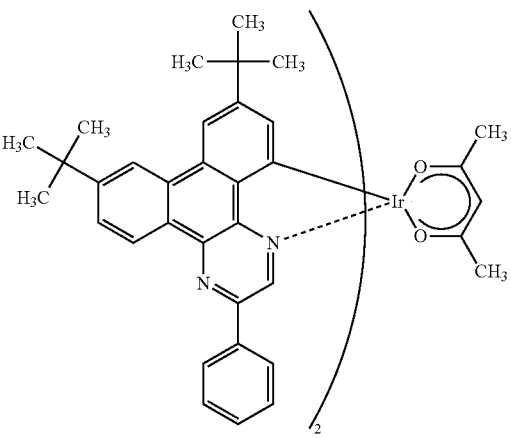

(11)
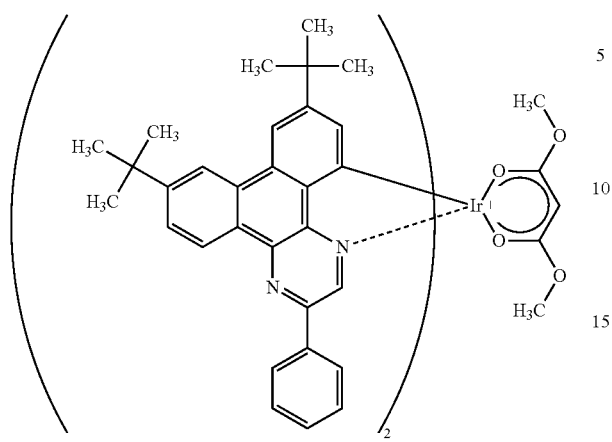
(12)
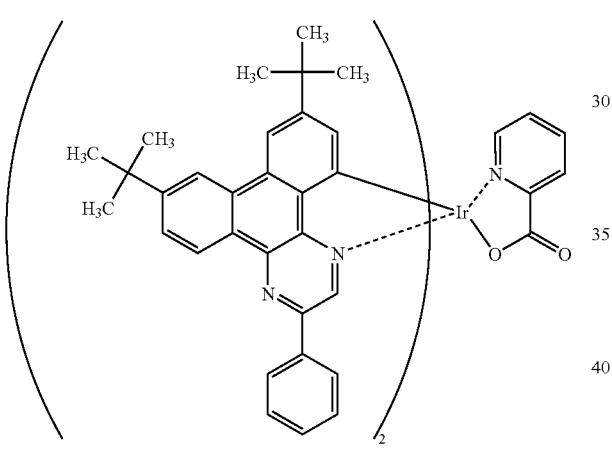
(13)
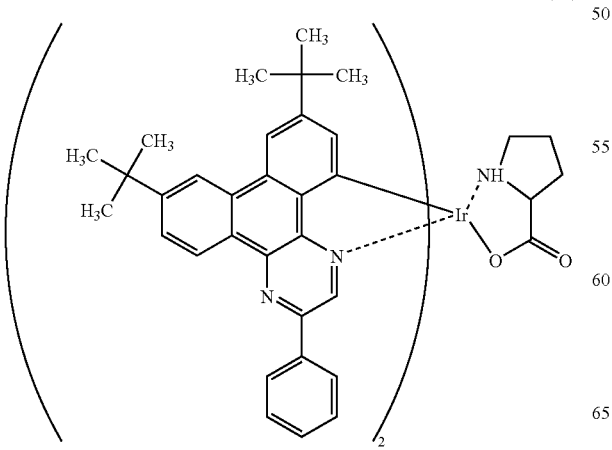
(14)
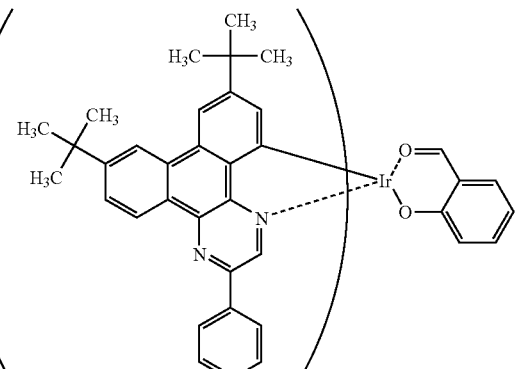
(15)
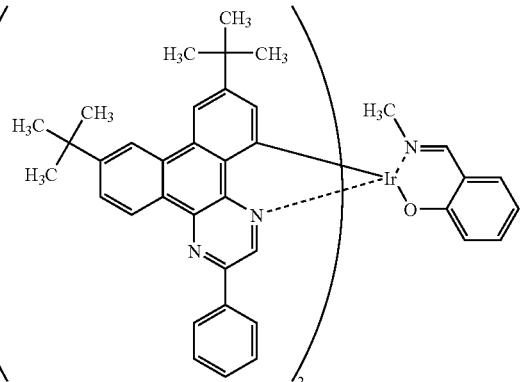
(16)
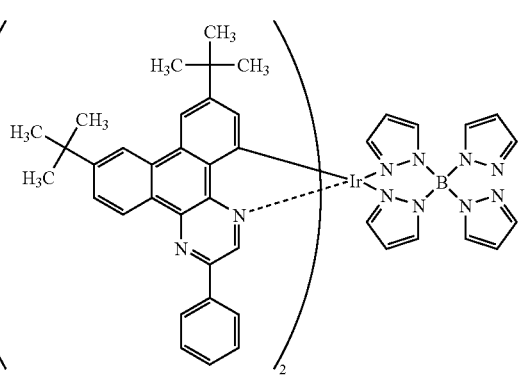
(17)

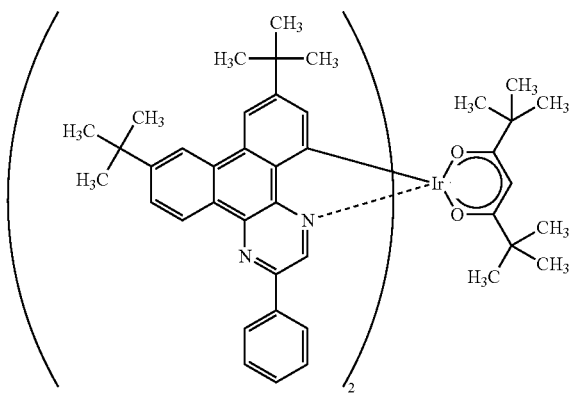 (18)
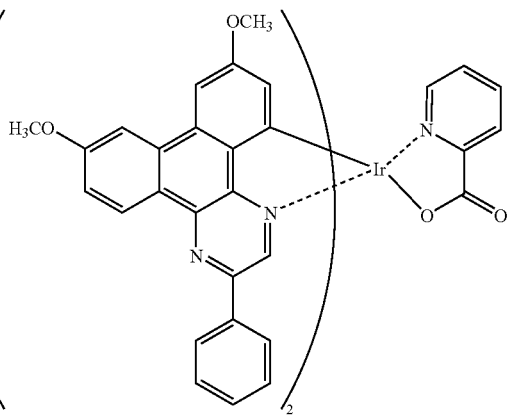 (21)
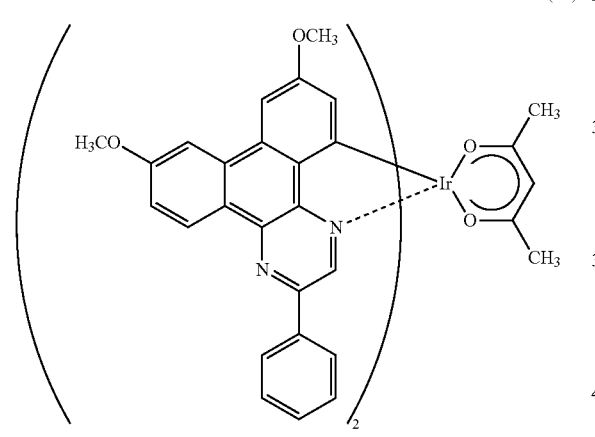 (19)
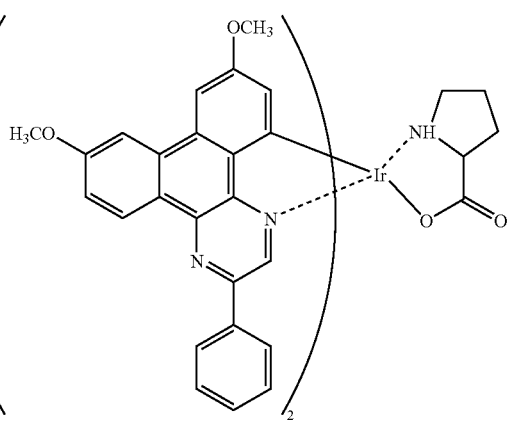 (22)
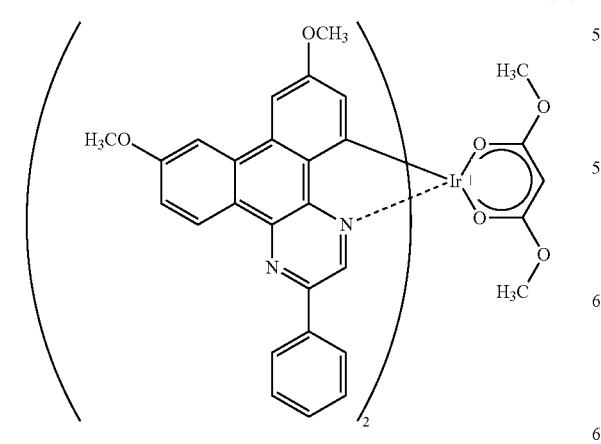 (20)
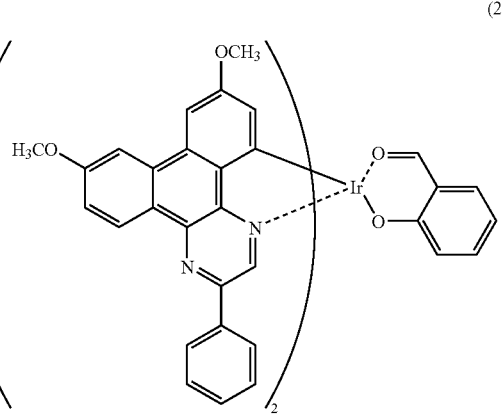 (23)

-continued
(24)
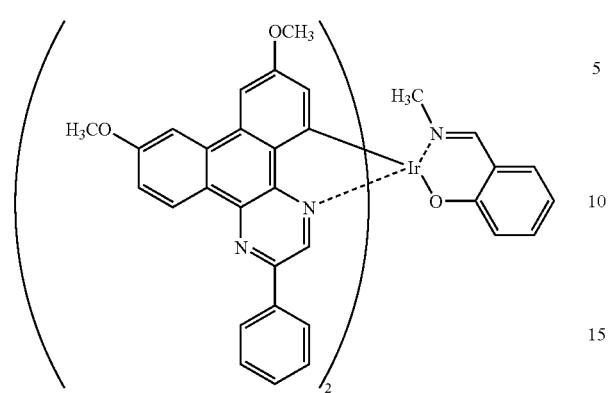
(25)
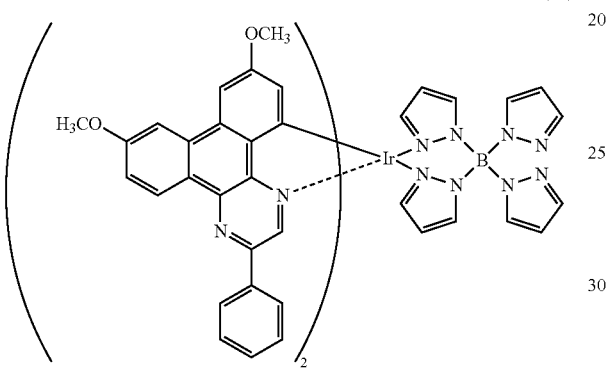
(26)
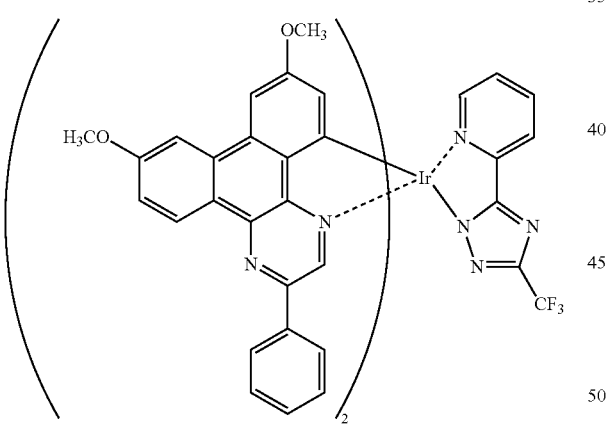
(27)
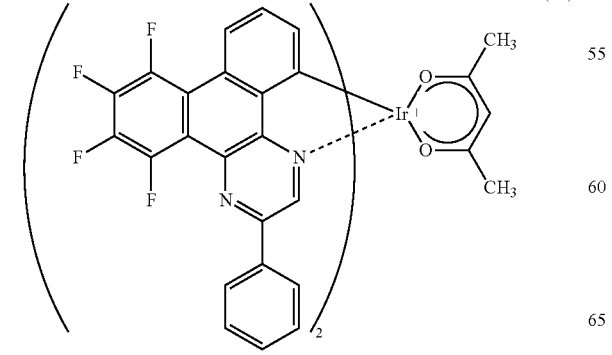
-continued
(28)
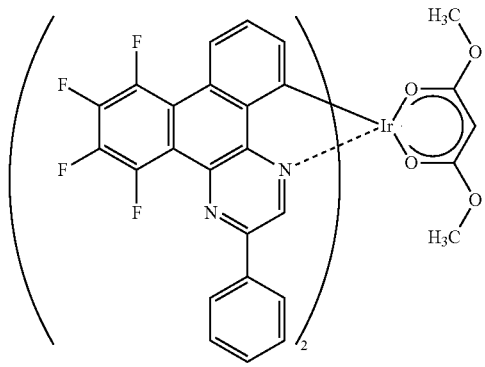
(29)
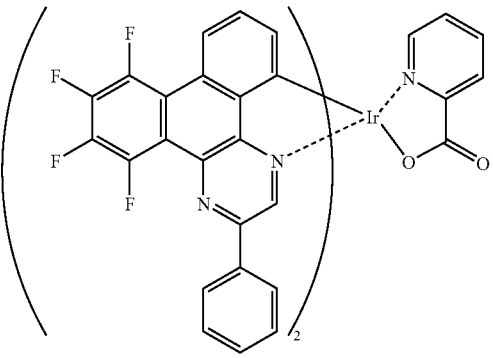
(30)
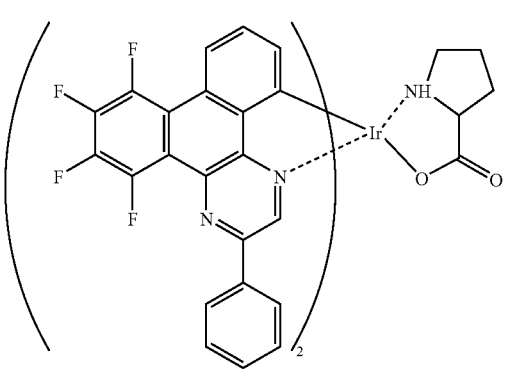
(31)
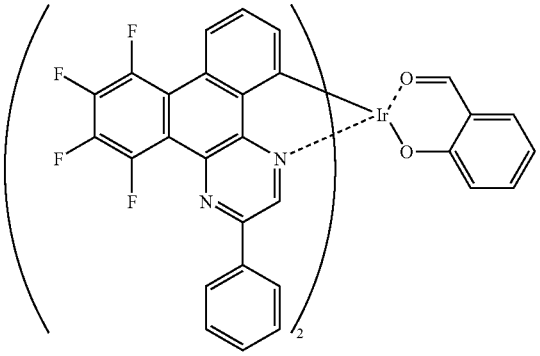

-continued
(32)
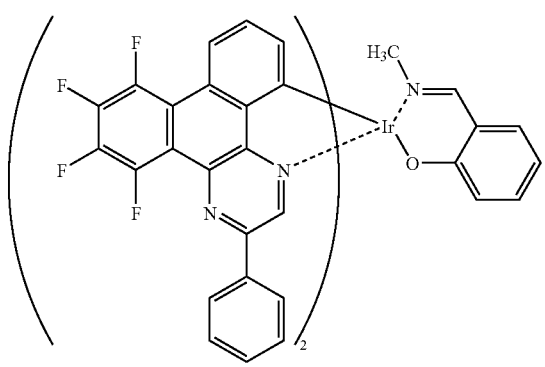
(33)
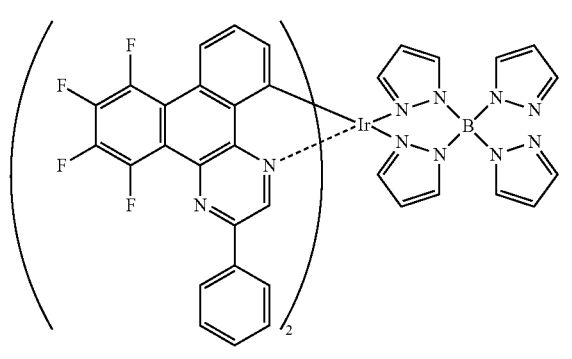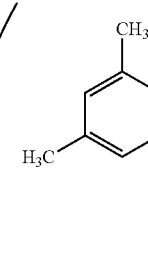
(34)
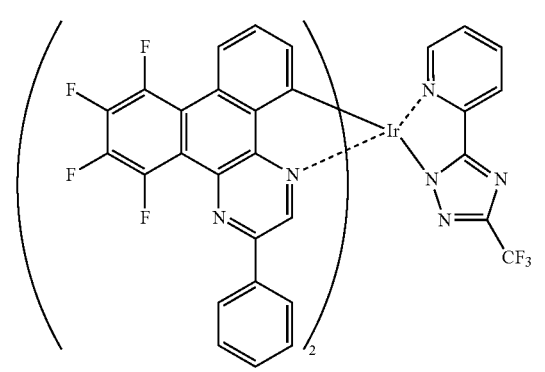
(35)
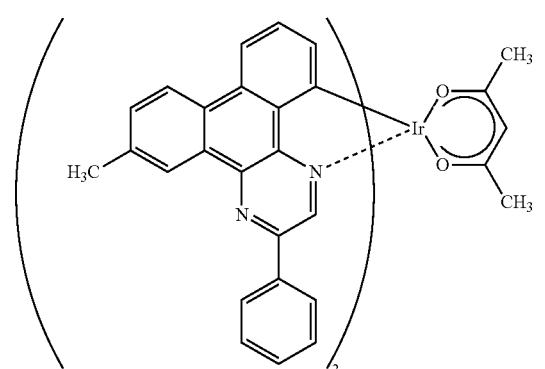
-continued
(36)
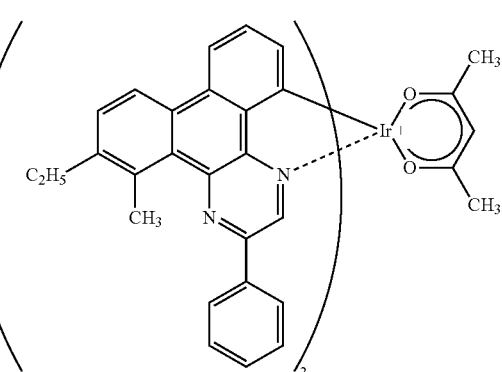
(37)
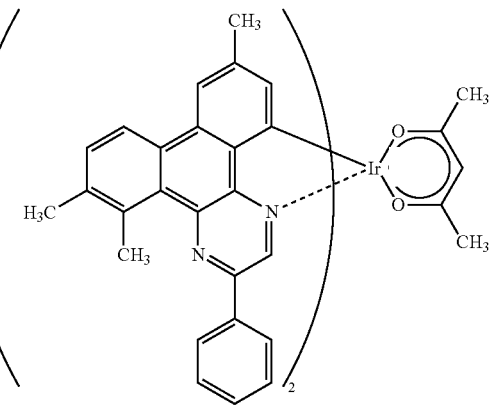
(38)
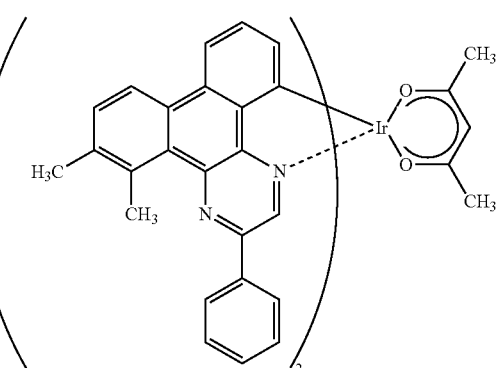
(39)

(40)
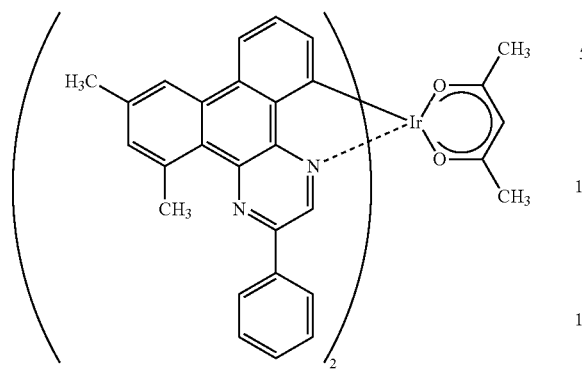
(44)
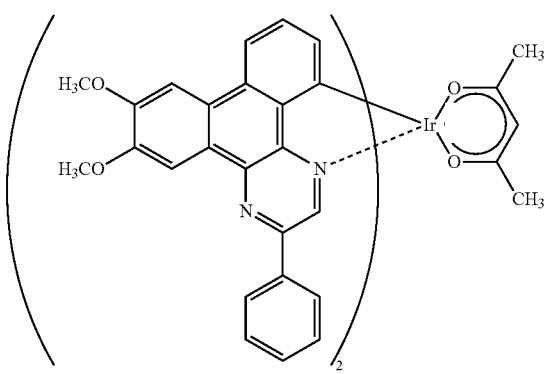
(41)
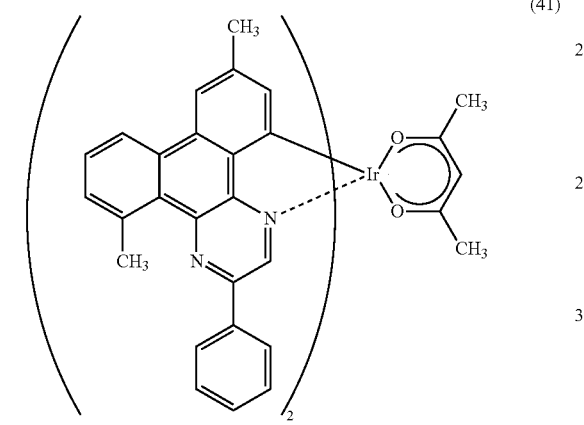
(45)
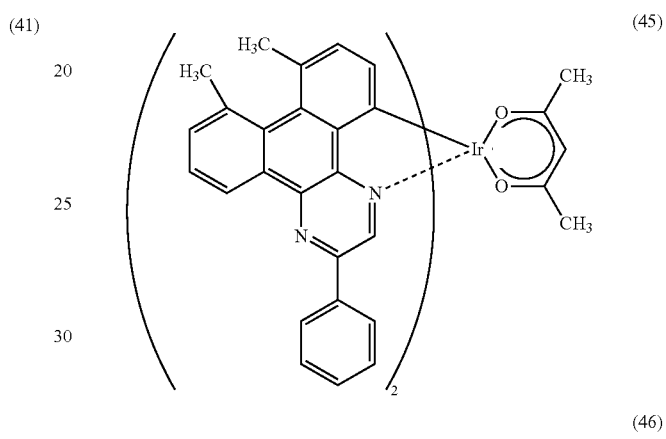
(42)
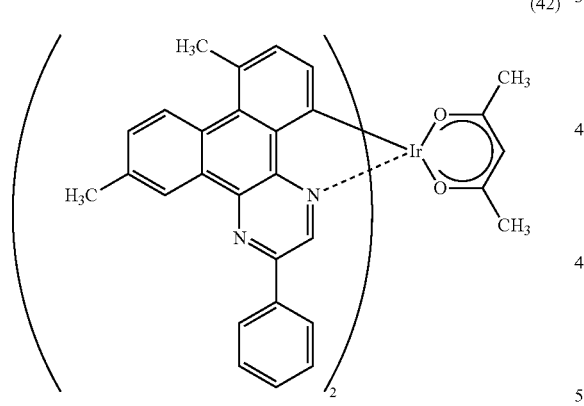
(46)
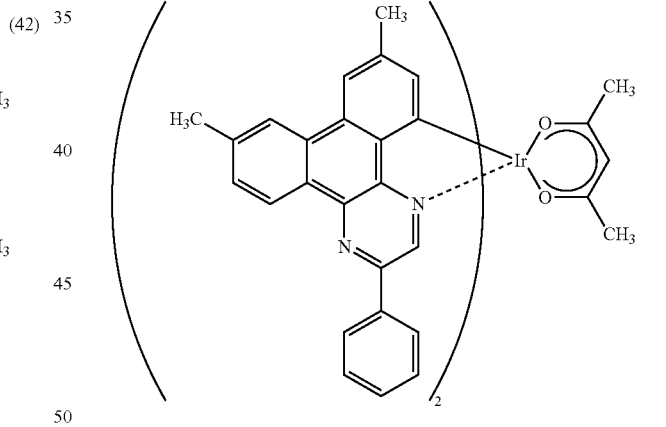
(43)
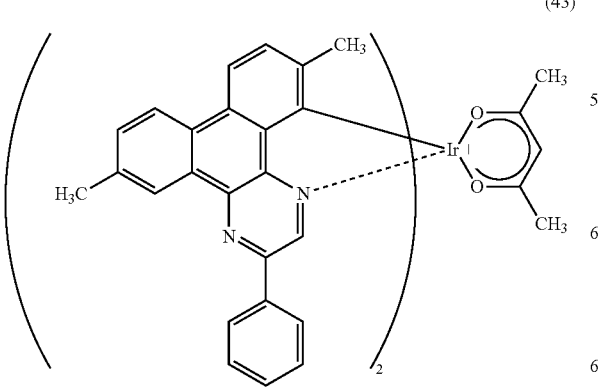
(47)
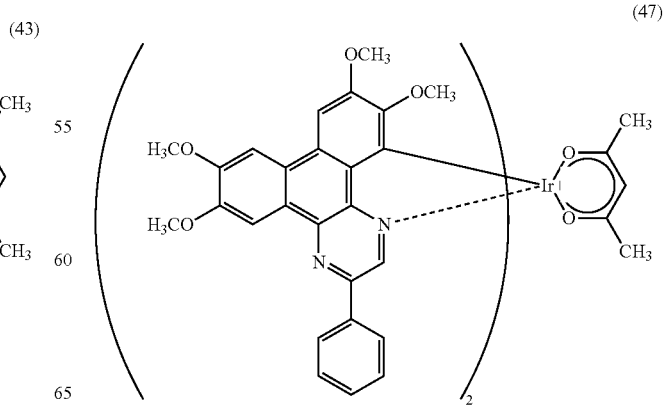

37
-continued
(48)
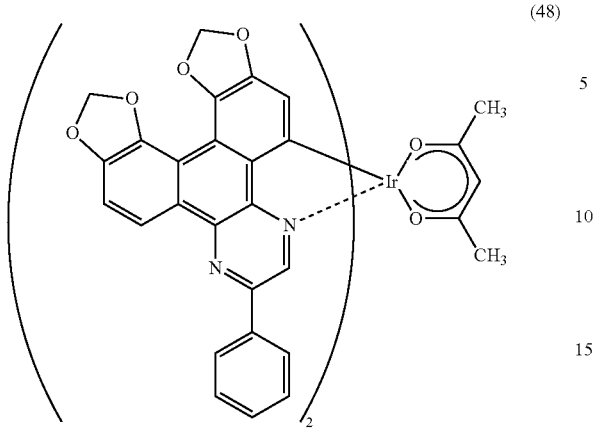
(49)
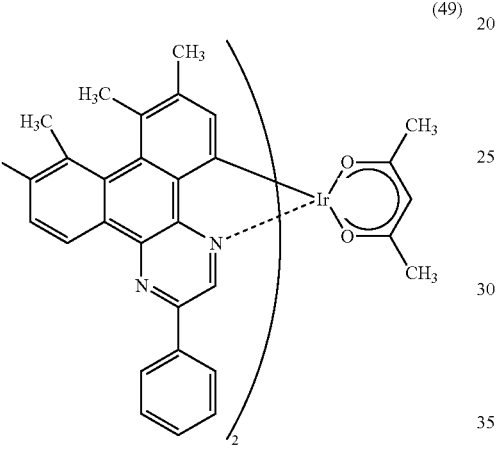
(50)
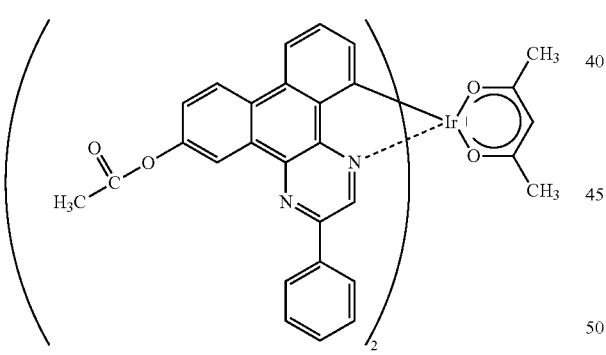
(51)
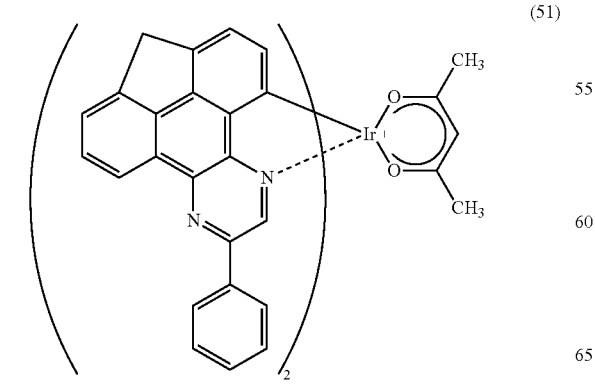
38
-continued
(52)
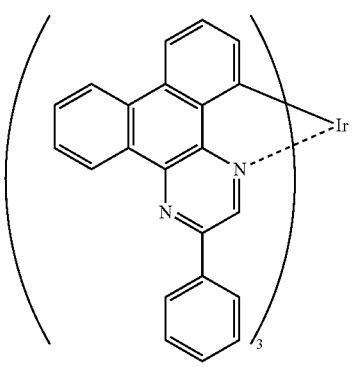
(53)
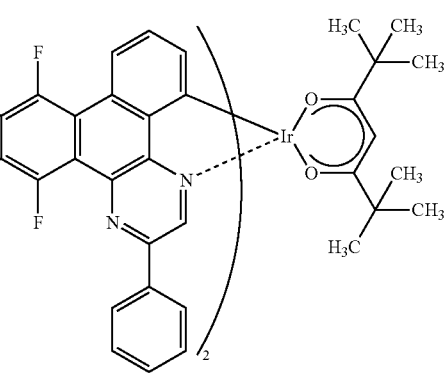
(54)
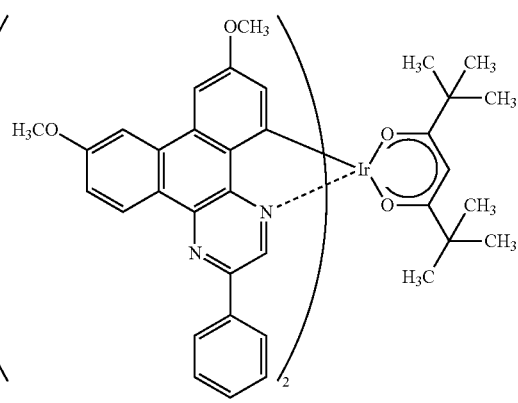
(55)
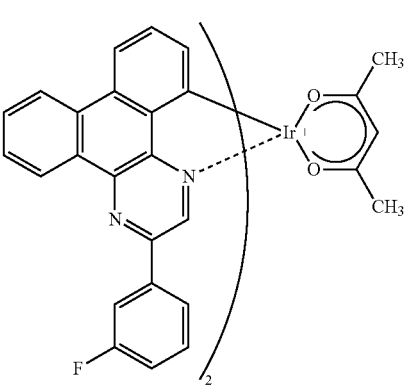

-continued

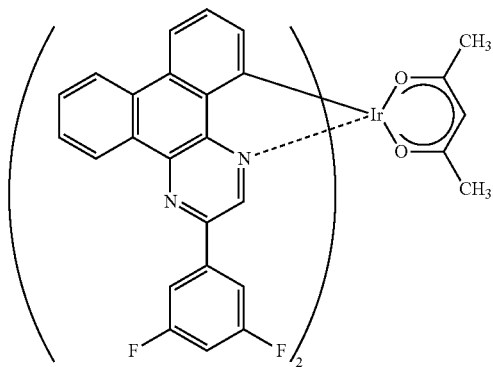
(56)

Next, a synthesis method of the dibenzo[f,h]quinoxaline-based organometallic complex of the present invention, as described above, is described.

《Synthesis Method of Dibenzo[f,h]quinoxaline Derivative Represented by General Formula (G0)》

For forming the dibenzo[f,h]quinoxaline-based organometallic complex represented by the general formula (G1) or (G5), a dibenzo[f,h]quinoxaline derivative represented by a general formula (G0) below is ortho-metalated to a metal ion of a Group 9 or Group 10 element.

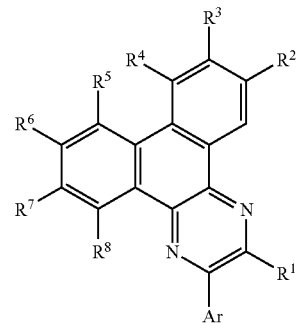
(G0-1)

In the formula, Ar represents an aryl group having 6 to 25 carbon atoms, $R^1$ represents any of an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, and any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring.

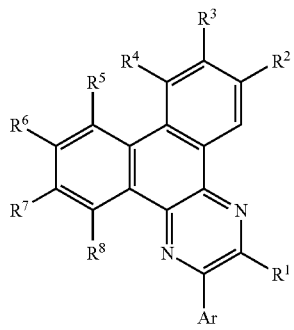
(G0)

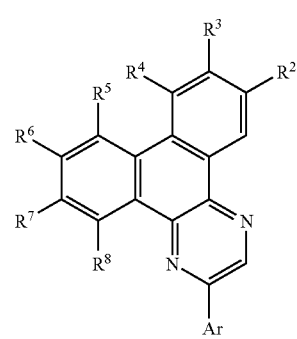
(G0-2)

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, and any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring.

Hereinafter, a synthesis method of the dibenzo[f,h]quinoxaline derivative represented by the general formula (G0) is described for two cases: where $R^1$ is any of an alkyl group having 1 to 4 carbon atoms, an alkoxy group having 1 to 4 carbon atoms, or a halogen group (case represented by a general formula (G0-1) below); and where $R^1$ is hydrogen (case represented by a general formula (G0-2) below).

In the formula, Ar represents an aryl group having 6 to 25 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, and any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring.

First, the dibenzo[f,h]quinoxaline derivative represented by the general formula (G0-1) can be synthesized by a simple synthesis scheme as shown below. For example, as shown in a scheme (a) below, the dibenzo[f,h]quinoxaline derivative represented by the general formula (G0-1) can be obtained by reacting a diamino phenanthrene compound (A1) and a diketone compound (A2).

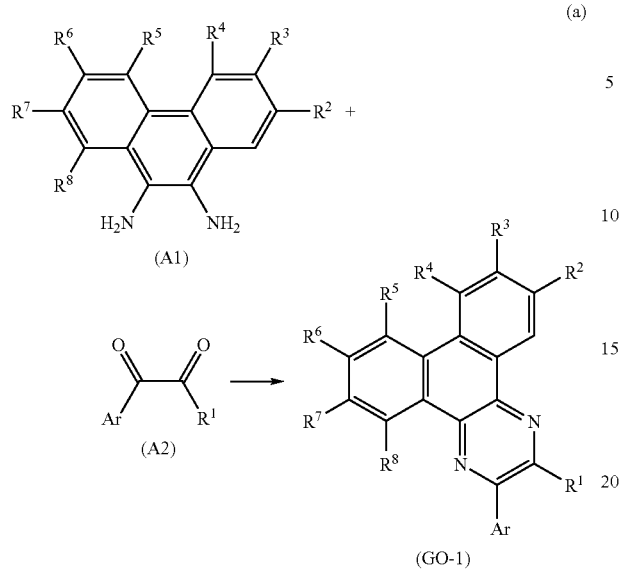

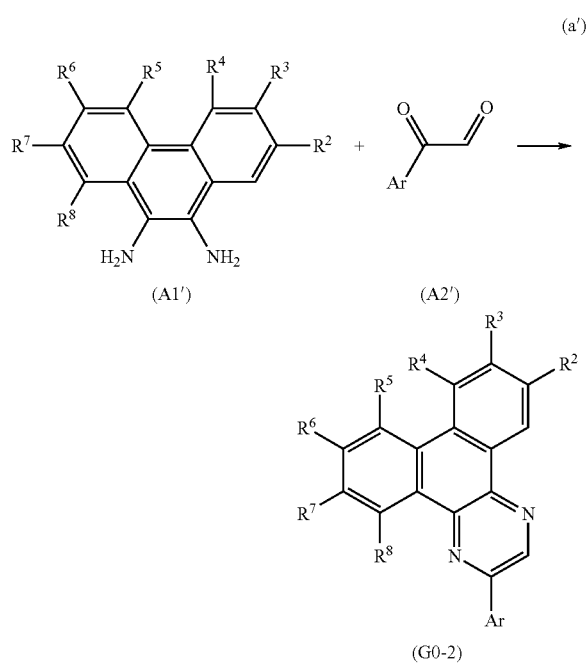

On the other hand, the dibenzo[f,h]quinoxaline derivative represented by the general formula (G0-2) can be synthesized according to a simple synthesis scheme below. For example, as shown in a scheme (a') below, the dibenzo[f,h]quinoxaline derivative represented by the general formula (G0-2) can be obtained by reacting a diamino phenanthrene compound (A1') and a diketone compound (A2'). Alternatively, as shown in a scheme (a″) below, a diketone compound (A1″) and a diamine compound (A2″) are reacted to give a dibenzo[f,h]quinoxaline derivative (G0-2'), and further, the thus obtained dibenzo[f,h]quinoxaline derivative (G0-2') and aryllithium or an aryl bromide magnesium compound (A3) are reacted, whereby the dibenzo[f,h]quinoxaline derivative represented by the general formula (G0-2) can be obtained.

As the above compounds (A1), (A2), (A1'), (A2'), (A1″), (A2″), and (A3), a variety of kinds of compounds are available commercially or can be synthesized. Therefore, there are many variations, which can be synthesized, in the dibenzo[f,h]quinoxaline derivative represented by the above-described general formula (G0).

<<Synthesis Method of Organometallic Complex Having Structure Represented by General Formula (G1)>>

Next, an organometallic complex formed by ortho-metalation of the dibenzo[f,h]quinoxaline derivative represented by the general formula (G0), that is, the organometallic complex having the structure represented by the general formula (G1) below is described.

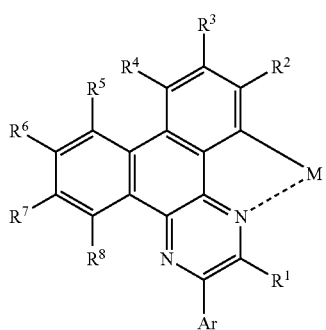

(G1)

In the formula, Ar represents an aryl group having 6 to 25 carbon atoms, R$^1$ represents any of hydrogen, an alkyl group having 1 to 4 carbon atoms, or an alkoxy group having 1 to 4 carbon atoms, R$^2$ to R$^8$ individually represent any of hydrogen, an alkyl group having 1 to 4 carbon atoms, an alkoxy group having 1 to 4 carbon atoms, an acyloxy group having 1 to 4 carbon atoms, or a halogen group, any of the alkyl groups or any of the alkoxy groups (any of pairs of R2 and R$^3$, R$^3$ and R$^4$, R$^5$ and R$^6$, R$^6$ and R$^7$, or R$^7$ and R8) may be bonded to each other to form a ring; and M is a central metal and represents a Group 9 or Group 10 element.

First, as shown in a synthesis scheme (b) below, the dibenzo[f,h]quinoxaline derivative represented by the general formula (G0) and a compound of a Group 9 or Group 10 metal, which contains halogen, (e.g., a metal halide or a metal complex) are heated in an appropriate solvent, giving a dinuclear complex (B) which is one type of organometallic complex of the present invention, which has the structure represented by the general formula (G1). As the compound of a Group 9 or Group 10 metal, which contains halogen, there are rhodium chloride hydrate, palladium chloride, iridium chloride hydrate, iridium chloride hydrochloride hydrate, potassium tetrachloroplatinate(II), and the like; however, the present invention is not limited to these examples. Note that in the synthesis scheme (b), M represents a Group 9 or Group 10 element, and X represents a halogen element. In addition, n is 2 when M is a Group 9 element, and n is 1 when M is a Group 10 element.

(b)

compound of a Group 9 or Group 10 metal containing halogen +

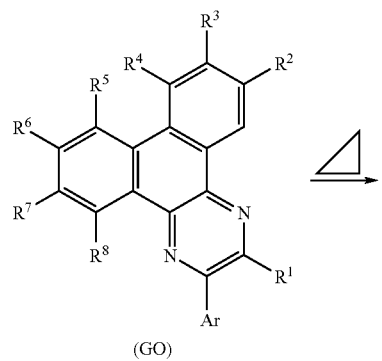

(G0)

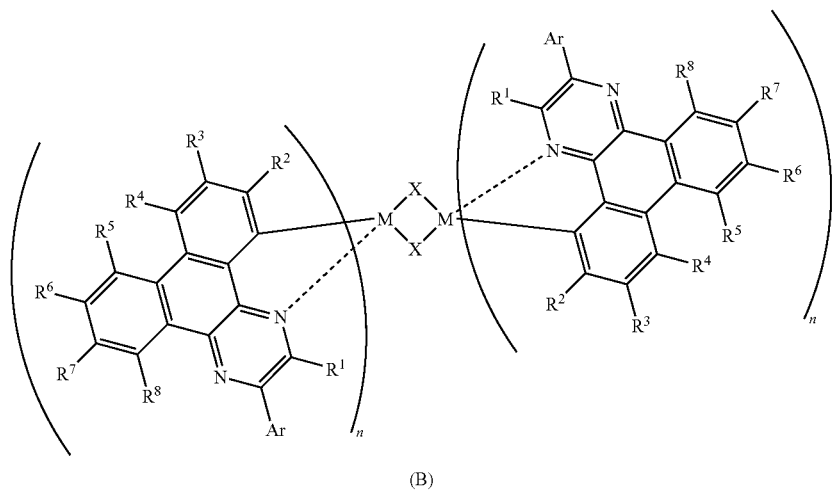

(B)

Furthermore, as shown in a synthesis scheme (c) below, the dinuclear complex (B) and the dibenzo[f,h]quinoxaline derivative represented by the general formula (G0) are heated at a high temperature of approximately 200° C. in a high boiling solvent such as glycerol, whereby one type (C) of organometallic complex of the present invention, which has the structure represented by the general formula (G1) can be obtained. Alternatively, as shown in a synthesis scheme (c') below, the dinuclear complex (B) and a compound which can be ortho-metalated, such as phenylpyridine (more generally, a compound which can be cyclo-metalated) are heated at a high temperature of approximately 200° C. in a high boiling solvent such as glycerol, whereby one type (C') of organometallic complex of the present invention, which has the structure represented by the general formula (G1) can be obtained. Note that, in the synthesis schemes (c) and (c'), M represents a Group 9 or Group 10 element and X represents a halogen element. In addition, n is 2 when M is a Group 9 element, and n is 1 when M is a Group 10 element.

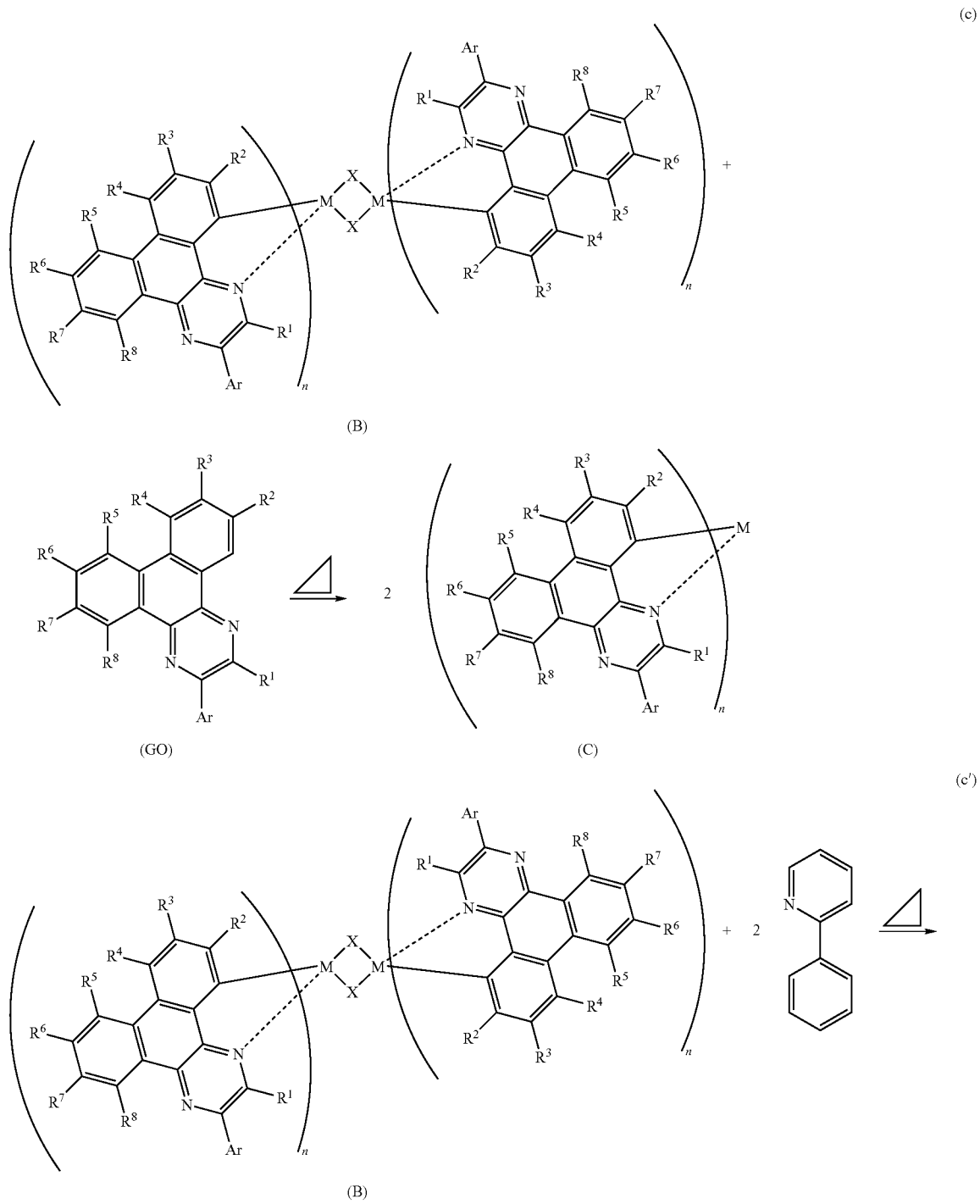

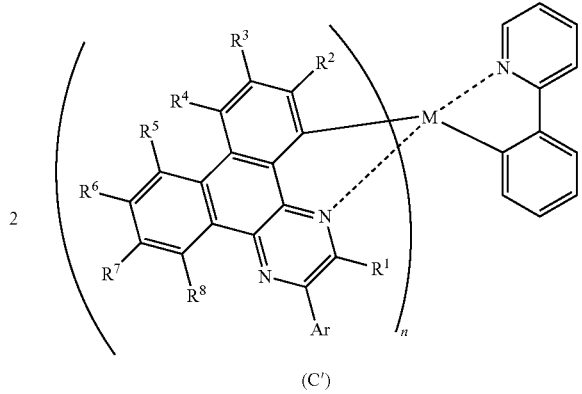

(C′)

<<Synthesis Method of Organometallic Complex Having Structure Represented by General Formula (G5)>>

Here, the organometallic complex represented by the general formula (G5) below, which is a preferable specific example of the above organometallic complex having the structure represented by the general formula (G1), is described.

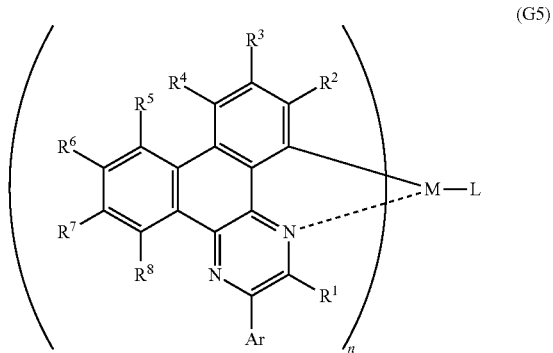

(G5)

In the formula, Ar represents an aryl group having 6 to 25 carbon atoms, $R^1$ represents any of hydrogen, an alkyl group having 1 to 4 carbon atoms, or an alkoxy group having 1 to 4 carbon atoms, $R^2$ to $R^8$ individually represent any of hydrogen, an alkyl group having 1 to 4 carbon atoms, an alkoxy group having 1 to 4 carbon atoms, an acyloxy group having 1 to 4 carbon atoms, or a halogen group, any of the alkyl groups or any of the alkoxy groups (any of pairs of $R^2$ and $R^3$, $R^3$ and $R^4$, $R^5$ and $R^6$, $R^6$ and $R^7$, or $R^7$ and $R^8$) may be bonded to each other to form a ring; M is a central metal and represents a Group 9 or Group 10 element, L represents a monoanionic ligand, n is 2 when the central metal is a Group 9 element, and n is 1 when the central metal is a Group 10 element.

The organometallic complex of the present invention, which is represented by the above general formula (G5), can be synthesized according to a synthesis scheme (c″) below. In other words, the dinuclear complex (B) obtained by the above synthesis scheme (b) and HL that is a material of a monoanionic ligand L are reacted, whereby a proton of HL is eliminated to be coordinated to the central metal M, giving the organometallic complex of the present invention, which is represented by the general formula (G5). Note that, in the synthesis scheme (c″), M represents a Group 9 or Group 10 element and X represents a halogen element. In addition, n is 2 when M is a Group 9 element, and n is 1 when M is a Group 10 element.

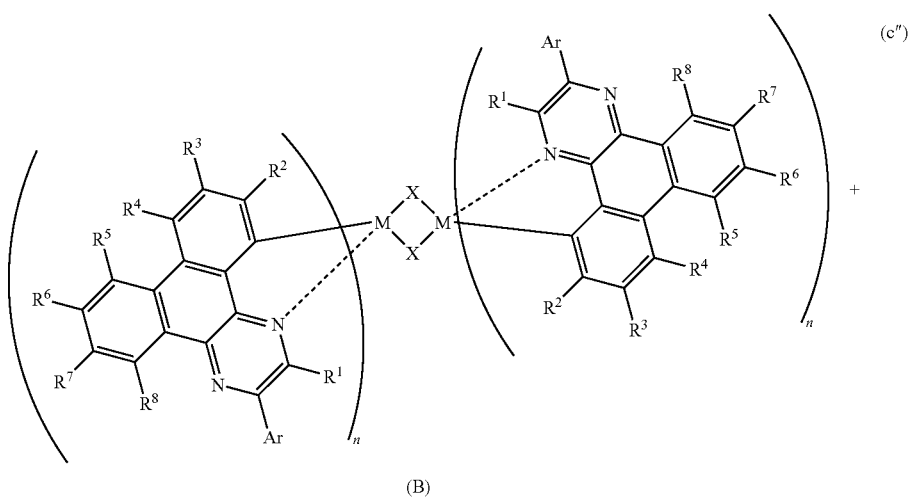

(c″)

(B)

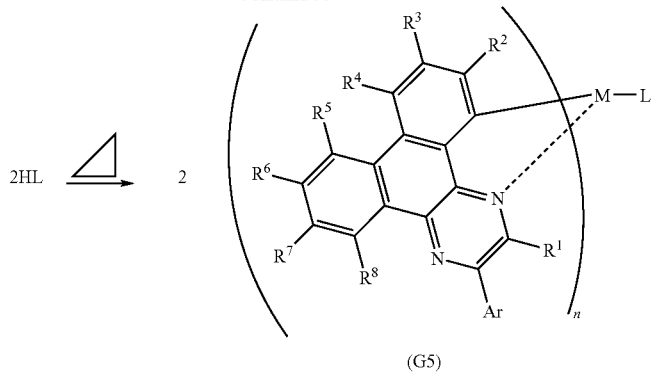

(G5)

As described above, the dibenzo[f,h]quinoxaline-based organometallic complex used for the light-emitting element of the present invention can be synthesized.

(Embodiment Mode 4)

In Embodiment Mode 4, an image display device is described as an example of a light-emitting device having the light-emitting element of the present invention.

Figure 6A:
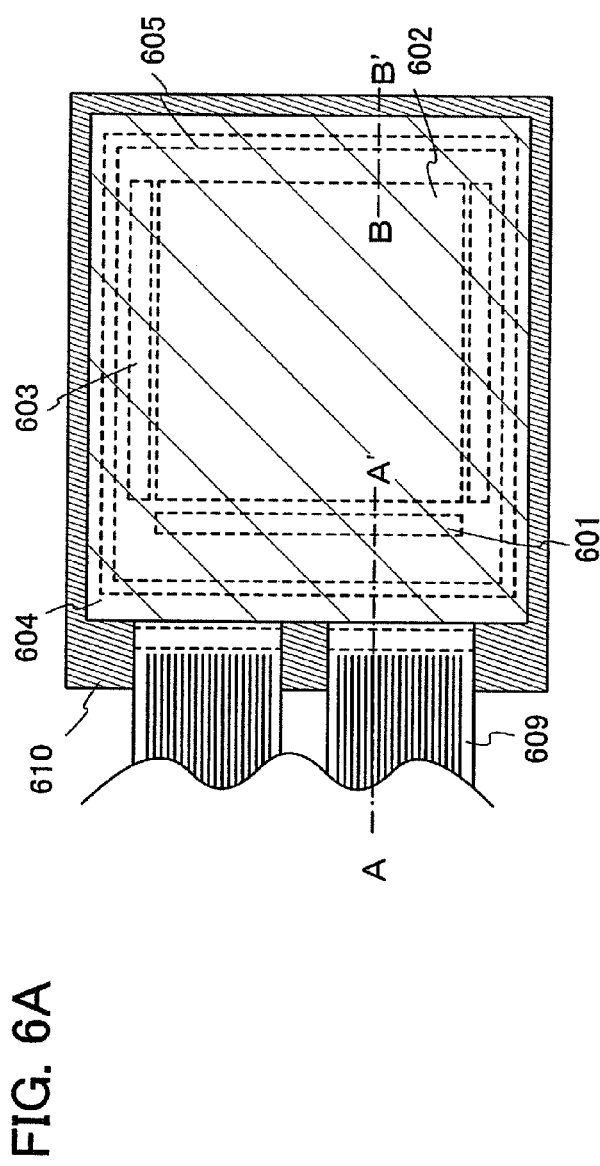
FIGS. 6A and 6B illustrate a light-emitting device using a light-emitting element according to an aspect of the present invention.
Figure 6B:
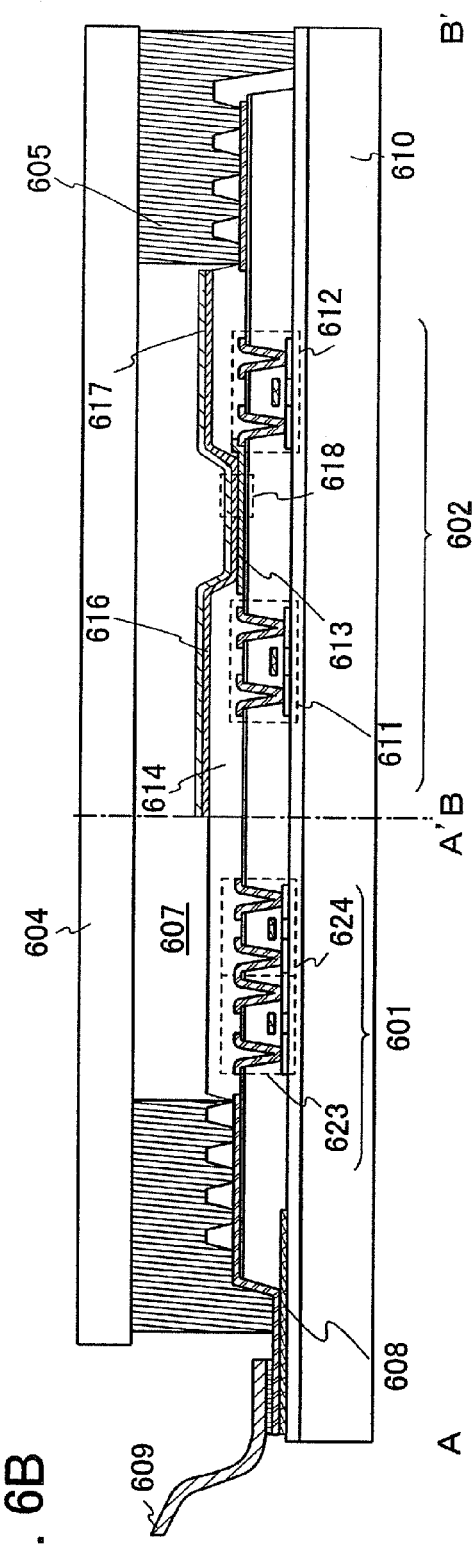

In this embodiment mode, an image display device having the light-emitting element of the present invention in a pixel portion is described using FIGS. 6A and 6B. Note that FIG. 6A is a top view illustrating a light-emitting device while FIG. 6B is a cross-sectional view taken along lines A-A' and B-B' of FIG. 6A. This image display device includes a driver circuit portion (a source-side driver circuit) 601, a pixel portion 602, and a driver circuit portion (a gate-side driver circuit) 603 which are shown with dotted lines, for controlling light emission from the light-emitting element. Further, reference numeral 604 indicates a sealing substrate and reference numeral 605 indicates a sealing material. A portion surrounded by the sealing material 605 is a space 607.

Note that a leading wiring 608 is a wiring for transmitting signals input in the source-side driver circuit 601 and the gate-side driver circuit 603 and receives a video signal, a clock signal, a start signal, a reset signal, and the like from a flexible printed circuits (an FPC) 609 that serves as an external input terminal. Note that although only the FPC is illustrated here, this FPC may be provided with a printed wiring board (a PWB). Note that the light-emitting device in this specification includes not only a light-emitting device itself but also a light-emitting device to which an FPC or a PWB is attached.

Next, a cross-sectional structure is described using FIG. 6B. Although the driver circuit portions and the pixel portions are provided over an element substrate 610, only the source-side driver circuit 601, which is the driver circuit portion, and one pixel of the pixel portion 602 are illustrated here.

Note that a CMOS circuit, which is a combination of an n-channel TFT 623 and a p-channel TFT 624, is formed as the source-side driver circuit 601. Further, a TFT for forming the driver circuit may be any of various circuits such as a known CMOS circuit, a PMOS circuit, or an NMOS circuit. Further, although a driver-integrated type structure in which a driver circuit is formed over a substrate is described in this embodiment mode, a driver circuit is not necessarily formed over a substrate but can be formed externally from a substrate.

Further, the pixel portion 602 is formed of a plurality of pixels each including a switching TFT 611, a current control TFT 612, and a first electrode 613 which is electrically connected to a drain of the current control TFT 612. Note that an insulator 614 is formed to cover an end portion of the first electrode 613. Here, the insulator 614 is formed using a positive photosensitive acrylic resin film.

Further, in order to improve the coverage, the insulator 614 is provided so as to have a curved surface with curvature at an upper end portion or a lower end portion of the insulator 614. For example, when positive type photosensitive acrylic is used as a material of the insulator 614, the insulator 614 is preferably formed to have a curved surface with a curvature radius (0.2 μm to 3 μm) only at the upper end portion. Further, for the insulator 614, either a negative type material that becomes insoluble in an etchant by light irradiation or a positive type material that becomes soluble in an etchant by light irradiation can be used.

Over the first electrode 613, a layer 616 including a light-emitting layer and a second electrode 617 are formed. Here, as a material used for the first electrode 613, any of a variety of metals, alloys, or electroconductive compounds, or a mixture thereof can be used. When the first electrode 613 is used as an anode, among the above materials, it is preferable to use any of metals, alloys, or electroconductive compounds, a mixture thereof, or the like having a high work function (a work function of 4.0 eV or more).

For example, it is possible to use a single layer film of an indium oxide-tin oxide film containing silicon, an indium oxide-zinc oxide film, a titanium nitride film, a chromium film, a tungsten film, a Zn film, a Pt film, or the like; a stack of a titanium nitride film and a film containing aluminum as the main component; a three-layer structure of a titanium nitride film, a film containing aluminum as the main component, and a titanium nitride film; or the like. Note that when a stacked structure is employed, resistance as a wiring is low, a good ohmic contact is formed, and further the first electrode 613 can be made to function as an anode.

Further, the layer 616 including the light-emitting layer is formed by any of a variety of methods such as an evaporation method using an evaporation mask, an inkjet method, a spin coating method, or the like. The layer 616 including the light-emitting layer has the light-emitting layer described in any of Embodiment Modes 1 to 3. Further, a material used for the layer 616 including the light-emitting layer may be a low molecular material, a medium molecular material (the category includes an oligomer and a dendrimer) having an intermediate property between a high molecular material and a low molecular material, or a high molecular material. Alternatively, as the material for the layer including the light-emitting layer, not only an organic compound but also an inorganic compound may be used.

Further, as a material used for the second electrode 617, any of a variety of metals, alloys, or electroconductive compounds, or a mixture thereof can be used. When the second electrode 617 is used as a cathode, among the above materials, it is preferable to use any of metals, alloys, or electroconductive compounds, a mixture thereof, or the like having a low work function (a work function of 3.8 eV or less). For example, elements belonging to Group 1 and 2 of the periodic table, that is, alkali metals such a lithium (Li) and cesium (Cs) and alkaline earth metals such as magnesium (Mg), calcium (Ca), and strontium (Sr); alloys thereof (e.g., MgAg or AlLi); and the like are given.

Note that when light generated in the layer 616 including the light-emitting layer is transmitted through the second electrode 617, for the second electrode 617, a stack of a metal thin film with a reduced thickness and a transparent conductive film (indium oxide-tin oxide (ITO), indium oxide-tin oxide containing silicon or silicon oxide, indium oxide-zinc oxide (IZO), indium oxide containing tungsten oxide and zinc oxide (IWZO), etc.) can also be used.

Furthermore, a structure is provided in which the sealing substrate 604 is attached using the sealant 605 to the element substrate 610 so that the light-emitting element 618 is provided in the space 607 surrounded by the element substrate 610, the sealing substrate 604, and the sealant 605. Note that the space 607 is filled with a filler. There are cases where the space 607 is filled with an inert gas (nitrogen, argon, or the like), and where the space 607 may be filled with the sealant 605.

Note that an epoxy-based resin is preferably used for the sealant 605. Further, it is preferable that these materials hardly transmit water or oxygen. Further, as the sealing substrate 604, instead of a glass substrate or a quartz substrate, a plastic substrate formed of fiberglass-reinforced plastic (FRP), polyvinyl fluoride (PVF), polyester, acrylic, or the like can be used.

As described above, an active matrix light-emitting device having the light-emitting element of the present invention can be obtained.

Figure 7A:
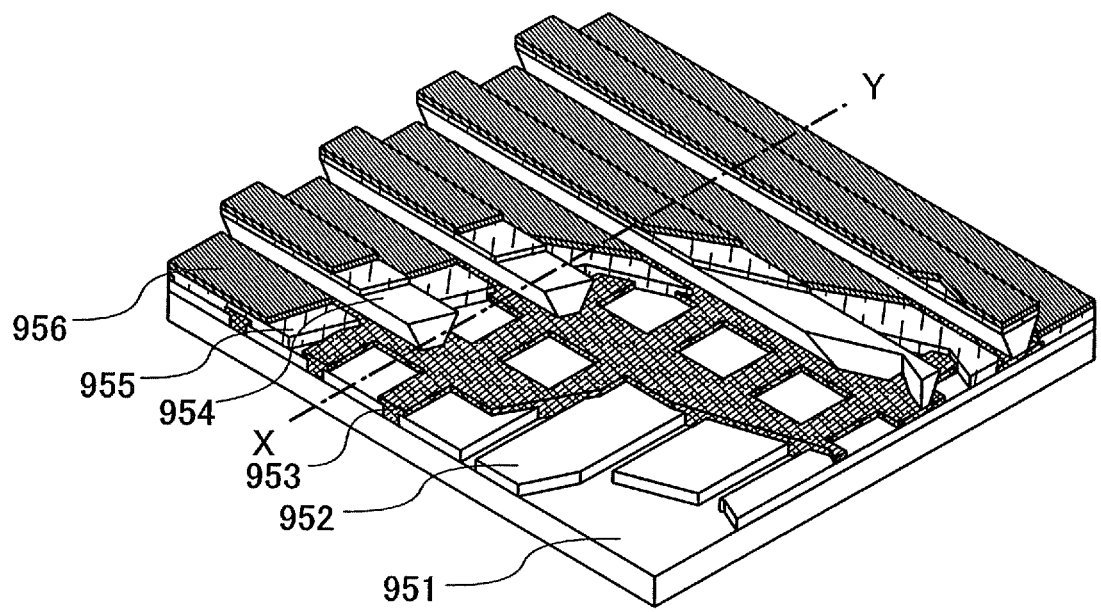
FIGS. 7A and 7B illustrate a light-emitting device according to an aspect of the present invention.
Figure 7B:
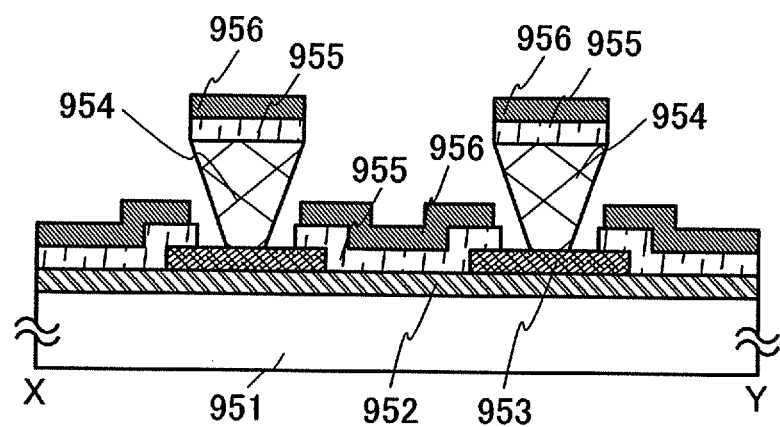

Although the active matrix type image display device in which the driving of the light-emitting element is controlled by transistors has been described so far, the image display device may be of a passive type in which the light-emitting element is driven without particularly providing elements for driving, such as transistors. FIGS. 7A and 7B are a perspective view and a cross-sectional view of a passive matrix light-emitting device using the light-emitting element of the present invention. In FIGS. 7A and 7B, a layer 955 including the light-emitting layer is provided between an electrode 952 and an electrode 956 over a substrate 951. An end portion of the electrode 952 is covered by an insulating layer 953. In addition, a partition layer 954 is provided over the insulating layer 953. Sidewalls of the partition layer 954 have a slant such that a distance between one sidewall and the other sidewall becomes narrower as the sidewalls gets closer to a surface of the substrate. In other words, a cross section taken in the direction of a shorter side of the partition layer 954 has a trapezoidal shape, and the base of the trapezoid (a side of the trapezoid which is parallel to the surface of the insulating layer 953 and is in contact with the insulating layer 953) is shorter than the upper side of the trapezoid (a side of the trapezoid which is parallel to the surface of the insulating layer 953 and is not in contact with the insulating layer 953). The provision of the partition layer 954 in this manner can prevent the light-emitting element from being defective due to static electricity or the like.

As described above, since the image display device of the present invention described in Embodiment Mode 4 has the light-emitting element of the present invention described in any of Embodiment Modes 1 to 3, the image display device has high emission efficiency and long lifetime. Thus, the image display device using a light-emitting element of the present invention consumes low power and has long lifetime.

Note that Embodiment Mode 4 can be combined with any other embodiment mode as appropriate.

(Embodiment Mode 5)

Since the light-emitting element of the present invention has high emission efficiency and long lifetime, the light-emitting element of the present invention can be used for a lighting apparatus, which is an example of light-emitting devices. Accordingly, in Embodiment Mode 5, an application example of a lighting apparatus using the light-emitting element of the present invention is described.

Figure 4A:
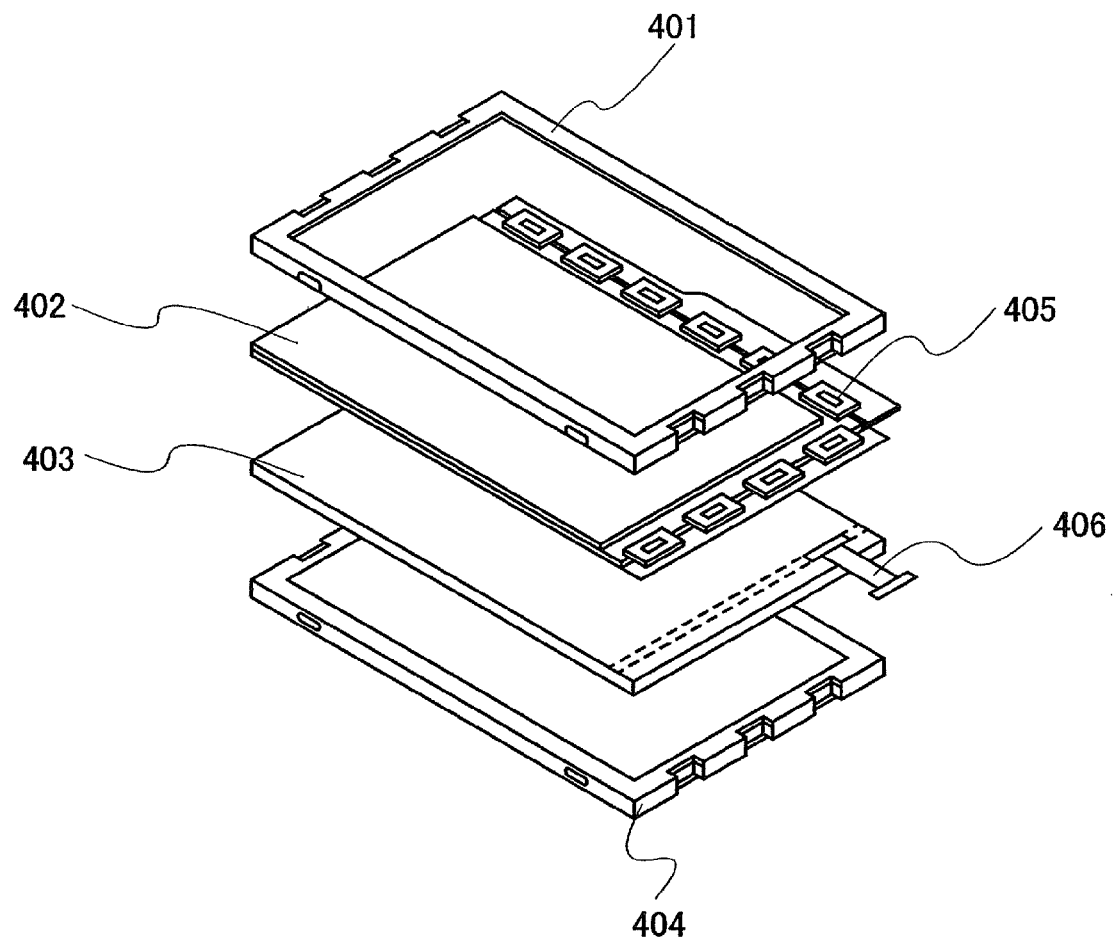
FIGS. 4A and 4B each illustrate a lighting apparatus using a light-emitting element according to an aspect of the present invention.

FIG. 4A illustrates an example of a liquid crystal display device in which the light-emitting element of the present invention is used as a backlight. The liquid crystal display device illustrated in FIG. 4A includes a housing 401, a liquid crystal layer 402, a backlight 403, and a housing 404. The liquid crystal layer 402 is connected to a driver IC 405. Further, the light-emitting element of the present invention is used for the backlight 403, and a current is supplied to the backlight 403 through a terminal 406.

By using the light-emitting element of the present invention as the backlight of the liquid crystal display device, the backlight having high emission efficiency and long lifetime can be obtained. In addition, the backlight with long lifetime can be achieved. Moreover, since a backlight using the light-emitting element of the present invention is a lighting apparatus of plane light emission and can be formed in a large area, the backlight can be made larger and the liquid crystal display device can also have a larger area. Furthermore, since the light-emitting device is thin and consumes low power, a reduction in the thickness and power consumption of the display device is possible.

Figure 4B:
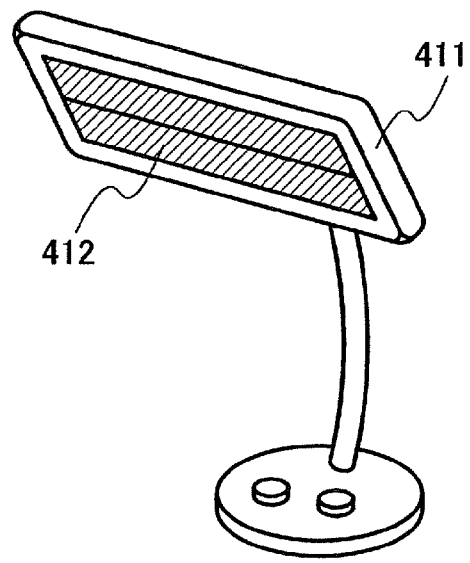

FIG. 4B illustrates an example in which a lighting apparatus using the light-emitting element of the present invention is used as a light source of a desk lamp. The desk lamp illustrated in FIG. 4B includes a housing 411 and a light source 412. As the light source 412, the light-emitting element of the present invention is used. Since the light-emitting element of the present invention has long lifetime, the desk lamp can also have long lifetime.

The lighting apparatus of the present invention, which is described in Embodiment Mode 5, has the light-emitting element of the present invention described in Embodiment Modes 1 to 3. Thus, the lighting apparatus has high emission efficiency and long lifetime. Therefore, the lighting apparatus using the light-emitting element of the present invention consumes low power and has long lifetime.

(Embodiment Mode 6)

An image display device of the present invention, as described in Embodiment Mode 4, can display an excellent image. Therefore, by applying the image display device of the present invention to display portions of electronic devices, electronic devices that are capable of providing an excellent image can be obtained. In addition, the image display device or the lighting apparatus (i.e., a light-emitting device) including the light-emitting element of the present invention consumes low power and has long lifetime. Therefore, by applying the light-emitting device of the present invention to the display portions of the electronic devices, electronic devices with low power consumption can be obtained. For example, a telephone or the like that has long battery standing time, and the like can be obtained. Hereinafter, an example of an electronic device provided with the light-emitting device to which the light-emitting element of the present invention is applied is described.

Figure 5A:
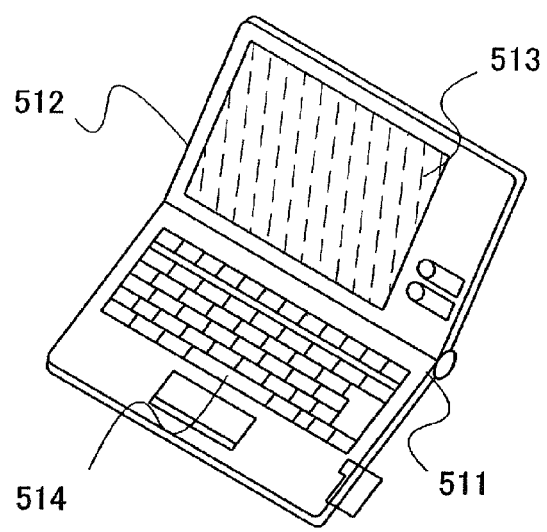
FIGS. 5A to 5C each illustrate an electronic device using a light-emitting device using a light-emitting element according to an aspect of the present invention.

FIG. 5A illustrates a computer manufactured by applying the present invention, which includes a main body 511, a casing 512, a display portion 513, a keyboard 514, and the like. By incorporating a light-emitting device having the light-emitting element of the present invention into the display portion, the computer can be completed.

Figure 5B:
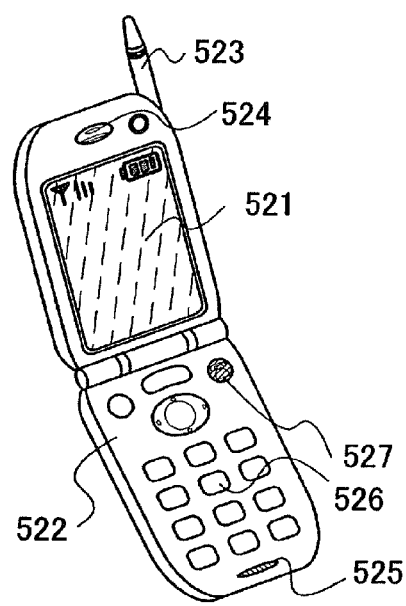

FIG. 5B illustrates a telephone manufactured by applying the present invention, in which a main body 522 includes a display portion 521, an audio output portion 524, an audio input portion 525, operation switches 526 and 527, an antenna 523, and the like. By incorporating a light-emitting device having the light-emitting element of the present invention into the display portion, the telephone can be completed.

Figure 5C:
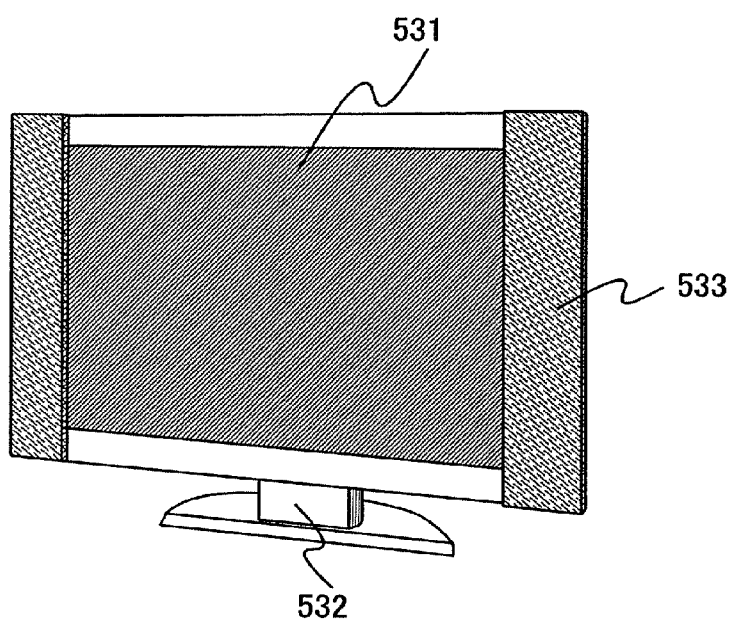

FIG. 5C illustrates a television set manufactured by applying the present invention, which includes a display portion 531, a casing 532, a speaker 533, and the like. By incorporating a light-emitting device having the light-emitting element of the present invention into the display portion, the television set can be completed.

As described above, the light-emitting device of the present invention is extremely suitable for use as a display portion of various kinds of electronic devices.

Note that although the computer and the like are described in Embodiment Mode 6, the light-emitting device including the light-emitting element of the present invention may also be mounted on a navigation system, lighting equipment, or the like.

EXAMPLE 1

In Example 1, the electron-trapping property of an organometallic complex which can be used for the light-emitting element of the present invention, that is, an organometallic complex (a dibenzo[f,h]quinoxaline-based organometallic complex) in which a ligand has a dibenzo[f,h]quinoxaline skeleton and a central metal is a Group 9 or Group 10 element was evaluated.

For the evaluation, the reduction reaction characteristics of the dibenzo[f,h]quinoxaline-based organometallic complex were measured by cyclic voltammetry (CV) measurement, and from the evaluation results, the LUMO level was obtained. Further, the LUMO level of a substance which is generally used as a host material was also obtained in a similar manner and then compared to the LUMO level of the dibenzo[f,h]quinoxaline-based organometallic complex. Note that for the measurements, an electrochemical analyzer (ALS model 600A or 600C, product of BAS Inc.) was used.

As a solution used for the CV measurement, dehydrated dimethylformamide (DMF, product of Sigma-Aldrich Inc., 99.8%, Catalog No. 22705-6) was used as a solvent, and tetra-n-butylammonium perchlorate (n-Bu$_4$NClO$_4$, product of Tokyo Chemical Industry Co., Ltd., Catalog No. T0836), which was a supporting electrolyte, was dissolved in the solvent such that the concentration of tetra-n-butylammonium perchlorate was 100 mmol/L. Further, the measurement object was also dissolved such that the concentration thereof was 2 mmol/L. Further, as a working electrode, a platinum electrode (a PTE platinum electrode, produced by BAS Inc.) was used. As an auxiliary electrode, a platinum electrode (a VC-3 Pt counter electrode (5 cm), produced by BAS Inc.) was used. As a reference electrode, an Ag/Ag$^+$ electrode (an RE7 nonaqueous solvent reference electrode, produced by BAS Inc.) was used. Note that the measurements were conducted at room temperature (20° C. to 25° C.). Further, the scan speed during the CV measurement was fixed at 0.1 V/sec.

(Calculation of Potential Energy of Reference Electrode with Respect to Vacuum Level)

First, the potential energy (eV) of the reference electrode (an Ag/Ag$^+$ electrode) used in this example with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). On the other hand, by using the reference electrode used in this example, the oxidation-reduction potential of ferrocene in methanol was calculated to be +0.11 [V vs. Ag/Ag$^+$]. Therefore, it was found that the potential energy of the reference electrode used in Example 1 was lower than that of the standard hydrogen electrode by 0.50 [eV].

Here, it is known that the potential energy of the standard hydrogen electrode with respect to the vacuum level is −4.44 eV (Reference: Toshihiro Ohnishi and Tamami Koyama, High Molecular EL Material, Kyoritsu Shuppan, pp. 64-67). Accordingly, the potential energy of the reference electrode used in this example with respect to the vacuum level could be determined as follows: −4.44−0.50=−4.94 [eV].

(Measurement Example: Structural Formula (1))

Figure 16:
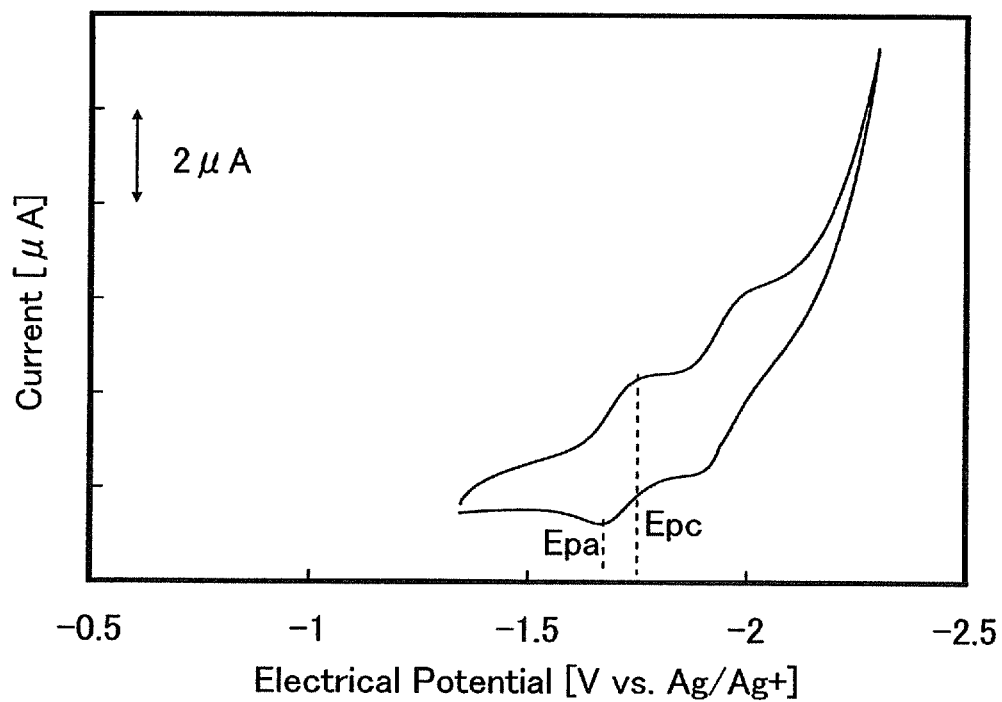
FIG. 16 shows a CV curve obtained by measurements in Example 1.

First, in this measurement example, the calculation of the LUMO level by CV measurement is described in detail taking Ir(dbq-P)$_2$(acac) represented by a structural formula (1) as an example. FIG. 16 shows CV measurement results of reduction reaction characteristics. Note that the measurements of the reduction reaction characteristics were performed by scanning the potential of the working electrode with respect to the reference electrode in the ranges of −1.35 V to −2.30 V and then −2.30 V to −1.35 V.

As shown in FIG. 16, a reduction peak potential $E_{pc}$ was −1.78 V. Further, an oxidation peak potential $E_{pa}$ was −1.67V Accordingly, a half-wave potential (an intermediate potential between $E_{pc}$ and $E_{pa}$) can be calculated to be −1.72 V. This shows that Ir(dbq-P)$_2$(acac) is reduced by an electric energy of −1.72 [V vs. Ag/Ag$^+$], and this energy corresponds to the LUMO level. Here, as described above, the potential energy of the reference electrode used in Example 1 with respect to the vacuum level is −4.94 [eV]. Therefore, the LUMO level of the dibenzo[f,h]quinoxaline-based organometallic complex represented by the structural formula (1) can be calculated as follows: −4.94−(−1.72)=−3.22 [eV].

(Summary of Measurement Results)

In a similar manner, the LUMO level of the dibenzo[f,h]quinoxaline-based organometallic complex described in Embodiment Mode 3 was measured. Further, the LUMO level of BAlq (represented by a structural formula (i) below), which is an electron-transporting compound broadly used as a host material for a red phosphorescent compound, was also evaluated for reference.

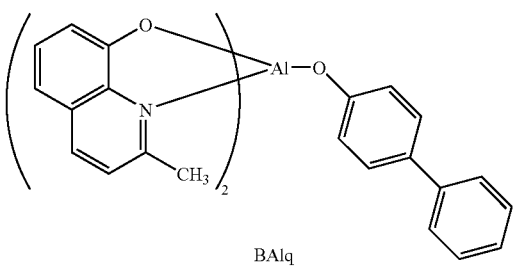

BAlq

The results are summarized in Table 1 below. As seen from Table 1, the dibenzo[f,h]quinoxaline-based organometallic complexes have deeper LUMO levels, which are deeper than −2.7 eV. Further, it is found that the LUMO levels of these dibenzo[f,h]quinoxaline-based organometallic complexes are deeper than that of BAlq. Therefore, from the results of this Example 1, it is shown that the dibenzo[f,h]quinoxaline-based organometallic complex used in the present invention has a relatively high electron-trapping property.

TABLE 1

| Structural Formula No. | Substance (Abbreviation) | $E_{1/2}$ [V vs. Ag/Ag$^+$] | LUMO Level [eV] |
|---|---|---|---|
| (1) | Ir(dbq-P)$_2$(acac) | −1.72 | −3.22 |
| (55) | Ir(dbq-3FP)$_2$(acac) | −1.65 | −3.29 |
| (i) | BAlq | −2.32 | −2.62 |

EXAMPLE 2

In Example 2, the light-emitting element of the present invention is specifically exemplified with reference to comparative examples. Note that molecular structures of substances used in this example are shown in (ii) and (iii) below. In addition, FIG. 3 illustrates a structure of the element.

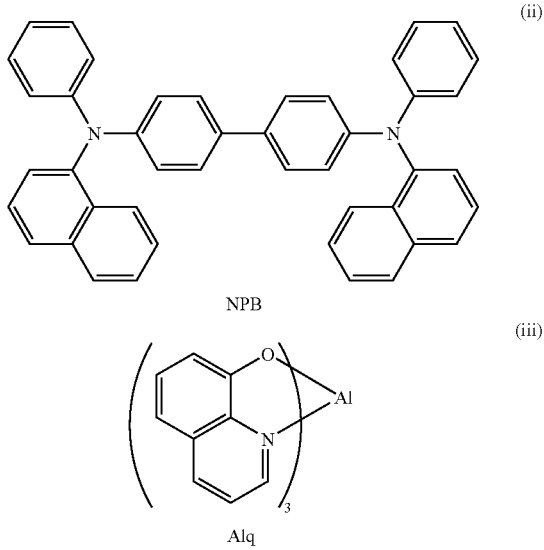

NPB

Alq

《 Manufacture of Light-Emitting Element 1 and Light-Emitting Element 2 》

First, a glass substrate over which indium tin silicon oxide (ITSO) was deposited to a thickness of 110 nm as an anode was prepared. The periphery of a surface of the ITSO was covered with a polyimide film so that an area of 2 mm by 2 mm of the surface was exposed. The electrode area was set to be 2 mm by 2 mm. As a pretreatment for forming the light-emitting element over this substrate, the surface of the substrate was washed with water, and baked at 200° C. for one hour, then, a UV ozone treatment was conducted for 370 seconds. Then, the substrate was transferred into a vacuum evaporation apparatus in which the pressure was reduced to about 10$^{-4}$ Pa, and vacuum baking at 170° C. for 30 minutes was conducted in a heating chamber of the vacuum evaporation apparatus, and then the substrate was cooled down for about 30 minutes.

Next, the substrate was fixed on a holder provided in the vacuum evaporation apparatus such that the surface of the substrate provided with ITSO faced downward.

After the pressure in the vacuum evaporation apparatus was reduced to 10$^{-4}$ Pa, NPB represented by the structural formula (i) and molybdenum(VI) oxide were co-evaporated such that the weight ratio of NPB to molybdenum (VI) oxide was 4:1, thereby forming the hole-injecting layer 311. The thickness of the hole-injecting layer 311 was set to be 50 nm. Note that the co-evaporation is an evaporation method in which a plurality of different substances is vaporized from different evaporation sources at the same time. Next, NPB was evaporated to be 10 nm thick to form the hole-transporting layer 312.

Furthermore, over the hole-transporting layer 312, the light-emitting layer 313 having a thickness of 50 nm was formed. A light-emitting element 1 is the light-emitting element of the present invention, in which NPB is used as the first organic compound, BAlq represented by the structural formula (i) in Example 1 is used as the second organic compound, and Ir(dpq-P)$_2$(acac) represented by the structural formula (1) in Embodiment Mode 3 is used as the dibenzo[f,h]quinoxaline-based organic compound.

For the light-emitting element 1, these materials were co-evaporated so that the weight ratio of NPB:BAlq:Ir(dpq-P)$_2$(acac) was 0.05:1:0.06, thereby forming the light-emitting layer 313. On the other hand, for a light-emitting element 2 which is a comparative light-emitting element, only BAlq is used as a host material without use of NPB. For the light-emitting element 2, these materials were co-evaporated so that the weight ratio of BAlq:Ir(dpq-P)$_2$(acac) was 1:0.06, thereby forming the light-emitting layer 313.

Next, Alq represented by the structural formula (iii) was evaporated to a thickness of 30 nm, whereby the electron-transporting layer 314 was formed. Furthermore, lithium fluoride was deposited over the electron-transporting layer 314 to a thickness of 1 nm to form the electron-injecting layer 315. Lastly, aluminum was deposited to a thickness of 200 nm to form the second electrode 302 serving as a cathode. Accordingly, the light-emitting elements 1 and 2 were manufactured. Note that, for each of the above evaporation processes, a resistive heating method was used.

《 Operation Characteristics of Light-Emitting Element 1 and Light-Emitting Element 2 》

Sealing was performed in a glove box under a nitrogen atmosphere so that the thus obtained light-emitting elements 1 and 2 were not exposed to the atmosphere, and then the operation characteristics of these light-emitting elements were measured. Note that the measurements were performed at room temperature (in an atmosphere kept at 25° C.).

Figure 8A:
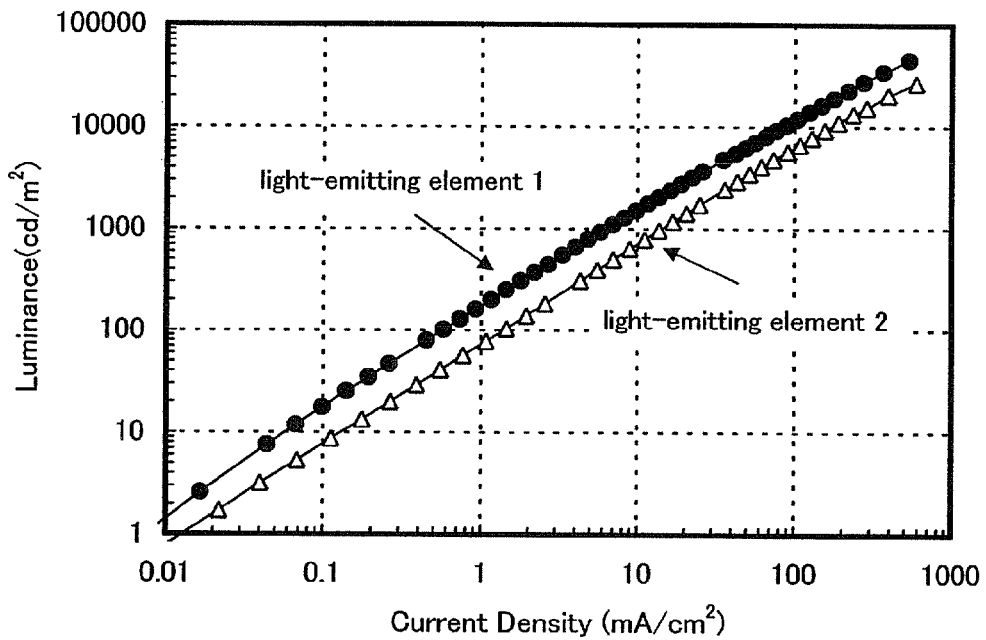
FIGS. 8A and 8B show the characteristics of a light-emitting element 1 and a comparative light-emitting element 2.
Figure 8B:
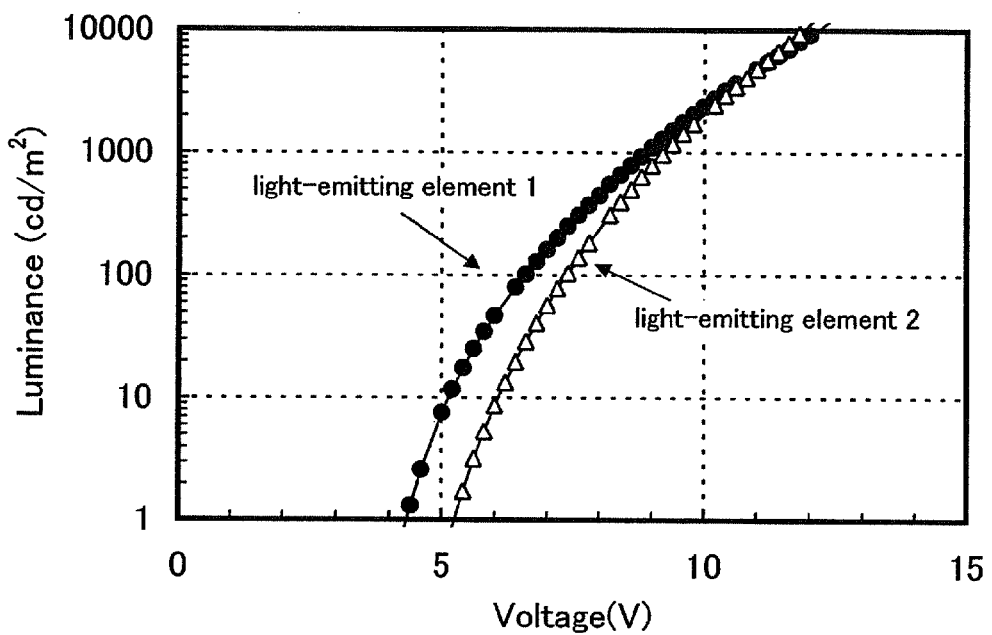
Figure 9:
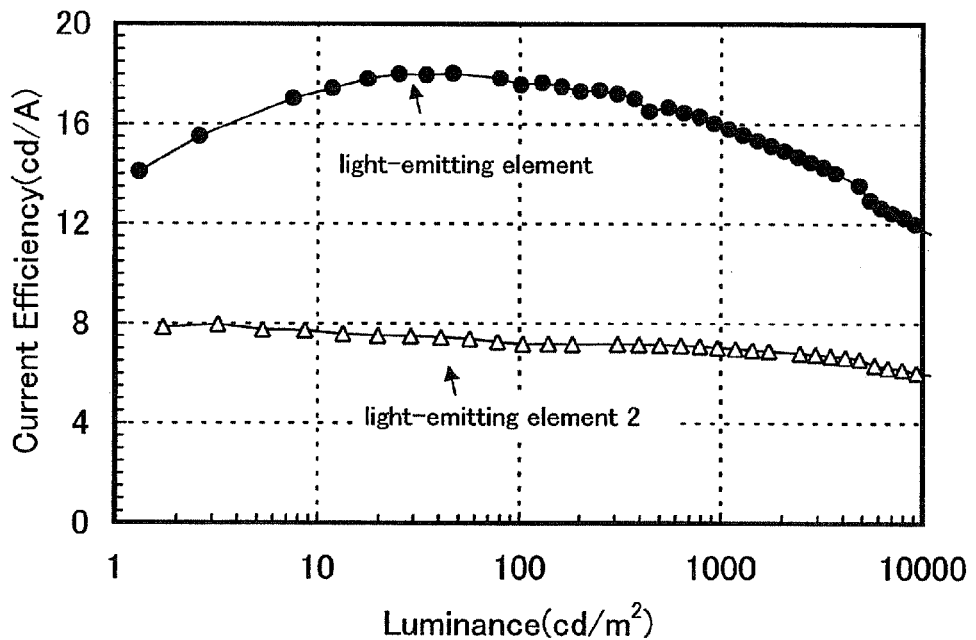
FIG. 9 shows the characteristics of the light-emitting element 1 and the comparative light-emitting element 2.
Figure 10:
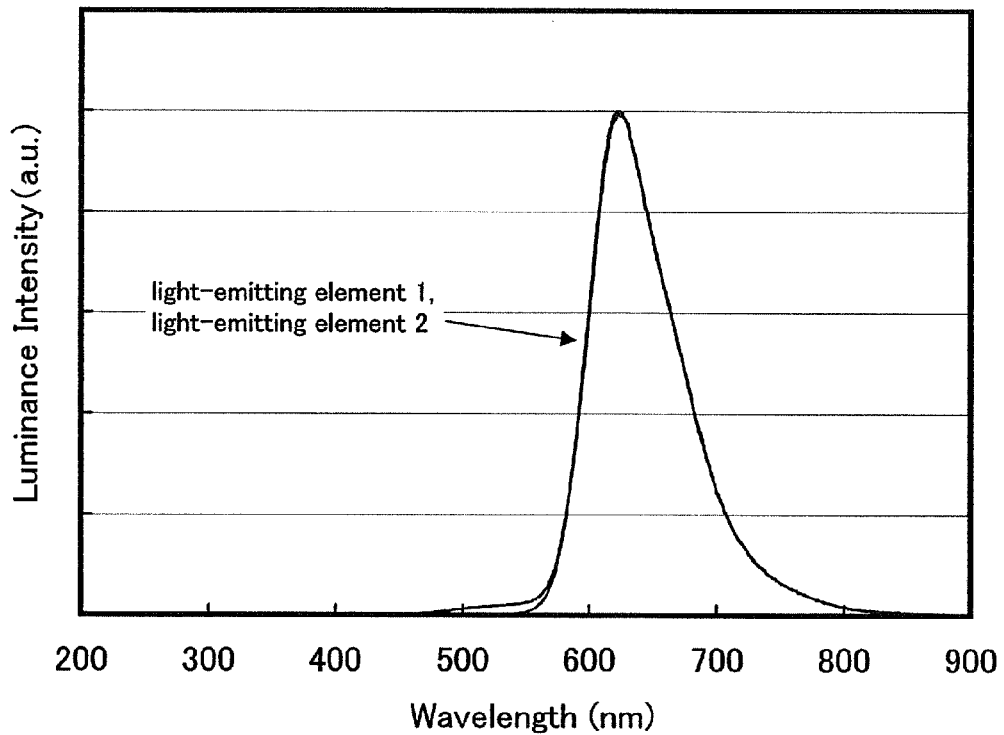
FIG. 10 shows emission spectra of the light-emitting element 1 and the comparative light-emitting element 2.

The current density vs. luminance characteristics of the light-emitting elements are shown in FIG. 8A, and the voltage vs. luminance characteristics thereof are shown in FIG. 8B. In addition, the luminance vs. current efficiency characteristics of the light-emitting elements are shown in FIG. 9. In addition, the emission spectra of the light-emitting elements are shown in FIG. 10. The emission spectra of the light-emitting elements were almost the same, and the color of emission was red derived from Ir(dbq-P)$_2$(acac).

As apparent from FIG. 9, the current efficiency of the light-emitting element 2 which is the comparative light-emitting element is extremely low, that is, less than or equal to half that of the light-emitting element 1 of the present invention. The light-emitting element 2 is in the state illustrated in FIG. 2B in Embodiment Mode 1. Since Ir(dbq-P)$_2$(acac) having a high electron-trapping property is added into BAlq which is an electron-transporting compound, it is considered that the carrier balance is bad and the current efficiency is decreased. In addition, as apparent from FIG. 8B, driving voltage is high.

On the other hand, as apparent from FIG. 9, the light-emitting element 1 of the present invention exhibited high emission efficiency.

Figure 11:
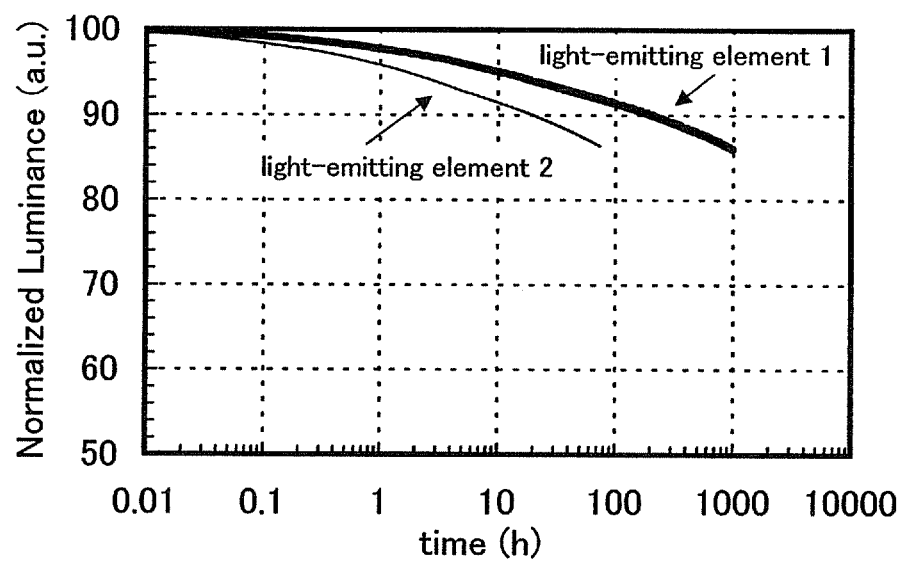
FIG. 11 shows luminance degradation curves of the light-emitting element 1 and the comparative light-emitting element 2.

Next, the initial luminance was set at 1000 cd/m$^2$, and these elements were driven at the constant current density, whereby luminance degradation curves as shown in FIG. 11 were obtained. In FIG. 11, the horizontal axis represents time and the vertical axis represents relative luminance (%) when the initial luminance is 100. As apparent from FIG. 11, the light-emitting element of the present invention also has greatly improved lifetime.

Here, the comparison of characteristics and lifetime at 1000 cd/m$^2$ is shown in Table 2 below. Note that as apparent from FIG. 11, since it can be expected that it takes 100,000 hours or more for the light-emitting element 1 to reach the luminance half-life period, the lifetimes of the elements were compared, in terms of the period until which the luminance was reduced by 10%.

TABLE 2

(Characteristics in Example 2)

| | Voltage [V] | Current Efficiency [cd/A] | External Quantum Efficiency [%] | Power Efficiency [lm/W] | 10% Luminance Reduction Time [hr] |
|---|---|---|---|---|---|
| Light-Emitting Element 1 | 8.8 | 16 | 14 | 5.7 | 201 |
| Light-Emitting Element 2 | 9.2 | 7 | 6.0 | 2.4 | 19.8 |

First, as apparent from Table 2, the current efficiency, external quantum efficiency, and power efficiency of the light-emitting element 2 using only BAlq as the host material were extremely low, whereas the current efficiency, external quantum efficiency, and power efficiency of the light-emitting element 1 using two kinds of materials which are NPB and BAlq as the host materials were high. These results were not expected from the properties of NPB or BAlq which was used alone. The same can be applied to the lifetime, and the luminance half-life period of the light-emitting element 1 is estimated to be about 50,000 hours or more.

As described above, by manufacturing the light-emitting element of the present invention, it was found that both high emission efficiency and long element lifetime can be obtained. Therefore, by implementating the present invention, a light-emitting element with high emission efficiency and long lifetime of the element can be obtained.

《 Manufacture of Light-Emitting Element 3 and Light-Emitting Element 4 》

A light-emitting element 3 of the present invention was manufactured in the same way as the light-emitting element 1, except that Ir(dbq-P)$_2$(acac) of the light-emitting layer 313 was replaced with Ir(dbq-3FP)$_2$(acac) (represented by the structural formula (55) in Embodiment Mode 3). In addition, a light-emitting element 4 which was a comparative light-emitting element was manufactured in the same way as the light-emitting element 2, except that Ir(dbq-P)$_2$(acac) of the light-emitting layer 313 was replaced with Ir(dbq-3FP)$_2$(acac).

《 Operation Characteristics of Light-Emitting Element 3 and Light-Emitting Element 4 》

Sealing was performed in a glove box under a nitrogen atmosphere so that the thus obtained light-emitting element 3 and the light-emitting element 4 were not exposed to the atmosphere, and then the operation characteristics of these light-emitting elements were measured. Note that the measurements were performed at room temperature (in an atmosphere kept at 25° C.).

Figure 12A:
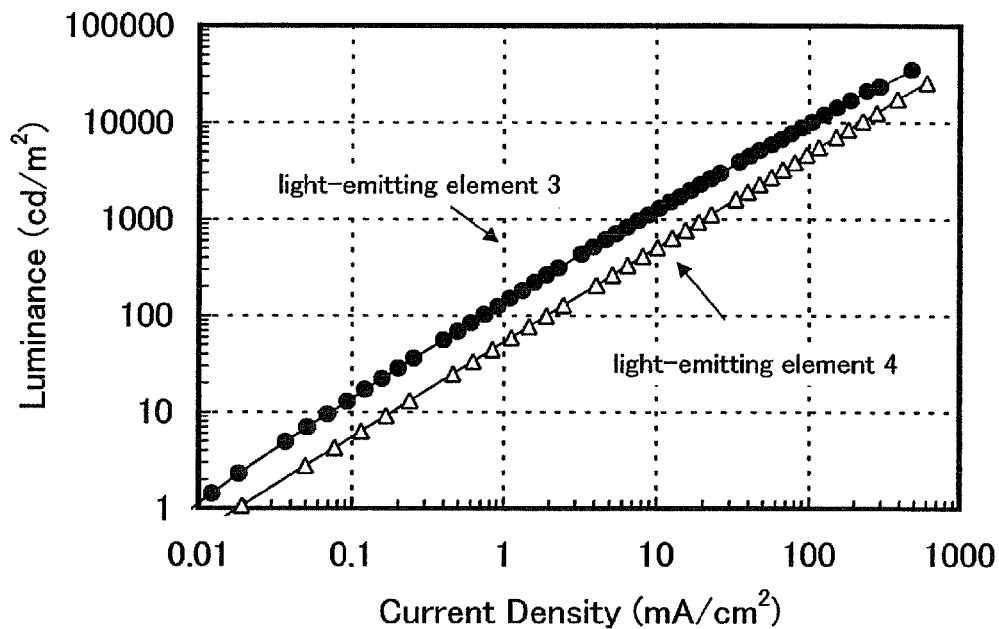
FIGS. 12A and 12B show the characteristics of a light-emitting element 3 and a comparative light-emitting element 4.
Figure 12B:
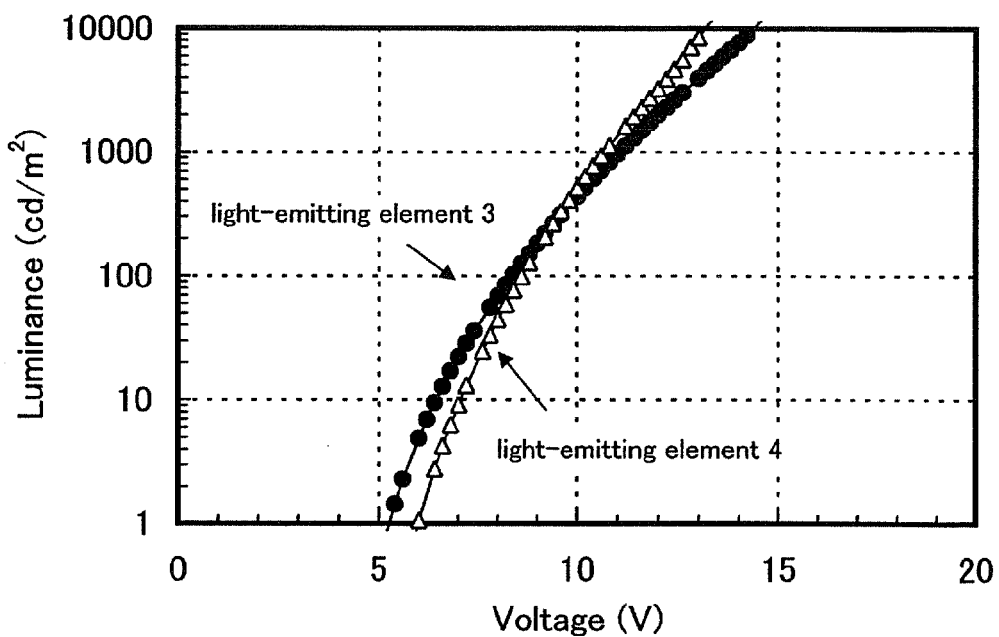
Figure 13:
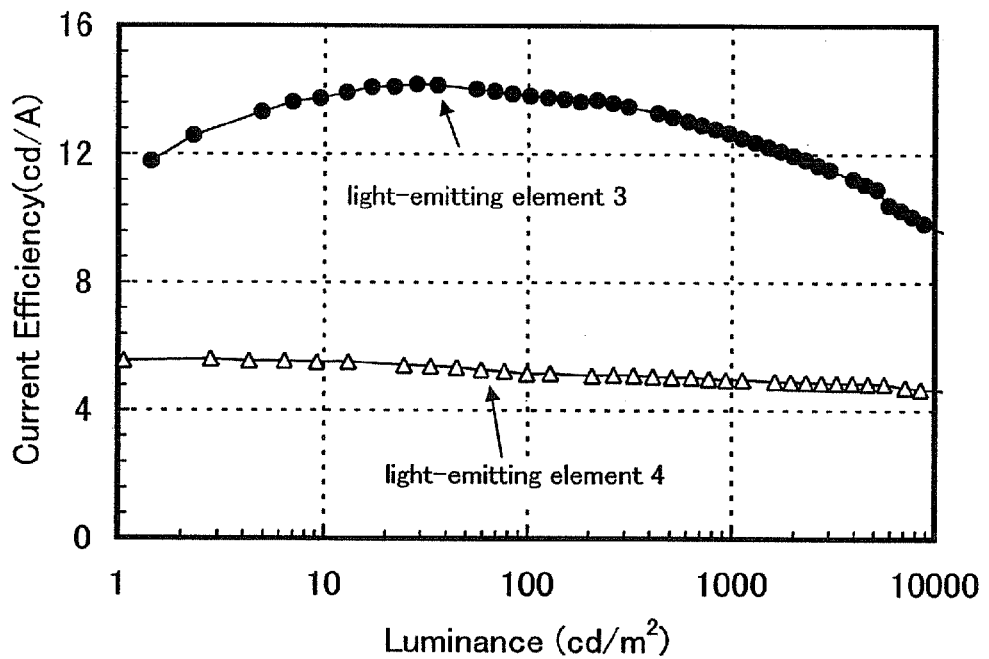
FIG. 13 shows the characteristics of the light-emitting element 3 and the comparative light-emitting element 4.
Figure 14:
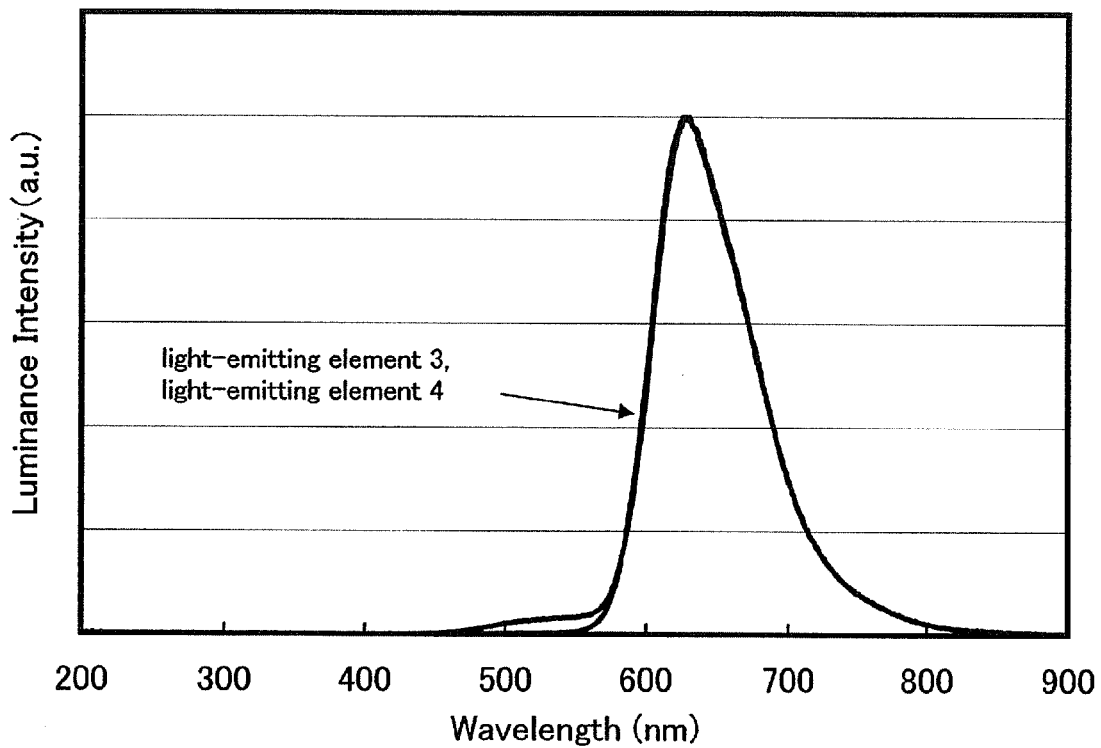
FIG. 14 shows emission spectra of the light-emitting element 3 and the comparative light-emitting element 4.

The current density vs. luminance characteristics of the light-emitting elements are shown in FIG. 12A, and the voltage vs. luminance characteristics thereof are shown in FIG. 12B. In addition, the luminance vs. current efficiency characteristics of the light-emitting elements are shown in FIG. 13. In addition, the emission spectra of the light-emitting elements are shown in FIG. 14. The emission spectra of the light-emitting elements were almost the same, and the color of emission was red derived from Ir(dbq-3FP)$_2$(acac).

As apparent from FIG. 13, the current efficiency of the light-emitting element 4 which is the comparative light-emitting element is extremely low, that is, less than or equal to half that of the light-emitting element 3 of the present invention. The light-emitting element 4 is in the state illustrated in FIG. 2B in Embodiment Mode 1. Since Ir(dbq-3FP)$_2$(acac) having a high electron-trapping property is added into BAlq which is an electron-transporting compound, it is considered that the carrier balance is bad and the current efficiency is decreased. In addition, as apparent from FIG. 12B, emission start voltage is high.

On the other hand, as apparent from FIG. 13, the light-emitting element 3 of the present invention exhibited high emission efficiency.

Figure 15:
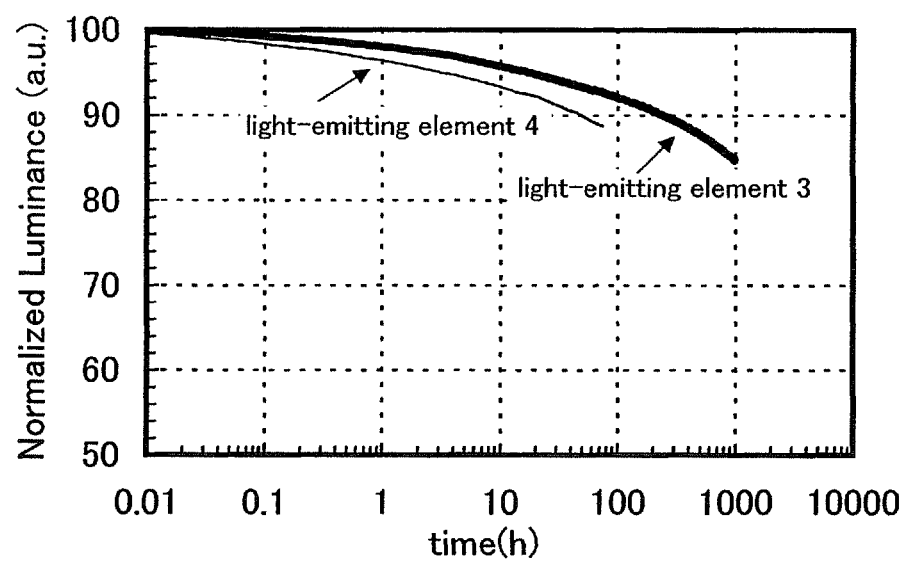
FIG. 15 shows luminance degradation curves of the light-emitting element 3 and the comparative light-emitting element 4.

Next, the initial luminance was set at 1000 cd/m$^2$, and these elements were driven at the constant current density, whereby luminance degradation curves as shown in FIG. 15 were obtained. In FIG. 15, the horizontal axis represents time and the vertical axis represents relative luminance (%) when the initial luminance is 100. As apparent from FIG. 15, the light-emitting element of the present invention also has greatly improved lifetime.

Here, the comparison of characteristics and lifetime at 1000 cd/m$^2$ is shown in Table 3 below. Note that as apparent from FIG. 15, since it can be expected that it takes 10,000 hours or more for the light-emitting element 3 to reach the luminance half-life period, the lifetimes of the elements were compared, in terms of the period until which the luminance was reduced by 10%.

TABLE 3

(Characteristics in Example 2)

| | Voltage [V] | Current Efficiency [cd/A] | External Quantum Efficiency [%] | Power Efficiency [lm/W] | 10% Luminance Reduction Time [hr] |
|---|---|---|---|---|---|
| Light-Emitting Element 3 | 11 | 13 | 13 | 3.6 | 241 |
| Light-Emitting Element 4 | 10 | 5.0 | 5.0 | 1.5 | 48.2 |

First, the current efficiency, external quantum efficiency, and power efficiency of the light-emitting element 3 using two kinds of materials which are NPB and BAlq as host materials were high, whereas the current efficiency, external quantum efficiency, and power efficiency of the light-emitting element 4 using only BAlq as a host material were extremely low. These results were not expected from the properties of NPB or BAlq which was used alone. The same can be applied to the lifetime, and the luminance half-life period of the light-emitting element 3 is estimated to be about 20,000 hours.

As described above, by manufacturing the light-emitting element of the present invention, it was found that both high emission efficiency and long element lifetime can be obtained. Therefore, by implementating the present invention, a light-emitting element with high emission efficiency and long lifetime of the element can be obtained.

Here, synthesis methods of Ir(dbq-P)₂(acac) and Ir(dbq-3FP)₂(acac) which are dibenzo[f,h]quinoxaline-based organometallic complexes used for the above light-emitting elements are described.

《Synthesis Method of (Acetylacetonato)bis(2-phenyldibenzo[f,h]quinoxalinato)iridium(III) (abbreviation: Ir(dbq-P)₂(acac))》

[Step 1: Synthesis of 2-Phenyldibenzo[f,h]quinoxaline (abbreviation: Hdbq-P)]

First, 2.16 g of phenylglyoxal and 3.36 g of 9,10-diaminophenanthrene were dissolved in a solvent of 100 mL of dehydrated ethanol under a nitrogen atmosphere. The solution was refluxed for 7 hours to be reacted. The white power precipitated through the reaction was filtered. The residue was washed with ethanol and then ether to give a dibenzo[f,h]quinoxaline derivative, Hdbq-P, which was the target substance (yield: 92%). Synthesis scheme of Step 1 is shown in (a-1) below.

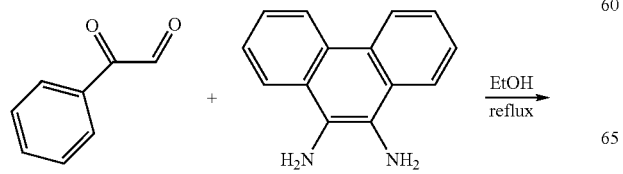

(a-1)

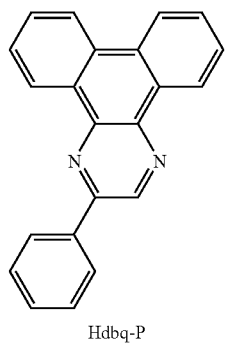

Hdbq-P

[Step 2: Synthesis of Di-μ-chloro-bis[bis(2-phenyldibenzo[f,h]quinoxalinato)iridium(III)] (abbreviation: [Ir(dbq-P)₂Cl]₂)]

Following the above Step 1, 24 mL of 2-ethoxyethanol, in a recovery flask with a reflux pipe were put 8 mL of water, 0.61 g of the dibenzo[f,h]quinoxaline derivative, Hdbq-P, which was obtained in the above Step 1, and 0.30 g of iridium chloride hydrate (IrCl₃·H₂O) (produced by Sigma-Aldrich Corp.). The atmosphere in the flask was substituted with argon. Then, the mixture was irradiated with a microwave (2.45 GHz, 200 W) for 5 hours to be reacted. The orange powder precipitated from the reaction solution was filtered, and the residue was washed with ethanol to give a dinuclear complex [Ir(dbq-P)₂Cl]₂ (yield: 78%). Note that a microwave synthesis system (Discovery, manufactured by CEM Corporation) was used for the microwave irradiation. Further, synthesis scheme of Step 2 is shown in (b-1) below.

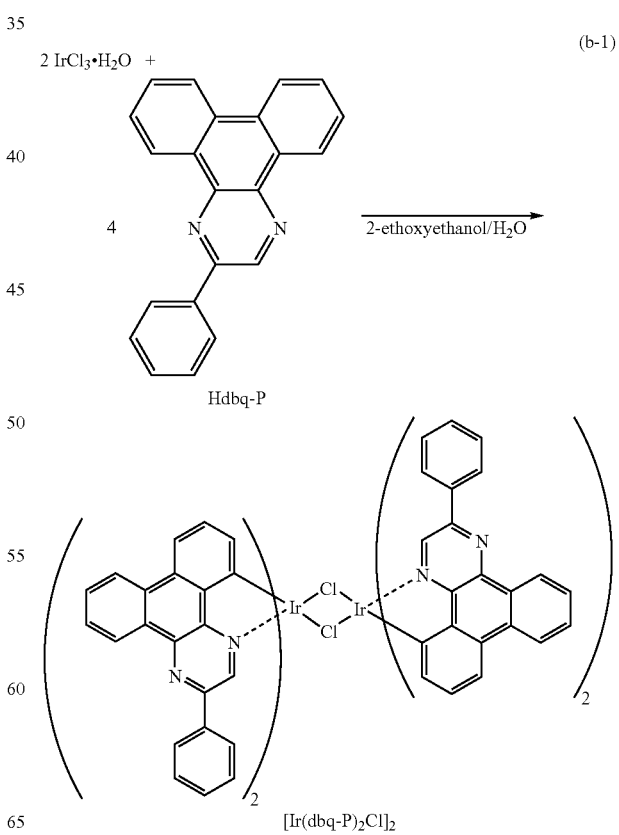

[Step 3: Synthesis of (Acetylacetonato)bis(2-phenyldibenzo[f,h]quinoxalinato)iridium(III) (abbreviation: Ir(dbq-P)$_2$(acac))]

Following the above Step 2, in a recovery flask equipped with a reflux pipe were put 25 mL of 2-ethoxyethanol, 0.54 g of the dinuclear complex, [Ir(dbq-P)$_2$Cl]$_2$, which was obtained in the above Step 2, 0.10 mL of acetylacetone, and 0.34 g of sodium carbonate. The atmosphere in the flask was substituted with argon. Then, the mixture was irradiated with a microwave (2.45 GHz, 200 W) for 30 minutes to be reacted. The reaction solution was filtered, and the obtained filtrate was concentrated and dried to give a residue. This residue was recrystallized with dichloromethane to give the organometallic complex of the present invention, Ir(dbq-P)$_2$(acac), as a red powder (yield: 16%). Synthesis scheme of Step 3 is shown in (c-1) below.

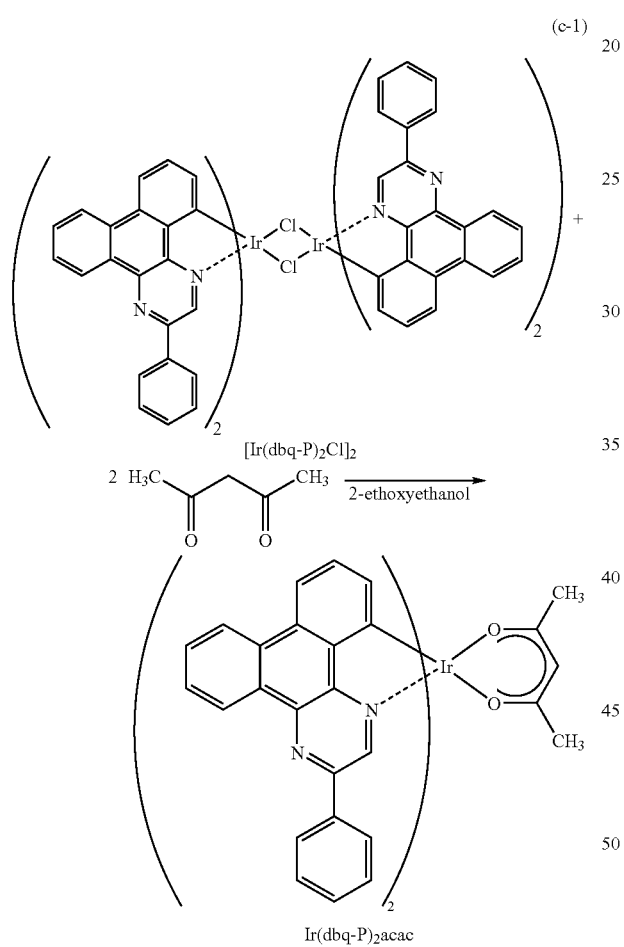

Ir(dbq-P)$_2$acac

As described above, Ir(dbq-P)$_2$(acac) can be synthesized.

《 Synthesis Method of (Acetylacetonato)bis[2-(3-fluorophenyl)-dibenzo[f,h]quinoxalinato]iridium(III) (abbreviation: Ir(dbq-3FP)$_2$(acac))》

[Step 1: Synthesis of 2-(3-Fluorophenyl)-dibenzo[f,h]quinoxaline (abbreviation: Hdbq-3FP)]

First, under a nitrogen atmosphere, 27.5 mL (1.58 mol/L) of a hexane solution of n-butyllithium was dripped into a mixed solution of 6.87 g of 3-bromofluorobenzene and 40 mL of tetrahydrofuran at −78° C. Then, with the temperature maintained at −78° C., the mixture was stirred for 2 hours. To the obtained solution was added 7.54 g of dibenzo[f,h]quinoxaline in five additions at −78° C. The mixture was heated to room temperature, and stirred for 12 hours with the temperature maintained at room temperature. Water was added to this mixture and dichloromethane was used as an extraction solvent, so that an organic layer was extracted. The obtained organic layer was dried with anhydrous magnesium sulfate. The solution obtained by the drying was filtrated. The solvent of this solution was distilled off, and then, by recrystallization with ethanol, the organometallic complex of the present invention, Hdbq-3FP, which was the target substance, was obtained (a light-orange powder, yield: 23%). Synthesis scheme of Step 1 is shown in (a-2) below.

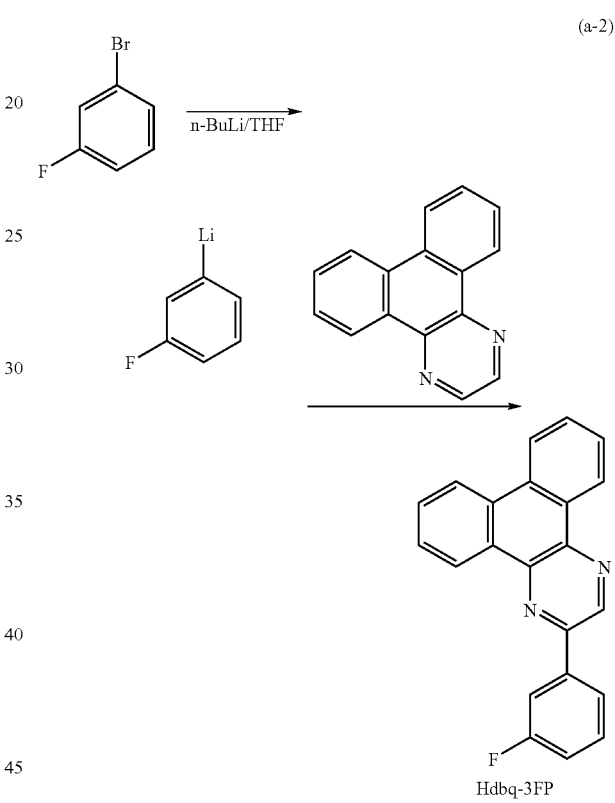

Hdbq-3FP

[Step 2: Synthesis of Di-μ-chloro-bis[bis{2-(3-fluorophenyl)-dibenzo[f,h]quinoxalinato}iridium(III) (abbreviation: [Ir(dbq-3FP)$_2$Cl]$_2$]

Following the above Step 1, in a recovery flask equipped with a reflux pipe were put 15 mL of 2-ethoxyethanol, 5 mL of water, 2.41 g of the dibenzo[f,h]quinoxaline derivative, Hdbq-3FP, which was obtained in the above Step 1, and 1.01 g of iridium chloride hydrate (IrCl$_3$.H$_2$O) (produced by Sigma-Aldrich Corp.). The atmosphere in the flask was substituted with argon. Then, the mixture was irradiated with a microwave (2.45 GHz, 100 W to 250 W) for 6 hours to be reacted. An orange powder precipitated from the reaction solution was filtered, and the residue was washed with ethanol to give a dinuclear complex [Ir(dbq-3FP)$_2$Cl]$_2$ (yield: 70%). Note that a microwave synthesis system (Discovery, manufactured by CEM Corporation) was used for the microwave irradiation. Synthesis scheme of Step 2 is shown in (b-2) below.

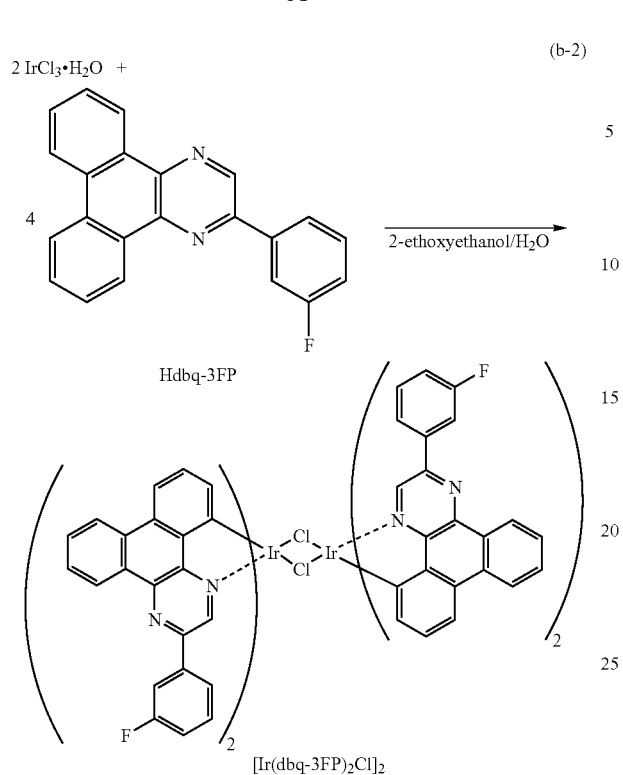

[Step 3: Synthesis of (Acetylacetonato)bis[2-(3-fluorophenyl)-dibenzo[f,h]quinoxalinato]iridium(III) (abbreviation: Ir(dbq-3FP)$_2$(acac)]

Following the above Step 2, in a recovery flask equipped with a reflux pipe were put 20 mL of 2-ethoxyethanol, 2.06 g of the dinuclear complex, [Ir(dbq-3FP)$_2$Cl]$_2$, which was obtained in the above Step 2, and 0.43 g of sodium acetylacetonato hydrate (Na(CH$_3$COCHCOCH$_3$).XH$_2$O). The atmosphere in the flask was substituted with argon. Then, the mixture was irradiated with a microwave (2.45 GHz, 100 W) for 30 minutes to be reacted. The reaction solution was filtered, and the obtained filtrate was concentrated and dried to give a residue. This residue was dissolved in dichloromethane, and the mixture was filtered through Celite. Then, by recrystallization with dichloromethane, a dibenzo[f,h]quinoxaline-based organometallic complex, [Ir(dbq-3FP)$_2$(acac)], can be obtained as a red powder (yield: 27%). Synthesis scheme of Step 3 is shown in (c-2) below.

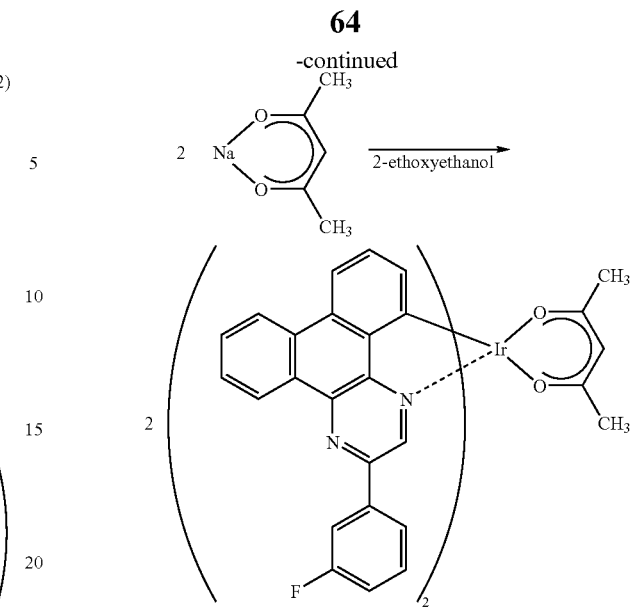

As described above, Ir(dbq-3FP)$_2$(acac) can be synthesized.

This application is based on Japanese Patent Application serial No. 2007-310376 filed with Japan Patent Office on Nov. 30, 2007, the entire contents of which are hereby incorporated by reference.

Reference Numerals

100: light-emitting layer, 101: hole-transporting layer, 102: electron-transporting layer, 111: HOMO level of first organic compound, 112: LUMO level of first organic compound, 121: HOMO level of second organic compound, 122: LUMO level of second organic compound, 131: HOMO level of dibenzo[f,h]quinoxaline-based organometallic complex, 132: LUMO level of dibenzo[f,h]quinoxaline-based organometallic complex, 200: light-emitting layer, 201: hole-transporting layer, 202: electron-transporting layer, 211: HOMO level of first organic compound, 212: LUMO level of first organic compound, 221: HOMO level of second organic compound, 222: LUMO level of second organic compound, 231: HOMO level of dibenzo[f,h]quinoxaline-based organometallic complex, 232: LUMO level of dibenzo[f,h]quinoxaline-based organometallic complex, 301: first electrode, 302: second electrode, 311: hole-injecting layer, 312: hole-transporting layer, 313: light-emitting layer, 314: electron-transporting layer, 315: electron-injecting layer, 321: first organic compound, 322: second organic compound, 323: dibenzo[f,h]quinoxaline-based organometallic complex, 401: chassis, 402: liquid crystal layer, 403: backlight, 404: chassis, 405: driver IC, 406: terminal, 411: chassis, 412: light source, 511: main body, 512: chassis, 513: display portion, 514: keyboard, 521: display portion, 522: main body, 523: antenna, 524: audio output portion, 525: audio input portion, 526: operation switch, 531: display portion, 532: chassis, 533: speaker, 601: driver circuit portion (source-side driver circuit), 602: pixel portion, 603: driver circuit portion (gate-side driver circuit), 604: sealing substrate, 605: sealant, 607: space, 608: wiring, 609: FPC (flexible print circuit), 610: element substrate, 611: switching TFT, 612: current controlling TFT, 613: first electrode, 614: insulator, 616: layer including light-emitting layer, 617: second electrode, 618: light-emitting element, 623: n-channel TFT, 624: p-channel TFT, 951: substrate, 952:

electrode 953: insulating layer, 954: partition layer, 955: layer including light-emitting layer, 956: electrode.

The invention claimed is:

1. A light-emitting element comprising a light-emitting layer between a first electrode and a second electrode,
    wherein the light-emitting layer comprises a first organic compound having a hole-transporting property, a second organic compound having an electron-transporting property, and an organometallic complex,
    wherein the organometallic complex comprises a first ligand having a dibenzo[f,h]quinoxaline skeleton,
    wherein the organometallic complex comprises a second ligand which is a monoanionic ligand having any one of a β-diketone structure, a carboxyl group, and a phenolic hydroxyl group, and
    wherein a central metal of the organometallic complex is a Group 9 or Group 10 element.

2. The light-emitting element according to claim 1, wherein the first ligand of the organometallic complex is a 2-aryldibenzo[f,h]quinoxaline derivative.

3. The light-emitting element according to claim 1, wherein the first ligand of the organometallic complex is a 2-phenyldibenzo[f,h]quinoxaline derivative.

4. The light-emitting element according to claim 1, wherein the central metal is iridium or platinum.

5. The light-emitting element according to claim 1, wherein the first organic compound is an aromatic amine compound or a carbazole derivative.

6. The light-emitting element according to claim 1, wherein the second organic compound is a heteroaromatic compound or a metal complex.

7. The light-emitting element according to claim 1, wherein the amount of the organometallic complex in the light-emitting layer is greater than or equal to 1 weight % and less than or equal to 10 weight %.

8. The light-emitting element according to claim 1, wherein a weight ratio of the second organic compound to the first organic compound is greater than or equal to 1/20 and less than or equal to 20/1.

9. The light-emitting element according to claim 1, wherein a weight ratio of the second organic compound to the first organic compound is greater than or equal to 1 and less than or equal to 20/1.

10. The light-emitting element according to claim 1, wherein a LUMO level of the organometallic complex is deeper than a LUMO level of the first organic compound and a LUMO level of the second organic compound by 0.2 eV or more.

11. A light-emitting element comprising a light-emitting layer between a first electrode and a second electrode,
    wherein the light-emitting layer comprises a first organic compound having a hole-transporting property, a second organic compound having an electron-transporting property, and an organometallic complex,
    wherein the organometallic complex is represented by the following general formula (G5):

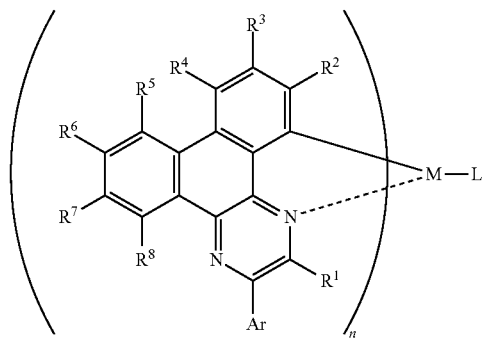

wherein:
    Ar represents an aryl group having 6 to 25 carbon atoms;
    $R^1$ represents any of hydrogen, an alkyl group having 1 to 4 carbon atoms, or an alkoxy group having 1 to 4 carbon atoms;
    $R^2$ to $R^8$ individually represent any of hydrogen, the alkyl group having 1 to 4 carbon atoms, the alkoxy group having 1 to 4 carbon atoms, an acyloxy group having 1 to 4 carbon atoms, or a halogen element;
    any of pairs of $R^2$ and $R^3$, $R^3$ and $R^4$, $R^5$ and $R^6$, $R^6$ and $R^7$, or $R^7$ and $R^8$ may be bonded to each other to form a ring;
    M is a central metal and represents a Group 9 or Group 10 element;
    L represents a monoanionic ligand having any one of a β-diketone structure, a carboxyl group, and a phenolic hydroxyl group; and
    n is 2 when the central metal is a Group 9 element, and n is 1 when the central metal is a Group 10 element.

12. The light-emitting element according to claim 11, wherein $R^1$, $R^2$, $R^4$, $R^5$, $R^7$ and $R^5$ represent hydrogen.

13. The light-emitting element according to claim 11, wherein $R^1$ to $R^8$ represent hydrogen.

14. The light-emitting element according to claim 11,
    wherein $R^1$ to $R^5$ represent hydrogen,
    wherein Ar represents a phenyl group, having a substituent, and
    wherein the substituent is selected from hydrogen, the alkyl group having 1 to 4 carbon atoms, the alkoxy group having 1 to 4 carbon atoms, an aryl group having 6 to 12 carbon atoms, and a halogen element.

15. The light-emitting element according to claim 11, wherein M is iridium or platinum.

16. The light-emitting element according to claim 11, wherein the first organic compound is an aromatic amine compound or a carbazole derivative.

17. The light-emitting element according to claim 11, wherein the second organic compound is a heteroaromatic compound or a metal complex.

18. The light-emitting element according to claim 11, wherein the amount of the organometallic complex in the light-emitting layer is greater than or equal to 1 weight % and less than or equal to 10 weight %.

19. The light-emitting element according to claim 11, wherein a weight ratio of the second organic compound to the first organic compound is greater than or equal to 1/20 and less than or equal to 20/1.

20. The light-emitting element according to claim 11, wherein a weight ratio of the second organic compound to the first organic compound is greater than or equal to 1 and less than or equal to 20/1.

21. The light-emitting element according to claim 11, wherein a LUMO level of the organometallic complex is deeper than a LUMO level of the first organic compound and a LUMO level of the second organic compound by 0.2 eV or more.

22. The light-emitting element according to claim 1, wherein the second ligand is a ligand represented by any one of the following structural formulae (L1) to (L6) and (L9):

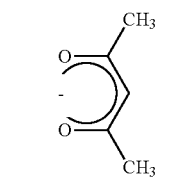

(L1)

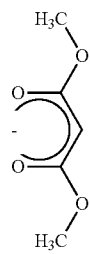

(L2)

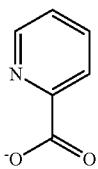

(L3)

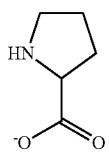

(L4)

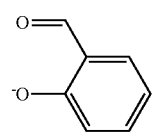

(L5)

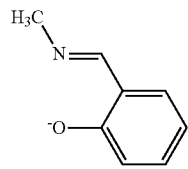

(L6)

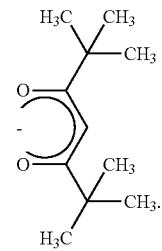

(L9)

23. The light-emitting element according to claim 11, wherein the monoanionic ligand is a ligand represented by any one of the following structural formulae (L1) to (L6) and (L9):

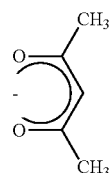

(L1)

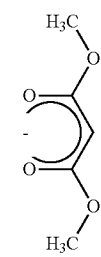

(L2)

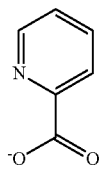

(L3)

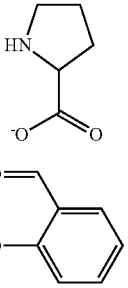

(L4)

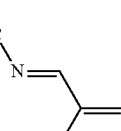

(L5)

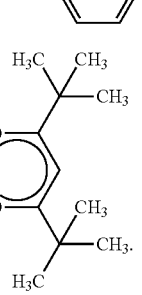

(L6)

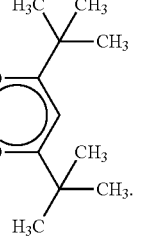

(L9)

24. A light-emitting element comprising a light-emitting layer between a first electrode and a second electrode,
wherein the light-emitting layer comprises a first organic compound having a hole-transporting property, a second organic compound having an electron-transporting property, and an organometallic complex, wherein the organometallic complex is represented by the following general formula (G5):

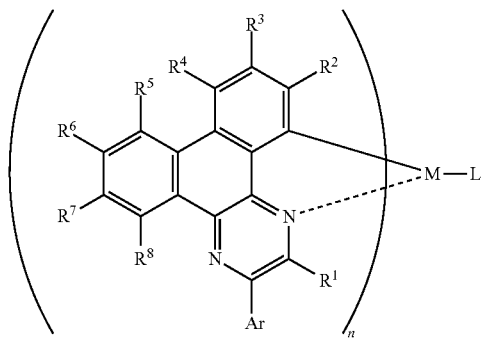

(G5)

wherein:

Ar represents an aryl group having 6 to 25 carbon atoms;

$R^1$ represents any of hydrogen, an alkyl group having 1 to 4 carbon atoms, or an alkoxy group having 1 to 4 carbon atoms;

$R^2$ to $R^8$ individually represent any of hydrogen, the alkyl group having 1 to 4 carbon atoms, the alkoxy group having 1 to 4 carbon atoms, an acyloxy group having 1 to 4 carbon atoms, or a halogen element;

any of pairs of $R^2$ and $R^3$, $R^3$ and $R^4$, $R^5$ and $R^6$, $R^6$ and $R^7$, or $R^7$ and $R^8$ may be bonded to each other to form a ring;

M is a central metal and represents a Group 9 or Group 10 element;

L represents a monoanionic ligand having a structure represented by any one of the following structural formulae (L7) and (L8):

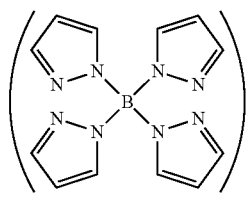

(L7)

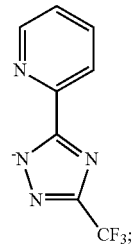

(L8)

and n is 2 when the central metal is a Group 9 element, and n is 1 when the central metal is a Group 10 element.

25. The light-emitting element according to claim 24, wherein $R^1$, $R^2$, $R^4$, $R^5$, $R^7$ and $R^8$ represent hydrogen.

26. The light-emitting element according to claim 24, wherein $R^1$ to $R^8$ represent hydrogen.

27. The light-emitting element according to claim 24, wherein $R^1$ to $R^8$ represent hydrogen,
wherein Ar represents a phenyl group, having a substituent, and
wherein the substituent is selected from hydrogen, the alkyl group having 1 to 4 carbon atoms, the alkoxy group having 1 to 4 carbon atoms, an aryl group having 6 to 12 carbon atoms, and a halogen element.

28. The light-emitting element according to claim 24, wherein M is iridium or platinum.

29. The light-emitting element according to claim 24, wherein the first organic compound is an aromatic amine compound or a carbazole derivative.

30. The light-emitting element according to claim 24, wherein the second organic compound is a heteroaromatic compound or a metal complex.

31. The light-emitting element according to claim 24, wherein the amount of the organometallic complex in the light-emitting layer is greater than or equal to 1 weight % and less than or equal to 10 weight %.

32. The light-emitting element according to claim 24, wherein a weight ratio of the second organic compound to the first organic compound is greater than or equal to 1/20 and less than or equal to 20/1.

33. The light-emitting element according to claim 24, wherein a weight ratio of the second organic compound to the first organic compound is greater than or equal to 1 and less than or equal to 20/1.

34. The light-emitting element according to claim 24, wherein a LUMO level of the organometallic complex is deeper than a LUMO level of the first organic compound and a LUMO level of the second organic compound by 0.2 eV or more.

* * * * *

UNITED STATES PATENT AND TRADEMARK OFFICE
CERTIFICATE OF CORRECTION

PATENT NO. : 8,455,111 B2
APPLICATION NO. : 12/323492
DATED : June 4, 2013
INVENTOR(S) : Nobuharu Ohsawa et al.

It is certified that error appears in the above-identified patent and that said Letters Patent is hereby corrected as shown below:

In the Claims

In claim 12 at column 66, line 37, "$R^7$ and $R^5$" should be --$R^7$ and $R^8$--;

In claim 14 at column 66, line 41, "$R^1$ to $R^5$" should be --$R^1$ to $R^8$--.

Signed and Sealed this
Twenty-fourth Day of September, 2013

Teresa Stanek Rea
*Deputy Director of the United States Patent and Trademark Office*